(12) United States Patent
Nakabayashi et al.

(10) Patent No.: US 6,515,843 B2
(45) Date of Patent: *Feb. 4, 2003

(54) SEMICONDUCTOR CAPACITIVE DEVICE

(75) Inventors: Masaaki Nakabayashi, Kawasaki (JP);
Tetsuro Tamura, Kawasaki (JP);
Hideyuki Noshiro, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,141

(22) Filed: Oct. 2, 1998

(65) Prior Publication Data
US 2002/0071239 A1 Jun. 13, 2002

Related U.S. Application Data

(62) Division of application No. 08/621,597, filed on Mar. 26, 1996, now Pat. No. 5,874,364.

(30) Foreign Application Priority Data

| Mar. 27, 1995 | (JP) | ................................. 7-67816 |
| Sep. 19, 1995 | (JP) | ................................. 7-239879 |
| Sep. 25, 1995 | (JP) | ................................. 7-245836 |
| Mar. 5, 1996 | (JP) | ................................. 8-47661 |
| Mar. 15, 1996 | (JP) | ................................. 8-59497 |

(51) Int. Cl.$^7$ ........................ H01G 4/008; H01L 27/108
(52) U.S. Cl. ........................ 361/305; 257/306
(58) Field of Search .................... 257/306, 307, 257/308, 310; 438/738; 361/305, 303, 321.4

(56) References Cited

U.S. PATENT DOCUMENTS

| 4,894,693 A | * | 1/1990 | Tigelaar | ................. 257/311 |
| 5,003,428 A | * | 3/1991 | Shepherd | ................. 361/322 |

(List continued on next page.)

FOREIGN PATENT DOCUMENTS

| JP | 01094645 A | 4/1989 |
| JP | 05067792 A | 3/1993 |
| JP | HEI 06-29789 A | 10/1994 |
| JP | 06283606 B1 | 10/1994 |
| JP | 99-049081 | 2/1997 |
| JP | 9-246214 | 9/1997 |

*Primary Examiner*—Dean A. Reichard
*Assistant Examiner*—Eric Thomas
(74) *Attorney, Agent, or Firm*—Armstrong, Westerman & Hattori, LLP

(57) ABSTRACT

The present invention relates to semiconductor techniques using high dielectric oxides, more specifically to a thin film forming method for forming a thin film which is suitable as the electrodes of the oxide high dielectrics, a capacitor device using the oxide high dielectrics and a method for fabricating the same, an a semiconductor device using the capacitor device and a method for fabricating the semiconductor device. The capacitor device includes at least one of a pair of electrodes which is formed of a material containing titanium nitride of (200) orientation. This permits the capacitor device to have good quality even in a case that the capacitor dielectric film is formed of a high dielectric thin film grown in an oxidizing atmosphere. The capacitor device includes the electrodes of titanium nitride film, whereby the electrodes can be patterned by RIE, which much improves processing precision of the electrode patterning, and throughputs.

9 Claims, 45 Drawing Sheets

U.S. PATENT DOCUMENTS

| | | | |
|---|---|---|---|
| 5,005,102 A | * 4/1991 | Larson | 361/313 |
| 5,053,917 A | * 10/1991 | Miyasaka et al. | 361/321.5 |
| 5,202,275 A | * 4/1993 | Sugiura et al. | 438/210 |
| 5,403,620 A | 4/1995 | Kaesz et al. | 427/252 |
| 5,407,855 A | 4/1995 | Maniar et al. | 438/608 |
| 5,504,041 A | * 4/1996 | Summerfelt | 438/396 |
| 5,519,237 A | * 5/1996 | Itoh et al. | 257/306 |
| 5,554,564 A | * 9/1996 | Nishioka et al. | 438/396 |
| 5,572,052 A | 11/1996 | Kashihara et al. | 257/195 |
| 5,573,979 A | * 11/1996 | Tsu et al. | 438/396 |
| 5,717,236 A | * 2/1998 | Shinkawata | 257/306 |
| 5,739,563 A | * 4/1998 | Kawakubo et al. | 257/295 |
| 5,751,019 A | * 5/1998 | Fair | 257/68 |
| 5,798,903 A | * 8/1998 | Dhote et al. | 361/321.4 |
| 5,859,451 A | * 1/1999 | Narita | 257/308 |
| 5,874,364 A | * 2/1999 | Nakabayashi et al. | 438/738 |
| 6,278,146 B1 | * 8/2001 | Nakamura | 257/295 |

* cited by examiner

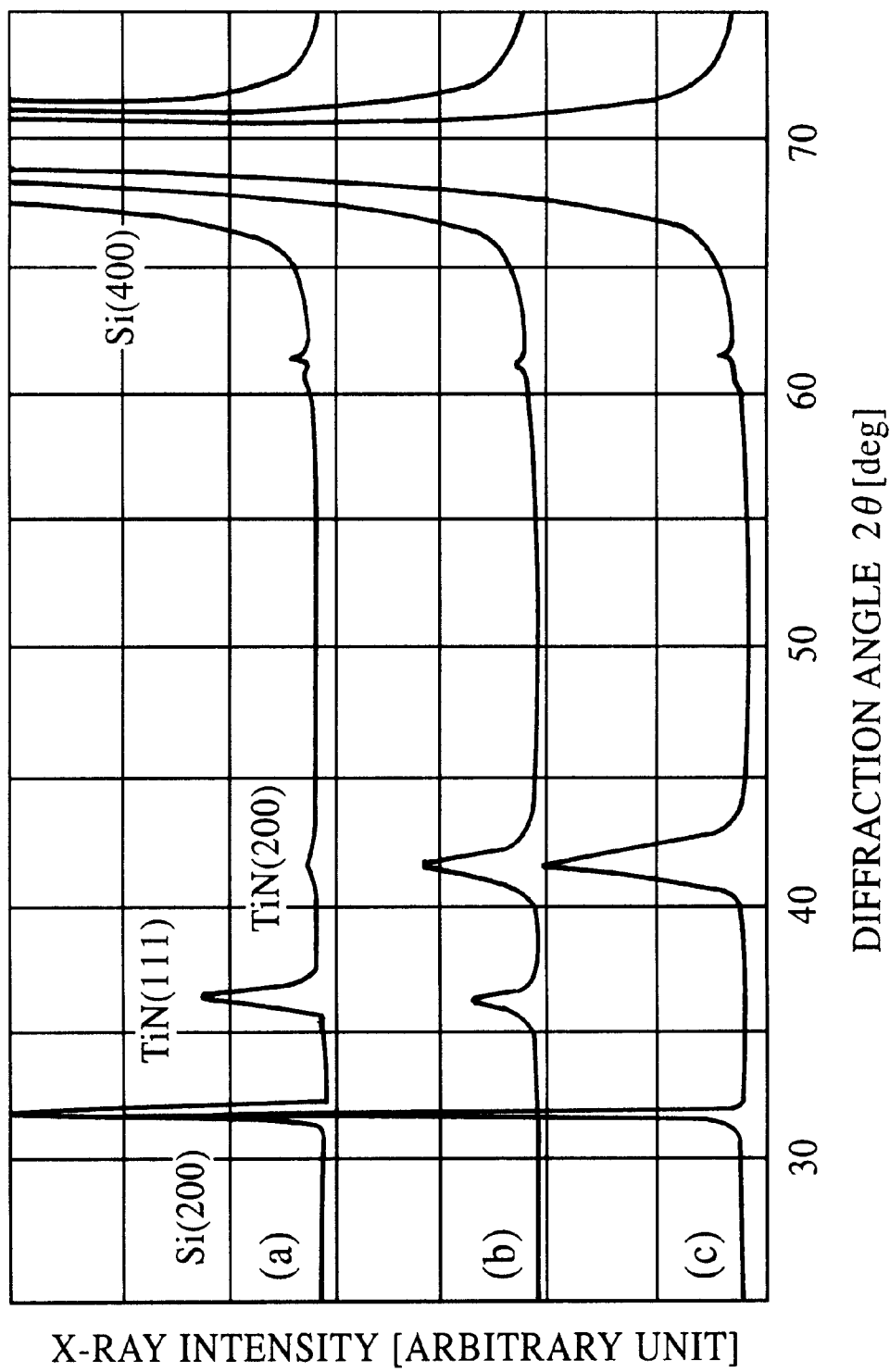

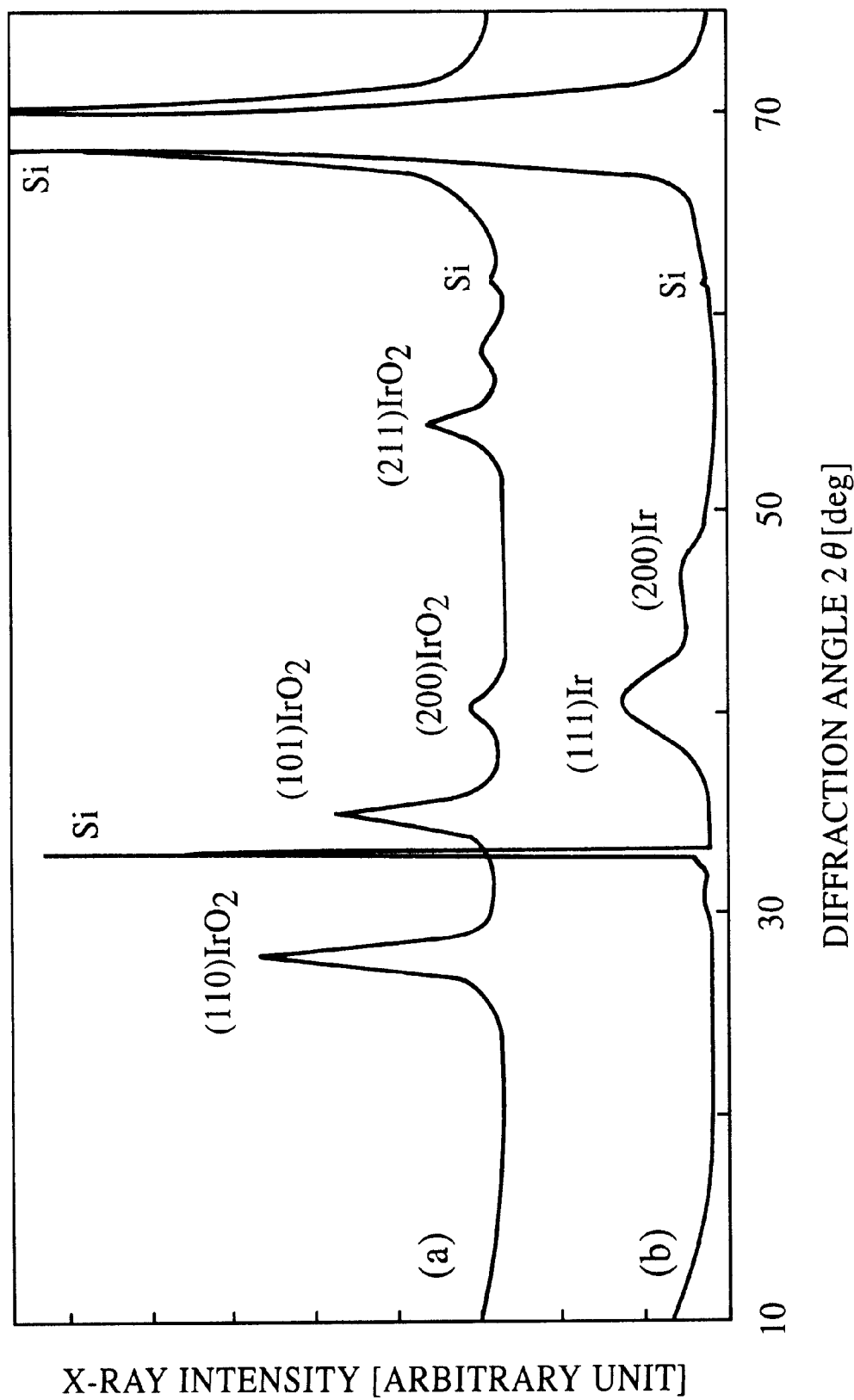

US 6,515,843 B2

SEMICONDUCTOR CAPACITIVE DEVICE

This application is a division of prior application Ser. No. 08/621,597, filed Mar. 26, 1996, now U.S. Pat. No. 5,874,364.

BACKGROUND OF THE INVENTION

Materials of high dielectric constants, such as $SrTiO_3$, $Pb(Zr,Ti)O_3$, etc. are expected to be used in the electronic field of semiconductor memories, etc.

For example, a usual DRAM comprises cells each including one transistor and one capacitor. For high integration, it is effective to reduce an area of the capacitors. To reduce the area of the capacitors, it is effective to use a film having a dielectric constant higher than the dielectric constants of silicon oxide film, ONO film (of the three-layer structure of silicon oxide film/silicon nitride film/silicon oxide film), or etc. This enables the device to be further micronized and more integrated The deposition of $SrTiO_3$ film, $(Ba,Sr)TiO_3$, and $Pb(Zr,Ti)O_3$ films is usually conducted in an oxidizing atmosphere. Accordingly, the base electrode must be formed of a material which is hard to be oxidized or a material which can maintain conductivity even when oxidized. The conventional electrode is made of platinum (Pt), which is hard to be oxidized.

An upper electrode to be formed on the $SrTiO_3$ film or $Pb(Zr,Ti)O_3$ film must be formed also of an oxidation resistant material. Unless an oxidation resistant material is used, oxygen atoms contained in the $SrTiO_3$ film or $Pb(Zr,Ti)O_3$ film are absorbed by the upper electrode to adversely increase leak current flowing in the dielectric film.

In forming such capacitors on a silicon substrate, a diffusion preventive film of Ti film, TiN film or others is provided between the silicon substrate and the Pt film as the lower electrode.

This is because in depositing the Pt film directly on the silicon substrate, silicon atoms in the silicon substrate are diffused in the Pt film and arrive at the surface of the Pt film in depositing the dielectric film, and a silicon oxide film is adversely formed on the interface between the dielectric film and the Pt film, and the formed capacitors have a decreased capacitance.

Thus, the capacitor devices formed of a high dielectric thin film are formed, reducing diffusion of silicon atoms from the silicon substrate.

Platinum film used as an electrode of a high dielectric constant material, such as $SrTiO_3$, $(Ba,Sr)TiO_3$, or others, is deposited mainly by sputtering.

FIG. 45 shows one example of sputtering apparatuses. In a deposition chamber 384 a target 386 of platinum and a substrate 388 for a platinum film to be deposited on are opposed to each other. A direct current source 390 is connected to the target 386 and the substrate 388, and a high negative voltage can be applied to the target 386 as the cathode. An Ar (argon) gas feed pipe 392 is connected to the deposition chamber 384, and Ar gas as a sputtering gas can be fed into the deposition chamber 384. A substrate holder 394 includes a heater 396 which heats the substrate 388 as required for the deposition.

Next, the method for depositing a platinum film by sputtering will be explained.

First, the pressure of the interior of the deposition chamber 384 is decreased by evacuation by a vacuum pump (not shown) through an exhaust port 398, and then Ar gas is fed into the deposition chamber 384 through the Ar gas feed pipe 392 to establish a pressure in the deposition chamber 384. For example, an Ar gas flow rate is set at 100 sccm to establish a pressure of $1-5\times10^{-3}$ Torr.

Then a direct voltage is applied between the substrate 388 and the target 386 to generate Ar plasma. Dissociated Ar ions collide on the target 386 as the cathode and sputter platinum atoms. The sputtered platinum atoms arrive at the substrate 388 and deposit a platinum film on the substrate 388.

Thus a platinum film is deposited by sputtering.

As an electrode for high dielectric constant materials, such as $SrTiO_3$, $(Ba,Sr)TiO_3$, etc., iridium film or iridium oxide film other than platinum film are used.

Also in the conventional fabrication process for semiconductor devices, in which iridium film is deposited, sputtering is mainly used for the deposition of platinum film.

Recently Japanese Patent Laid-Open Publication No. 290789/1994 proposes a method for depositing iridium film by CVD using an organic compound of iridium.

Iridium film or iridium oxide film deposited by sputtering or CVD must be patterned in accordance with their applications, but because iridium film or iridium oxide film do not generate reactive products of high vapor pressures, it is difficult to use iridium film or iridium oxide film in a patterning method, such as RIE (Reactive Ion Etching), which uses reactions.

To pattern iridium film or iridium oxide film, the so-called ion milling, by which a target is processed physically by collision of ions, is used.

Furthermore, as an electrode of high dielectric constant material, such as $SrTiO_3$, $(Ba,Sr)TiO_3$, etc., ruthenium film or ruthenium oxide film are used in some cases.

In the conventional fabrication processes for semiconductor devices, sputtering or CVD is mainly used in depositing ruthenium film or ruthenium oxide film, Especially CVD is recently noted because ruthenium film or ruthenium oxide film can be deposited in a uniform thickness on the tops and sides of the steps of stepped patterns.

For the deposition of ruthenium film or ruthenium oxide film by CVD, 2,3,6,6-Tetramethyl 3,5-heptanediene Ruthenium, hereinafter abbreviated as $Ru(DPM)_3$, is used as a ruthenium source material.

$Ru(DPM)_3$ is a pulverized solid at room temperature, and to be used for CVD, it must be vaporized. $Ru(DPM)_3$ is vaporized in the following procedure.

First, powder $Ru(DFM)_3$ is loaded in a vessel for low vapor pressure and is place in a thermostatic oven. Then, the interior of the thermostatic oven is heated up to the sublimation temperature of $Ru(DPM)_3$ to sublimate the $Ru(DPM)_3$. Subsequently the sublimated $Ru(DPM)_3$ is bubbled by an inactive gas to be fed into the deposition chamber together with the inactive gas.

The gas thus fed into the deposition chamber is decomposed and reacted on a substrate which has been heated to about 300° C. and retained at 300° C., and ruthenium film is deposited on the substrate.

Ruthenium oxide film is deposited on the substrate to feed the sublimated $Ru(DPM)_3$ together with oxygen gas.

However, in the above-described conventional fabrication methods for capacitor devices, diffusion of silicon atoms can be prevented by a diffusion preventive film, but in depositing the dielectric film, oxygen atoms are diffused in the Pt film to arrive at the diffusion preventive film, oxidizing the diffusion preventive film.

Such oxidation of the diffusion preventive film disenables contact between the Pt film and the silicon substrate, and devices directly below the capacitors cannot contact with them each other, with a result that high integration is impossible, In a case that Pt film is used as the electrode, the Pt film cannot be patterned by RIE, and must be patterned by ion milling. Ion milling, however, is inferior to RIE in processing precision and throughput.

The thin film depositing method for depositing platinum film, iridium film or iridium oxide film or others by the above-described conventional sputtering has the problem of being unable to deposit platinum film on the tops and sides of the steps of a stepped pattern drawn on the substrate in a uniform thickness.

Accordingly, it is difficult to deposit a platinum film, iridium film or iridium oxide film on complicated patterns, which makes it impossible to use platinum film, iridium film or iridium oxide film as electrodes of high dielectric constant materials of thin capacitor cells, or stacked capacitor cells of DRAMs (Dynamic Random Access Memory).

The iridium film deposited by the thin film depositing method described in Japanese Patent Laid-Open Publication No. 290789/1994 has much better covering on step-patterned substrates than that deposited by sputtering. In a case that iridium acetylacetate, for example, is used as a iridium source material, it is difficult to stably supply the gas, which causes a large disuniformity of thickness of the deposited iridium film, In addition to this, no iridium source material which can reduce the thickness disuniformity of the iridium film in its deposition by CVD has been found.

Furthermore, it is difficult to make micronized patterns in iridium film or iridium oxide film by the above-described conventional ion milling, and iridium film or iridium oxide film is difficult to be applied to device processes, as of DRAMs, which require micronized processing.

From this viewpoint, the selective growth of iridium film and iridium oxide film is preferable, but the possibility of their selective growth under the conventional film forming conditions has not been found.

In the above-described conventional film depositing method for ruthenium or ruthenium oxide film, because $Ru(DPM)_3$ is sublimated at a temperature (about 135° C.) below its melting point (160–170° C.), it is difficult to feed $Ru(DPM)_3$ into the deposition chamber in a constant feed amount.

That is, a feed amount of $Ru(DPM)_3$ depends on an area of contact between the $Ru(DPM)_3$ and its carrier gas. $Ru(DPM)_3$ powder decreases as a deposition time lapses, and the area of the contact therebetween decreases. A feed amount of $Ru(DPM)_3$ often decreases as a deposition time lapses.

In addition, due to non-constant feed amounts of the raw material, the deposited ruthenium films or ruthenium oxide films vary in film thickness and sheet resistance among batches.

SUMMARY OF THE INVENTION

A first object of the present invention is to provide a capacitor device, a dielectric film of which can be deposited in an oxidizing atmosphere without deteriorating characteristics thereof and a fabrication method for fabricating the same, and a semiconductor device.

A second object of the present invention is to provide a capacitor device structure which allows processing precision of the electrode to be improved and throughput to be improved, and a semiconductor device.

A third object of the present invention is to provide a thin film deposition method which can deposit by CVD platinum film having a good covering on the surfaces of steps, and a semiconductor device using platinum film and a fabrication method for fabricating the same.

A fourth object of the present invention is to provide a thin film depositing method Which can deposit stable ruthenium film or ruthenium oxide film by stably feeding ruthenium source material.

A fifth object of the present invention is to provide a highly reliable semiconductor device using ruthenium film or ruthenium oxide film deposited by the thin film depositing method, and a fabrication method for fabricating the same.

A sixth object of the present invention is to provide a thin film depositing method which can deposit iridium film and iridium oxide film having little film thickness disuniformity by CVD which is superior in covering on the surfaces of steps, a semiconductor device using the iridium film or iridium oxide film and a fabrication method for fabricating the same.

A seventh object of the present invention is to provide a thin film depositing method which can selectively grow iridium film and iridium oxide film.

An eighth object of the present invention is to provide a semiconductor device having iridium film or iridium oxide film with a micronized pattern formed by selectively growing the iridium film or iridium oxide film and a fabrication method for fabricating the same.

The above-described objects are achieved by a capacitor device comprising a pair of electrodes, and a dielectric film formed between the pair of electrodes, at least one of the pair of electrodes being formed of a material containing titanium nitride of (200) orientation, whereby even in a case that a high dielectric film formed in an oxidizing atmosphere is used as the capacitor dielectric film, the capacitor device can have good quality. By forming the electrodes of the capacitor device of titanium nitride, the electrodes can be patterned by RIE. Processing precision of the electrodes and throughputs can be much improved.

The above-described objects are achieved by a capacitor device comprising: an insulating film formed on a substrate, and having a contact hole reaching the substrate; a first electrode formed on the insulating film, and electrically connected to the substrate through the contact hole formed in the insulating film; a dielectric film formed on the first electrode; a second electrode formed on the dielectric film; a first diffusion preventive film formed between the substrate and the first electrode for preventing a material forming the substrate from diffusing toward the first electrode; and a second diffusion preventive film formed between part of the first electrode in a region having the contact hole formed therein and the dielectric film for preventing oxygen in an oxidizing atmosphere from diffusing toward the first electrode, whereby even in forming the dielectric film in an oxidizing atmosphere, the first diffusion preventive film is not oxidized, and accordingly a contact resistance between the first electrode and the substrate can be kept low.

It is preferred that the above-described capacitor device further comprises an oxidation-resistant conducting film provided between the second diffusion preventive film and the dielectric film, whereby oxidation of the first diffusion preventive film can be prevented without decrease in capacitance caused by the second diffusion preventive film.

The above-described objects can be achieved by a semiconductor device comprising a memory cell including the above-described capacitor device; and a transistor electrically connected to one of the electrodes of the capacitor device, whereby the semiconductor device can be formed in a small region with a large capacitance, and accordingly its storage capacitance and integration can be improved.

The above-described objects are achieved by a method for fabricating a capacitor device comprising a first diffusion preventive film forming step of forming a first diffusion preventive film on an insulation film formed on a substrate and having a contact hole reaching the substrate formed therein for preventing a material forming the substrate from diffusing toward a device to be formed on the insulation film; a first electrode forming step of forming a first electrode on the first diffusion preventive film, a second diffusion preventive film forming step of forming a second diffusion preventive film on part of the first electrode in a region having the contact hole formed therein for preventing oxygen from diffusing in the second diffusion preventive film; a dielectric film forming step of forming in an oxidizing atmosphere a dielectric film on the first electrode having the second diffusion film formed thereon; and a second electrode forming step of forming a second electrode on the dielectric film, whereby in forming the dielectric film in an oxidizing atmosphere, the oxidation of the first diffusion preventive film is prevented, and a contact resistance between the first electrode and the substrate can be maintained low.

It is preferred that the above-described method for fabricating a capacitor device further comprises a conducting film forming step of forming an oxidation resistant conducting film on the first electrode having the second diffusion preventive film formed thereon, which step follows the second diffusion preventive film forming step, whereby the oxidation of the first diffusion preventive film can be prevented without decreasing the capacitance of the second diffusion preventive film.

The above-described objects are achieved by the thin film forming method in which a platinum film is formed by chemical vapor deposition using $Pt(HFA)_2$ as a source material, whereby platinum film can be formed with good covering even on rough surfaces of substrates.

It is preferred that in the above-described thin film forming method, a substrate for the platinum film to be formed on is heated to 300–600° C.; and a reaction pressure in a film forming chamber in which the platinum film is formed is set to 1–20 Torr, whereby the platinum film can have good quality.

It is preferred that in the above-described thin film forming method hydrogen gas is fed into the film forming chamber in which the platinum film is formed when the platinum film is formed, whereby less carbon is mixed into the platinum film, and high quality platinum film having good orientation can be formed.

The above-described objects are achieved by the method for fabricating a semiconductor device comprising the step of forming a platinum film by the above-described thin film forming method, whereby high quality platinum film can be formed, and the semiconductor device can have improved reliability.

The above-described objects are achieved by the thin film forming method in which ruthenium film or ruthenium oxide film is formed by chemical vapor deposition using $Ru(DMHPD)_3$ as a source material. Ruthenium or ruthenium oxide film is thus formed, whereby the ruthenium source material can be stably supplied. Accordingly, good control is possible, and the ruthenium film or the ruthenium oxide film can be deposited without deviations among batches.

It is preferred that in the above-described thin film forming method, the $Ru(DMHPD)_3$ is liquidized and vaporized for use, whereby by vaporizing $Ru(DMHPD)_3$, the inert gas and the $Ru(DMHPD)_3$ contact each other with a substantially constant area, and the $Ru(DMHPD)_3$ can be stably supplied.

It is preferred that in the above-described thin film forming method, a substrate for the ruthenium film or the ruthenium oxide film to be formed on is heated to 300–500° C.; and a reaction pressure in a film forming chamber in which the ruthenium film or the ruthenium oxide film is to be formed in is set to 1–10 Torr. The thus-formed ruthenium film or ruthenium oxide film can have good quality.

It is preferred that in the above-described thin film forming method, hydrogen gas is fed into a film forming chamber in which the ruthenium film is formed when the ruthenium film is formed. By feeding hydrogen gas into the film forming chamber in forming ruthenium film, less carbon is mixed into the ruthenium film, and accordingly the ruthenium film can have good quality.

It is preferred that in the above-described method, oxygen gas is fed into a film forming chamber in which the ruthenium oxide film is formed when the ruthenium oxide film is formed.

The above-described objects are achieved by the semiconductor device comprising the ruthenium film or the ruthenium oxide film formed by the above-described thin film forming method.

The above-described objects are achieved by the method for fabricating a semiconductor device comprising the step of forming the ruthenium film or ruthenium oxide film by the above-described thin film forming method, whereby in the step of forming the ruthenium film or the ruthenium oxide film, deviations between batches can be reduced.

The above-described objects are achieved by the thin film forming method in which iridium film or iridium oxide film is formed by chemical vapor deposition using $Ir(DPM)_3$ as a source material. By thus depositing iridium film or iridium oxide film, the iridium film or the iridium oxide film can be deposited with good covering even on rough surfaces of substrates; In comparison with the deposition of iridium film or iridium oxide film by the conventional use of $Ir(acac)_3$ as a source material, thickness deviations of the film can be kept small.

It is preferred that in the above-described thin film forming method, a substrate for the iridium film or the iridium oxide film to be formed on is heated to 500–600° C.; and a reaction pressure in a film forming chamber in which the iridium film or the iridium oxide film to be formed in is set to 1–20 Torr. By thus forming the iridium film or the iridium oxide film, the iridium film or the iridium oxide film can have good quality.

It is preferred that in the above-described thin film forming method, hydrogen gas is fed into the film forming chamber in which the iridium film is formed when the iridium film is formed, whereby the iridium film can have little carbon mixed in, and a resistivity of the iridium film can be much decreased, The iridium film can have improved flatness.

It is preferred that in the above-described thin film forming method, oxygen gas is fed at a 0.5–16 Torr partial pressure into the film forming chamber in which the iridium oxide film is formed when the iridium oxide film is formed. By thus depositing the iridium oxide film, the iridium oxide film can have good quality.

The above-described objects are achieved by the above-described thin film forming method, in which the iridium film or the iridium oxide film is selectively deposited in a first region of substrate for the iridium film or the iridium oxide film to be deposited on said first region, a first material being exposed, the substrate having the first region and a second region with a second material exposed. The thus selectively formed iridium film or the iridium oxide film does not need patterning by ion milling. Iridium film or iridium oxide film having micronized patterns can be easily formed.

It is preferred that in the above-described thin film forming method, in depositing the iridium film, the substrate for the iridium film to be deposited on is heated to a temperature above 400° C. and below 550° C., and the interior of the film forming chamber is set at a pressure above 0.1 Torr and below 20 Torr. Iridium film can be selectively grown by thus setting thin film forming conditions.

It is preferred that in the above-described thin film forming method, in depositing the iridium oxide film, the substrate for the iridium oxide film to be formed on is heated to a temperature above 400° C. and below 600° C., and the interior of the film forming chamber is set at a pressure above 0.1 Torr and below 30 Torr. Iridium oxide film can be selectively grown by thus setting the thin film forming conditions.

The above-described objects are achieved by a method for fabricating a semiconductor device comprising: a barrier layer forming step of forming a barrier layer of Ti film or TiN film in a first region of a substrate; a lower electrode forming step of selectively depositing iridium film or iridium oxide film on the barrier layer by the above-described thin film forming method to form a lower electrode; a dielectric film forming step of forming a dielectric film on the lower electrode; and an upper electrode forming step of forming an upper electrode on the dielectric film, whereby patterning of the lower electrode is not necessary, which simplifies the fabrication process. Micronized patterns can be formed.

The above-described objects are achieved by a method for fabricating a semiconductor device comprising the step of forming the iridium film or the iridium oxide film by the above-described thin film forming method.

The above-described objects are achieved by the method for fabricating a semiconductor device comprising: a first thin film forming step of selectively forming a first iridium film or first oxide iridium film in a set region of a substrate for the film to be deposited on; and a second thin film forming step of forming a second iridium film or a second iridium oxide film on an entire surface of the substrate having the first iridium film or the first iridium oxide film formed thereon.

The above-described objects are achieved by the method for fabricating a semiconductor device comprising: a plug burying step of selectively burying iridium film or iridium oxide film by the above-described thin film forming method in a through-hole formed in silicon oxide film formed on a surface of a substrate for the film to be deposited on; and an electrode forming step of non-selectively forming iridium film or iridium oxide film on the silicon oxide film with a plug buried in the through-hole to form an electrode connected to the plug, whereby only by changing deposition conditions for the iridium film and the iridium oxide film, burying the through-hole and forming the electrode can be concurrently conducted. Fabrication process for such a semiconductor device can be accordingly simplified.

BRIEF DESCRIPTION OF THE DRAWINGS

FIG. 1 shows X-ray diffraction spectrums of TiN film deposited on a silicon substrate.

FIG. 20 shows X-ray diffraction spectrums of iridium film and iridium oxide film formed by the thin film forming method according to a ninth embodiment of the present invention.

DETAILED DESCRIPTION OF THE INVENTION

[A First Embodiment ]

Figure 2A:
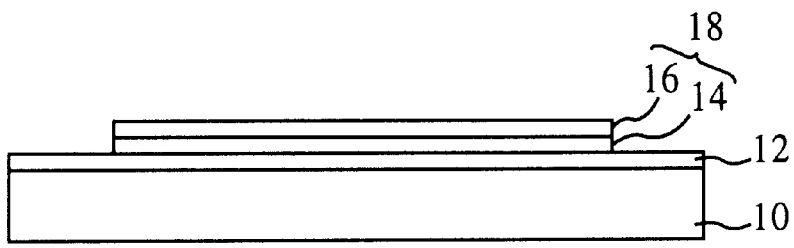
FIGS. 2A–2D are sectional views of the capacitor device in the steps of the method for fabricating the capacitor device according to the first embodiment, which explains the method.

A method for fabricating a capacitor device according to a first embodiment of the present invention will be explained with reference to FIGS. 1, 2A–2D, and 3.

FIG. 1 shows diffraction spectrums showing results of analysis, by X-ray diffraction, of a TiN film deposited on a silicon substrate, FIGS. 2A–2D are sectional views of the capacitor device in the steps of the method for fabricating the capacitor device according to the present embodiment. FIG. 3 is a graph showing leak current of the capacitor device fabricated by the method for fabricating the capacitor device according to the present embodiment.

First, results of study of oxidation resistance of the TiN film (titanium nitride film) are shown.

The samples used in the experiment were prepared by depositing TiN films of about 100 nm-thickness on silicon substrates by sputtering. In forming the films, a substrate temperature was 300° C., a growth vacuum degree was 1 mTorr, a target was Ti, and a sputtering gas was Ar (argon) gas and $N_2$ (nitrogen) gas. The following three kinds of samples were prepared, using different gas ratios for forming the films.

[Sample 1] Ar vs. $N_2$ gas ratio: 1:1

[Sample 2] Ar vs. $N_2$ gas ratio: 1:4

[Sample 3] Ar vs. $N_2$ gas ratio: 1:10

FIG. 1 shows results of X-ray diffraction analysis of the thus formed TiN films.

In Sample 1 having an Ar vs. $N_2$ gas ratio of 1:1, a diffraction peak in the silicon substrate and a diffraction peak in the TiN(111) were detected. That is, a TiN film having orientation (111) is formed (FIG. 1, (a)).

In Sample 2 having an increased $N_2$ gas part and an Ar vs. $N_2$ gas of 1:4, in addition to a diffraction peak in TiN(111), a diffraction peak in TiN(200) was detected, and the diffraction peak TiN(111) is smaller. That is, a TiN film having orientation (100) and a TiN film having orientation (200) were formed mixed (FIG. 1, (b)).

In sample 3 having a further increased $N_2$ gas part and an Ar vs. $N_2$ gas of 1:10, the diffraction peak in orientation (111) is absent. A TiN diffraction peak was detected only in TiN (200). That is a TiN film having orientation (200) was formed on the silicon substrate (FIG. 1, (c)).

Thus, the orientation of the TiN film is changed from orientation (111) to orientation (200) as the portion of $N_2$ gas increases.

Then, to study relationships between the orientation of the TiN film and the oxidation resistance thereof, the above samples are annealed in an oxygen atmosphere, The annealing conditions were 600° C., 30 minutes and 1 atmospheric pressure.

TABLE 1 shows resistivity changes of TiN film before and after annealing.

TABLE 1

|  | Resistivity before annealing | Resistivity after annealing |
|---|---|---|
| Sample 1 | 150 µΩ-cm | unmeasurable |
| Sample 2 | 110 µΩ-cm | 150 µΩ-cm |
| Sample 3 | 95 µΩ-cm | 105 µΩ-cm |

As shown in TABLE 1, the resistivity before annealing has different values depending on the film forming conditions, and it is found that annealing increases the resistivity. Especially in Sample 1 having orientation (111), the TiN film was oxidized, and insulating $TiO_2$ was formed. The resistivity was unmeasurably increased.

On the other hand, in Samples 2 and 3 having orientation (200), resistivity increases were small, and especially in Sample 3 having orientation (200) the increase was very small.

Thus, the inventors of the present invention are the first to have found that TiN film having orientation (200) has oxidation resistance, and can reduce the increase of the resistivity even when exposed to an oxidizing atmosphere.

TiN film having such oxidation resistance is considered to be suitable for electrodes of high dielectric materials, such as $SrTiO_3$ film, $Pb(Zr,Ti)O_3$ film, etc. it was tried to form a capacitor of TiN film having orientation (200).

Then, the method for fabricating the capacitor device according to the present embodiment will be explained with reference to FIGS. 2A–2D.

An about 100 nm-thickness Ti film 14 and an about 200 nm-thickness TiN film 16 were continuously formed by sputtering on a base substrate with a silicon oxide film 12 formed on a (100) silicon substrate 10.

The Ti film 14 was deposited by sputtering at a substrate temperature of 300° C., a growth vacuum degree of 1 mTorr, with Ti as a target and by the use of Ar as a a sputtering gas.

The TiN film 16 was deposited by sputtering at a substrate temperature of 300® C., a growth vacuum degree of 1 mTorr, with Ti as a target and by the use of Ar and $N_2$ as a sputtering gas. At an Ar vs. $N_2$ gas ratio of 1:10, the TiN film having orientation (200) was deposited. At an Ar vs. $N_2$ gas ratio of 1:4, a capacitor was separately fabricated.

Figure 3:
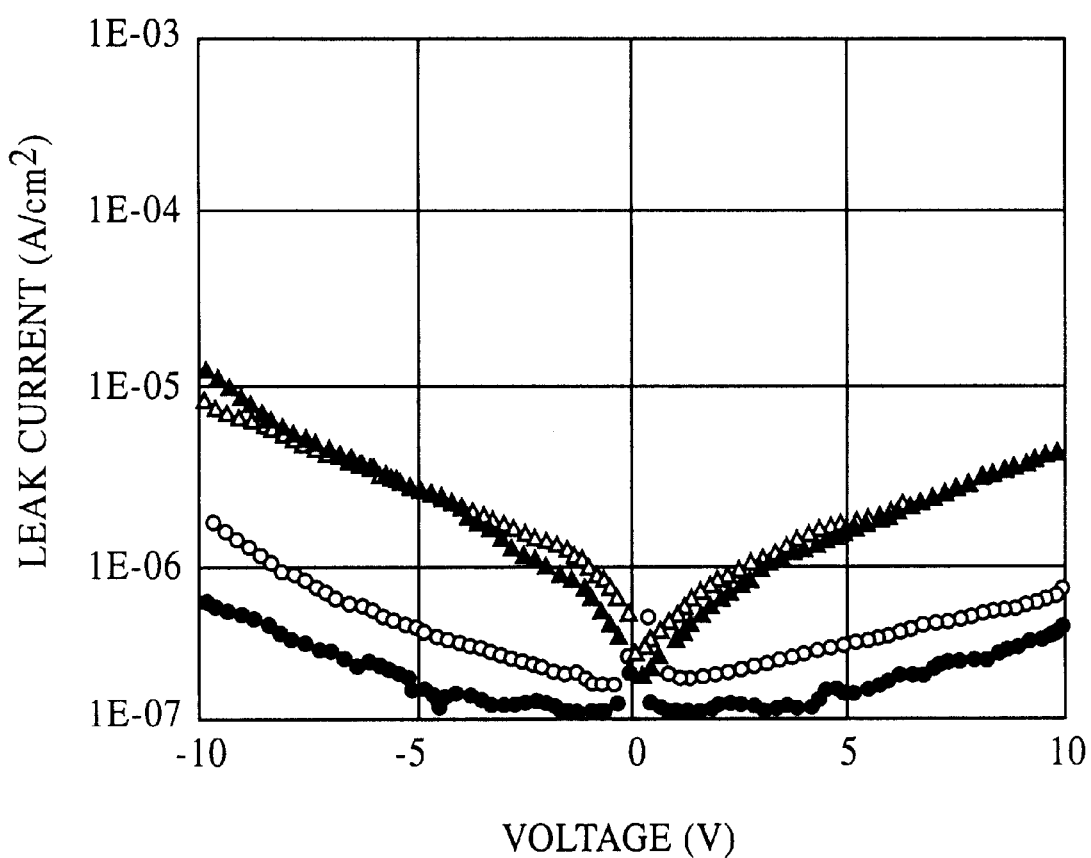
FIG. 3 is a graph of leak currents in the capacitor device fabricated by the method for fabricating the capacitor device according to the first embodiment.

Then, the TiN film 16 and the Ti film 14 were processed in the same pattern by the usual lithography and etching (FIG. 2A). The TIN film 16 and the Ti film 14 were etched at a 60° C. substrate temperature, a 200 mTorr pressure and a 200 W charged electric power and by the use of $Cl_2$ (chlorine) gas as an etching gas.

The TiN film 16 and the Ti film 14 thus constituted a lower electrode 18.

Subsequently an about 100 nm-thickness $SrTiO_3$ film was deposited by sputtering. The $SrTiO_3$ film was deposited at a 450° C. substrate temperature and at a 10 mTorr growth vacuum degree, with $SrTiO_3$ as the target and by the use of Ar gas containing 10% of $O_2$ gas as a sputtering gas.

Figure 2B:
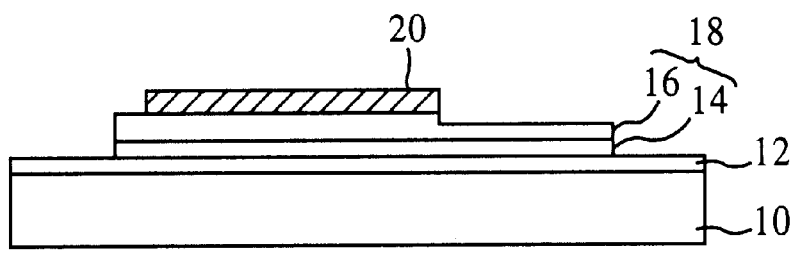

Then, the $SrTiO_3$ film was patterned by the usual lithography and etching to form a capacitor dielectric film 20. The $SrTiO_3$ film was etched with a 5% dilute hydrogen fluoride aqueous solution (FIG. 2B).

Then, an about 100 nm-thickness TiN film was deposited by sputtering. The TiN film was deposited at a substrate temperature of 300° C. and a 1 mTorr growth vacuum degree, with Ti as the target and by the use of Ar and $N_2$ as a sputtering gas. At an Ar vs. $N_2$ gas ratio of 1:10, the TiN film having orientation (200) was deposited. At an Ar vs. $N_2$ gas ratio of 1:4, a capacitor was separately fabricated.

Figure 2C:
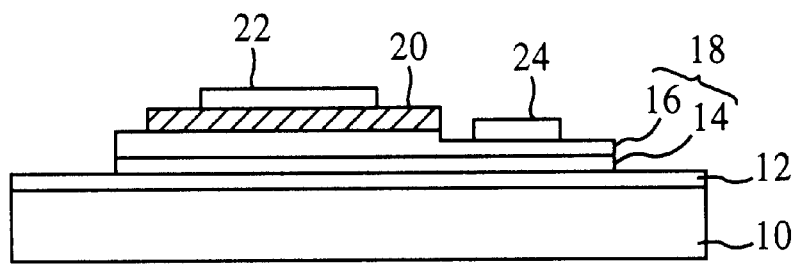

Then, the TiN film was patterned by the usual lithography and etching to form an upper electrode 22 (FIG. 2C). The TiN film 20 was etched at a temperature of 60° C., a 200 mTorr pressure and a 200 W charged electric power, and by the use of $Cl_2$ gas as an etching gas. That portion of the TiN film left on the capacitor dielectric film 20 formed the upper electrode 22, and that portion of the TiN film left on the lower electrode 18 formed an electrode 24.

Then, an about 250 nm-thickness silicon oxide film was deposited to form an inter-layer insulation film 26. The silicon oxide film was deposited at a substrate temperature of 320° C., a 20 W charged electric power, a 125 nm/min growth rate and a 1 Torr pressure, and by the use of a mixed gas of $SiH_4$, $N_2O$ and $N_2$ as source gases.

Then, the inter-layer insulation film 26 is patterned to form contact holes for leading out wiring from the upper electrode 22 and the lower electrode 18.

The inter-layer insulation film 26 was etched at a substrate temperature of 40° C., a 200 W charged electric power, a 200 mTorr pressure and a 70 nm/min etching rate, and by the use of a mixed gas of $CF_4:CHF_3=1:1$.

Figure 2D:
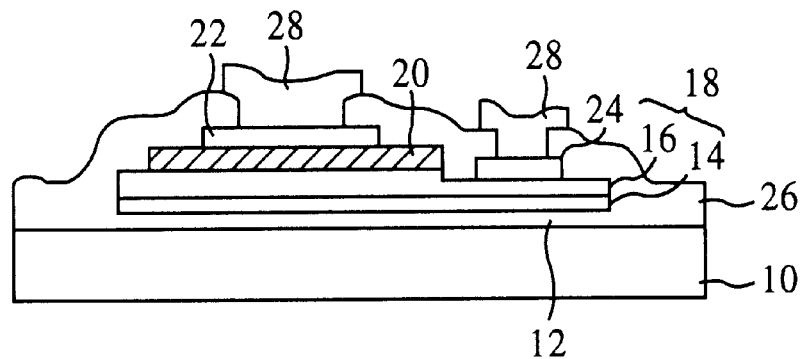

Then, to form the wiring 28 connected to the upper and the lower electrodes 22, 18, Al was deposited by sputtering in an about 600 nm-thickness and patterned by the usual lithography and etching (FIG. 2D).

The Al was deposited by sputtering at a 7 kW charged electric power, a 1 mTorr pressure, and a 600 nm/min growth rate, and by the use of $Cl_2$ as an etching gas.

Thus a capacitor having $SrTiO_3$ film as the dielectric film was fabricated.

A capacitor having a 100×100 $\mu m^2$ area was fabricated by the above-described fabrication method. The result of measuring leak currents between the upper electrode 22 and the lower electrode 18 are shown in FIG. 3.

0 and ● indicate results of a case with an Ar vs. $N_2$ gas ratio of 1:10, and Δ and ▲ indicate results of a case with an Ar vs. $N_2$ gas ratio of 1:4.

As shown, it is found that as the portion of $N_2$ gas increases, the leak current decreases. Especially in a case of a Ar vs. $N_2$ gas ratio of 1:10, the leak current could be decreased to about $1\times10^{-6}$ A·$cm^{-2}$ when 10 V was applied. It was found that good-quality capacitors could be fabricated.

Such decrease of the leak current is considered to be due to the TiN film having the oxidation resistance improved, and accordingly oxygen in the $SrTiO_3$ film is not absorbed by the TiN film on the upper electrode 22 and the TiN film on the lower electrode 18, whereby the leak current can be kept small.

In the above-described capacitor the specific dielectric constant could have a sufficiently high value of about 200.

As described above, according to the present embodiment, the electrodes of the capacitor were formed of TiN film having high oxidation resistance and orientation (200), whereby even in a case that a high dielectric thin film grown in an oxidizing atmosphere is used as the capacitor dielectric film, the capacitor can have good quality.

The electrodes of the capacitor were formed of TiN film, which permits the electrodes to be patterned by RIE. The processing precision and throughput of the patterning of the electrodes can be much improved.

The present embodiment is characterized in that the capacitor electrodes include TiN of orientation (200), and the above-described capacitor structure and processing conditions are one example. Change of the above-described capacitor structure to another capacitor structure does not affect the advantageous effects of the present invention.

[A Second Embodiment]

The capacitor device according to a second embodiment of the present invention and the method for fabricating the same will be explained with reference to FIGS. 4 and 5A–5C.

Figure 4:
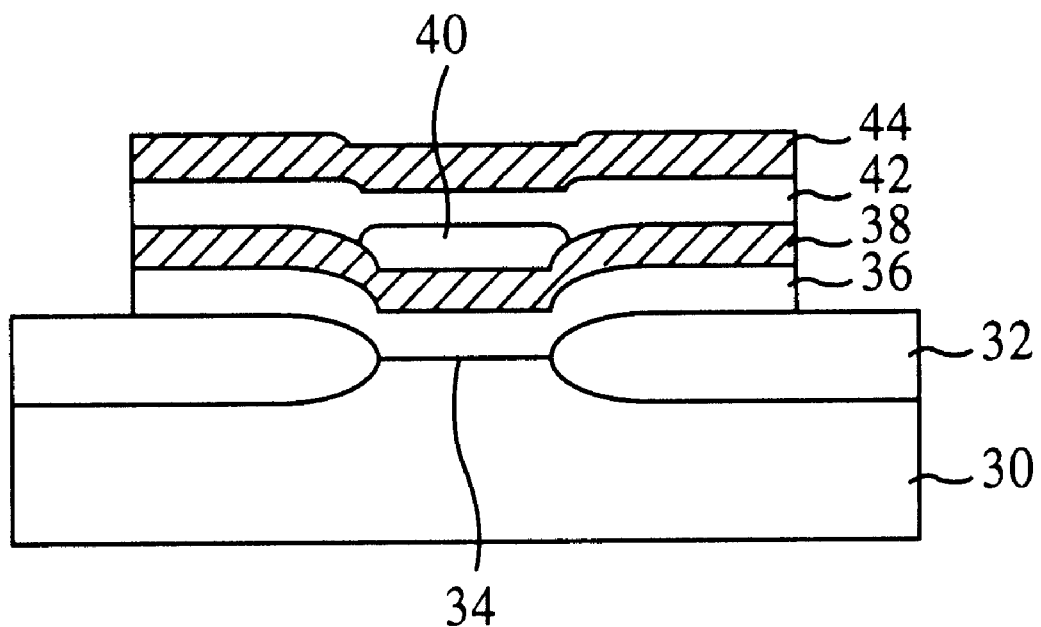
FIG. 4 is a schematic sectional view of the capacitor device according to a second embodiment of the present invention, which explains a structure thereof.
Figure 5A:
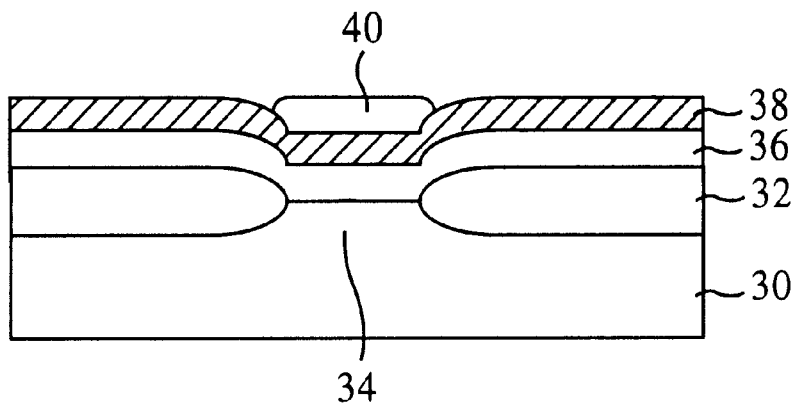
FIGS. 5A–5C are sectional views of the capacitor device in the steps of the method for fabricating the capacitor device according to the second embodiment, which explain the method.
Figure 5B:
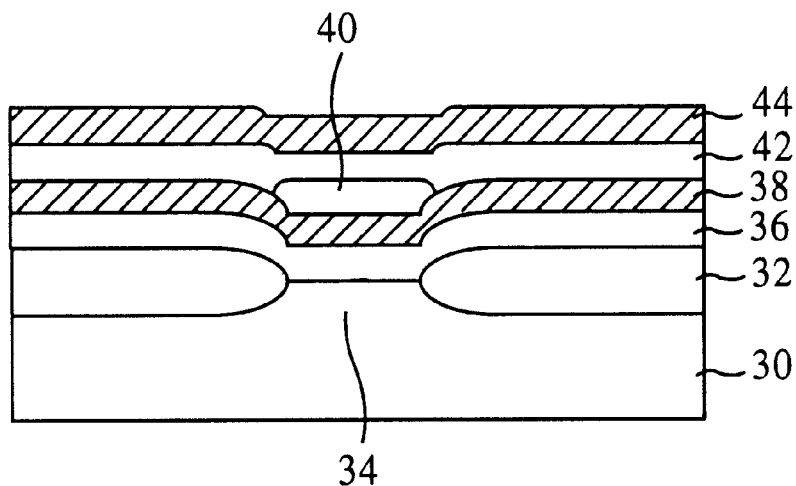
Figure 5C:
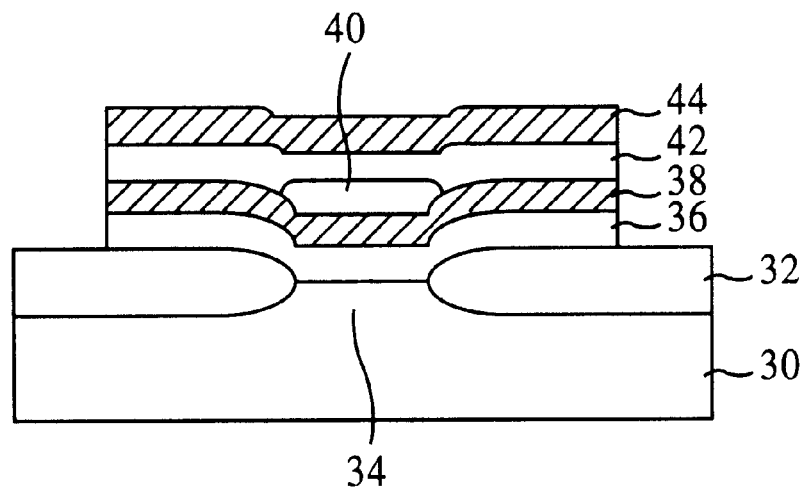

FIG. 4 is schematic sectional view of the capacitor device according to the present embodiment, which shows a structure thereof. FIGS. 5A–5C are sectional views of the capacitor device in the steps of the method for fabricating the same, which explain the method.

The capacitor device according to the present embodiment is characterized in that in depositing a high dielectric thin film, a diffusion preventive film for preventing diffusion of oxygen is provided on that portion of a lower electrode in a region where a contact hole for interconnecting a contact layer for contacting a semiconductor substrate and the lower electrode, and the semiconductor substrate, is formed.

That is, a contact hole 34 is defined by a device isolation film 32 on a silicon substrate 30. A contact layer 36 which contacts the silicon substrate 30 in the contact hole 34 is formed on the device isolation film 32. A lower electrode 38 of platinum is formed on the contact layer 36. A diffusion preventive film 40 is formed on the lower electrode 38 in a region thereof where the contact hole 34 is opened. A capacitor dielectric film 42 of SrTiO$_3$ film is formed on the lower electrode 38 having the diffusion film 40 formed thereon. An upper electrode 44 of platinum film is formed on the capacitor dielectric film 42.

Then, the method for fabricating the capacitor device according to the present embodiment will be explained with reference to FIGS. 5A–5C.

First, the device isolation film 32 is formed on the silicon substrate 30 to thereby form the contact hole 34 defined by the device isolation film 32.

Next, the contact layer 36 of Ti and the lower electrode 38 of platinum are formed. The lower electrode 38 and the silicon substrate 30 are contacted to each other through the contact layer 36 in the contact hole 34. The contact layer 36 functions not only to improve contact between the lower electrode 38 and the silicon substrate 30, but also, as a diffusion preventive film, which prevents silicon atoms in the silicon substrate from diffusing toward the lower electrode 38.

Subsequently a silicon oxide film is deposited on the lower electrode 38 and then is patterned so that a part of the silicon oxide film on the lower electrode 38 in a region thereof where the contact hole 34 is opened is left to thereby form the diffusion preventive film 40 (FIG. 5A).

Next, the capacitor dielectric film 42 of SrTiO$_3$ film is formed on the lower electrode 38 having the diffusion preventive film 40 patterned thereon (FIG. 5A).

SrTiO$_3$ film is usually deposited in an oxidizing atmosphere. Accordingly, oxygen in the atmosphere diffuses the platinum film to react with Ti, and the contact layer 36 is made highly resistive. The oxygen in the atmosphere, however, does not reach that portion of the contact layer 36 in the region where the contact hole 34 is formed, because of the diffusion preventive film 40 formed in the region of the lower electrode 38 above the contact hole 34. The contact resistance between the silicon substrate 30 and the lower electrode 38 remains low.

Then the upper electrode 44 of platinum is formed on the capacitor dielectric film 42 (FIG. 5B).

Subsequently the upper electrode 44, the capacitor dielectric film 42, the lower electrode 38 and the contact layer 36 are processed into the same pattern, and a capacitor is formed (FIG. 5C).

As described above, according to the present embodiment, the diffusion film 40 is formed on the lower electrode 38 in a region where the contact hole 34 is formed, whereby the capacitor dielectric film 42 is formed even in an oxidizing atmosphere, and a low contact resistance can be maintained between the lower electrode 38 and the silicon substrate 30.

[A Third Embodiment]

The capacitor device according to a third embodiment of the present invention and the method for fabricating the same will be explained with reference to FIGS. 6 and 7A–7C.

Figure 6:
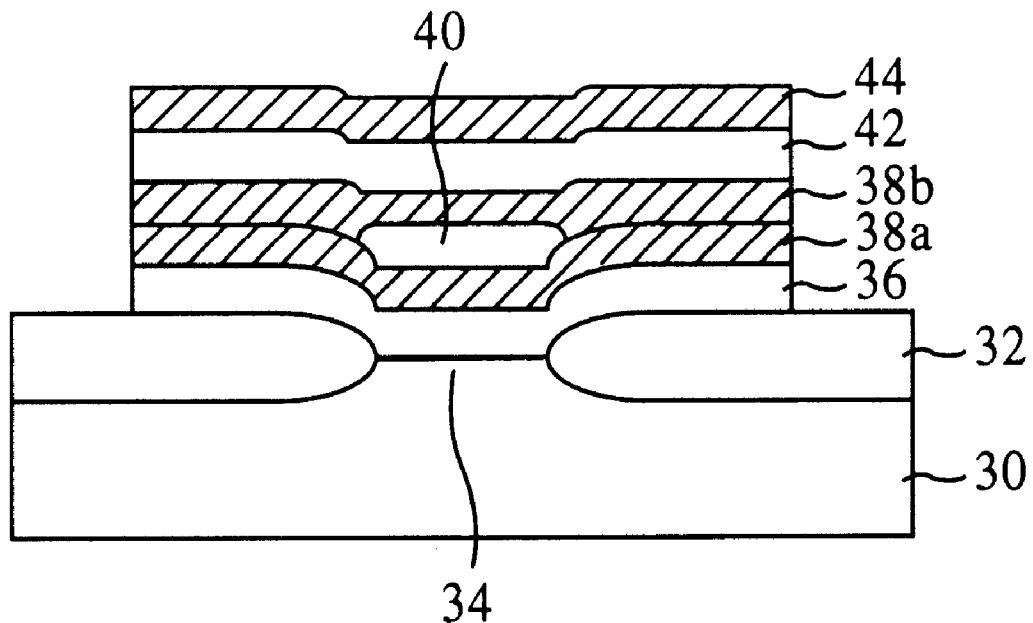
FIG. 6 is a schematic view of the capacitor device according to a third embodiment of the present invention, which explains a structure thereof.
Figure 7A:
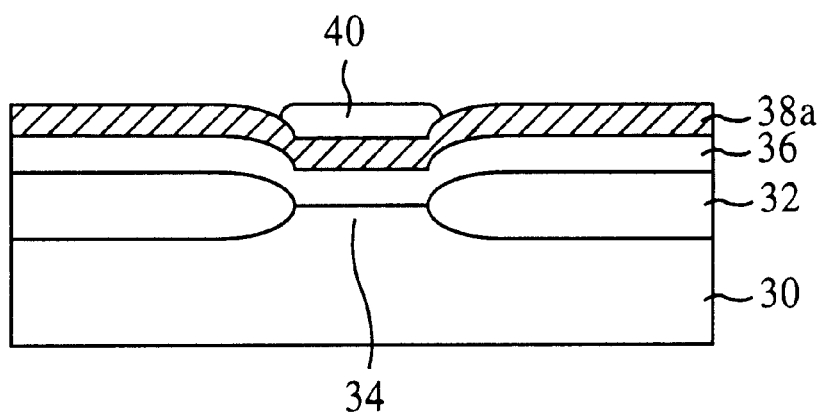
FIGS. 7A–7C are sectional views of the capacitor device according to the third embodiment of the present invention, which explain the method.
Figure 7B:
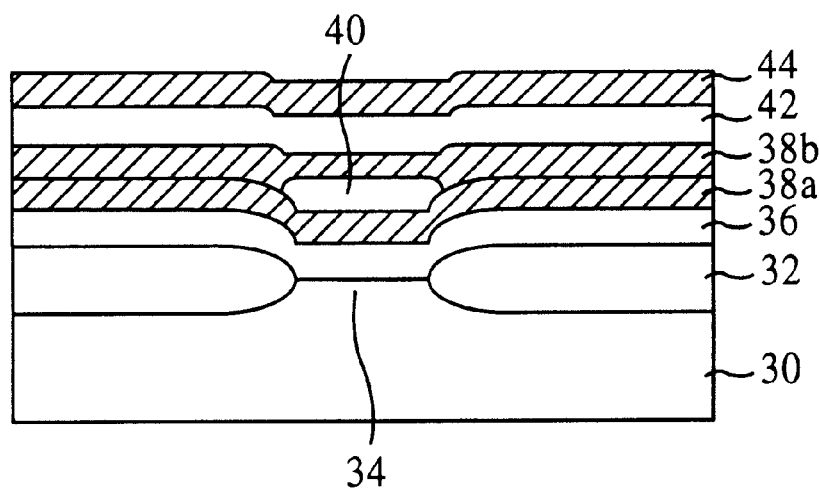
Figure 7C:
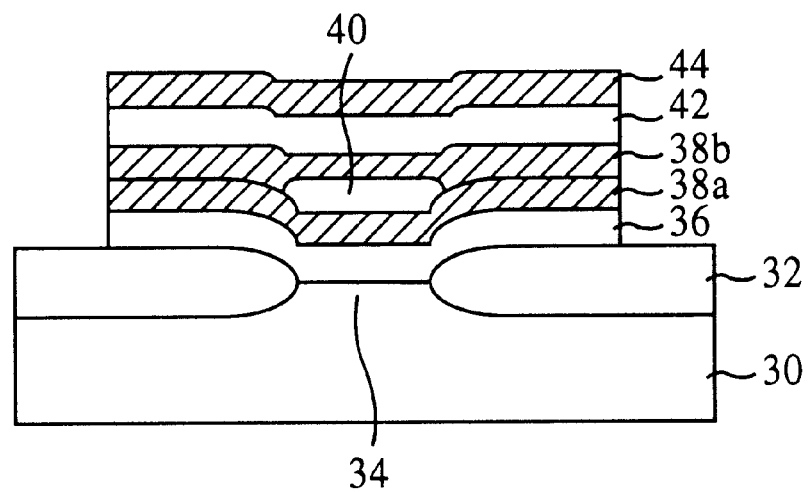

FIG. 6 is a schematic sectional view of the capacitor device according to the present embodiment, which shows a structure thereof. FIGS. 7A–7C are schematic sectional views of the capacitor device according to the present embodiment, which show the method.

The capacitor device according to the present embodiment is characterized in that the capacitor device according to the second embodiment has the diffusion preventive film formed in the lower electrode.

That is, a contact hole 34 is defined by a device isolation film 32 on a silicon substrate 30. A contact layer 36 is formed on the device isolation film 32 and is contacted to the silicon substrate 30 in the contact hole 34. A lower electrode 38a of platinum is formed on the contact layer 36. A diffusion preventive film 40 is formed on the lower electrode 38a in a region where the contact hole 34 is opened. A lower electrode 38b of platinum is formed on the lower electrode 38a having the diffusion preventive film 40 formed thereon. The diffusion preventive layer 40 is enclosed by the lower electrodes 38a, 38b. A capacitor dielectric film 42 of SrTiO$_3$ film is formed on the lower electrode 38b. An upper electrode 44 of platinum film is formed on the capacitor dielectric film 42.

Then, the method for fabricating the capacitor device according to the present embodiment will be explained with reference to FIGS. 7A–7C.

First, the device isolation film 32 is formed on the silicon substrate 30 to thereby define the contact hole 34 by the device isolation film 32.

Then, the contact layer 36 of Ti and the lower electrode 38a of platinum are deposited. The lower electrode 38a and the silicon substrate 30 are contacted to each other through the contact layer 36 in the contact hole 34.

Then, a silicon oxide film is deposited on the lower electrode 38a and is patterned so that the portion of the silicon oxide film in a region of the lower electrode 38a where the contact hole 34 is opened is left, and the diffusion preventive film 40 is formed (FIG. 7A).

Then, the lower electrode 38b of platinum is deposited on the lower electrode 38a having the diffusion preventive layer 40 formed thereon. Thus, the diffusion preventive layer 40 is completely enclosed by platinum.

Then, the capacitor dielectric film 42 of SrTiO$_3$ film is formed on the lower electrode 38b.

SrTiO$_3$ film is usually deposited in an oxidizing atmosphere. Oxygen in the atmosphere diffuses the lower electrodes 38a, 38b and reacts with Ti, and the contact layer 36 is made highly resistive. However, because of the diffusion preventive film 40 formed in the region of the lower electrode 38a below the contact hole 34, the oxygen in the atmosphere does not reach that portion of the contact layer in the region where the contact hole 34 is formed, and a low contact resistance is maintained between the silicon substrate 30 and the lower electrode 38.

Subsequently the upper electrode of platinum is formed on the capacitor dielectric film 42 (FIG. 7B).

Then, the upper electrode 44, the capacitor dielectric film 42, the lower electrode 38 and the contact layer 36 are processed in the same pattern, and a capacitor is fabricated (FIG. 7C).

As described above, according to the present embodiment, the diffusion preventive film 40 is formed on the lower electrode 38a in a region where the contact hole 34 is formed, whereby even in forming the capacitor dielectric film 42 in an oxidizing atmosphere, a low contact resistance can be maintained between the lower electrode 38 and the silicon substrate 30.

The diffusion preventive film 40, which is formed between the lower electrodes 38a, 38b, does not function as a part of the capacitor dielectric film as in the second embodiment. Accordingly, in the capacitor device according to the present embodiment, the above-described effects can be obtained without capacitance decrease.

In the above-described second and third embodiments, the diffusion preventive films 40 were formed of silicon oxide film, but they may be formed of other materials as long as the materials can prevent diffusion of oxygen. For example, silicon nitride film, or Ti, Ta (tantalum) W (tungsten) or Al, or nitrides or oxides, etc. of such metals may be used.

In a case where TiN film is used as the diffusion preventive film 40, it is more effective to use TiN film of orientation (200). The TiN film of orientation (200) has such a high oxidation resistance that a low contact resistance can be maintained between the lower electrode 38 and the silicon substrate 30 without capacitance decreases.

In the above-described second and third embodiments, the contact layers 36 are formed of TiN film but may be formed of other materials as long as the materials can prevent silicon atoms in the silicon substrates 30 from diffusing to react with the platinum films. For example, metals, such as Ta, W, etc., or their nitrides or their silicides may be used. Multi-layer films, such as TiN/Ti, etc. may be used.

The platinum film forming the upper electrodes or the lower electrodes may be replaced by other oxidation resistant materials. For example, conducting oxides, such as Pd (paradium), or Ru (ruthenium) or Ir (iridium), etc. may be used.

[A Fourth Embodiment]

A semiconductor device according to a fourth embodiment of the present invention and a method for fabricating the same will be explained with reference to FIGS. 8 and 9A–9C.

Figure 8:
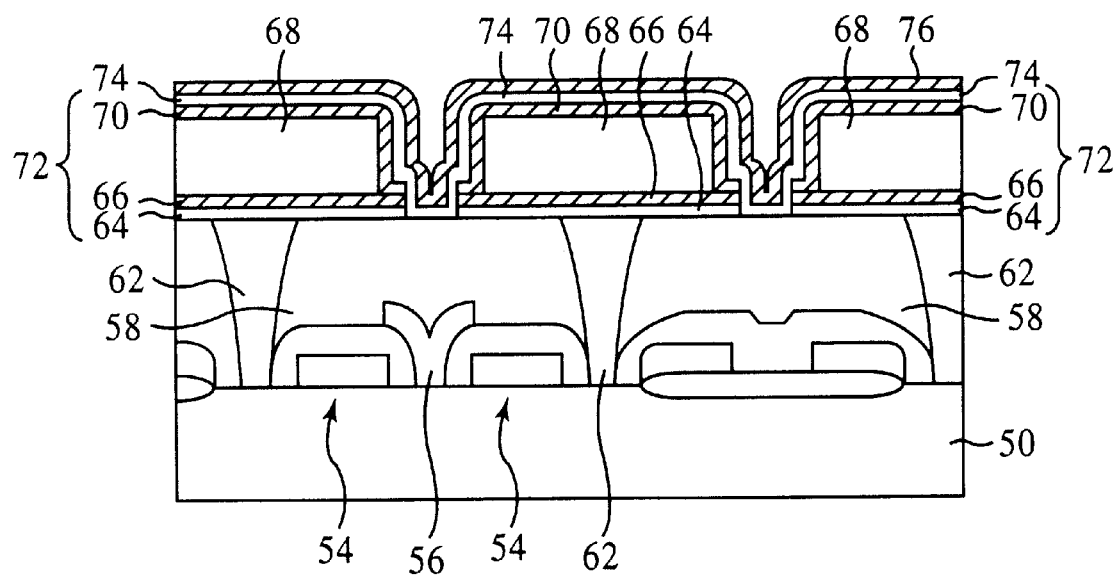
FIG. 8 is a schematic view of the semiconductor device according to a fourth embodiment of the present invention, which explains a structure thereof.
Figure 9A:
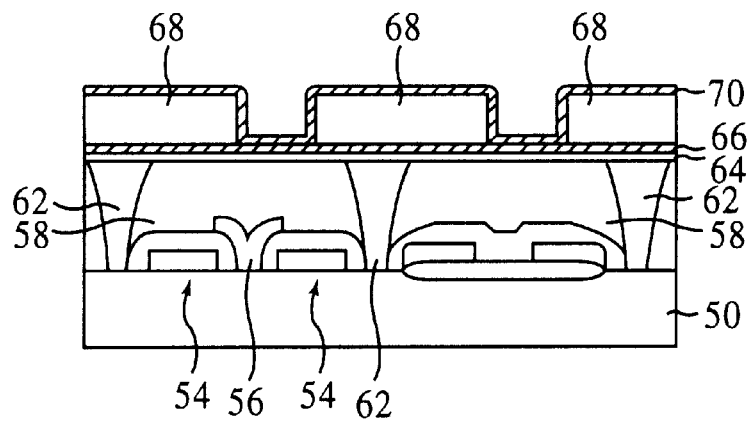
FIGS. 9A–9C are sectional views of the semiconductor device in the steps of the method for fabricating the semiconductor device according to the fourth embodiment, which explain the method.
Figure 9B:
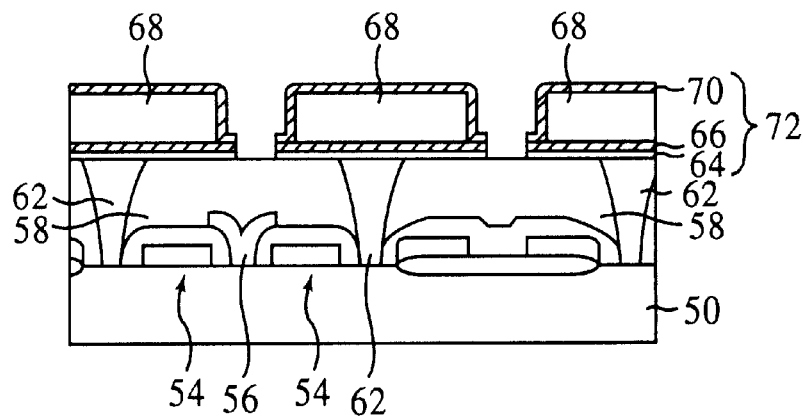
Figure 9C:
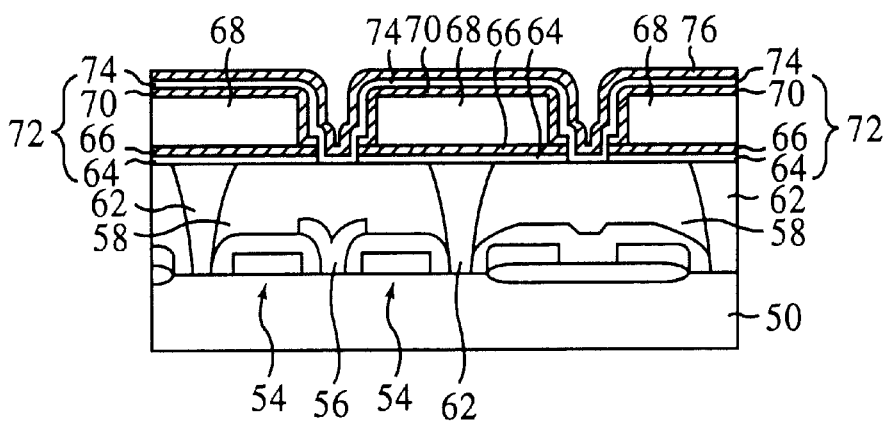

FIG. 8 is a schematic sectional view of the semiconductor device according to the present embodiment, which shows a structure thereof. FIGS. 9A–9C are sectional views of the semiconductor device according to the present embodiment on the respective steps of the method for fabricating the same.

In the present embodiment, an example in which the capacitor device according to the third embodiment is applied to the capacitors of a DRAM is described.

In the present embodiment, as shown in FIG. 8, a DRAM cell comprising one transistor and one capacitor includes the capacitor device according to the third embodiment.

That is, on a plug 62 led from a memory cell transistor 54 there is formed a capacitor storage electrode 72 comprising a multi-layer film including platinum films 66, 70 and a diffusion preventive film of silicon oxide film 68 sandwiched between the platinum films 66, 70. A capacitor dielectric film 74 and a capacitor opposed electrode 76 are formed on the capacitor storage electrode 72.

Then, the method for fabricating the semiconductor device according to the present embodiment will be explained with reference to FIGS. 9A–9C.

Memory cell transistors 54 and bit lines 56 are formed on a silicon substrate 50 by the usual DRAM fabrication process. Then, an inter-layer insulation film 58 is deposited on the memory cell transistors and the bit lines 56, and the surface of the inter-layer insulation film 58 is planarized. Then, contact holes for connecting the memory cell transistors 54 and the capacitor storage electrode of capacitors to be formed by the upper layers are opened. A polycrystalline silicon film is deposited and etched back to bury the plugs of the polycrystalline silicon in the contact holes.

Next, a Ti film 64 and a platinum film 66 are continuously formed. The Ti film 64 functions as the diffusion preventive film which prevents silicon atoms in the plugs 62 from diffusing into the platinum film 66.

Then, a silicon oxide film is deposited and patterned to form the solid storage electrode units. The thus patterned silicon oxide film 68 functions as a diffusion preventive film which reduces diffusion of oxygen atoms in depositing the dielectric film thereon in an oxidizing atmosphere.

Subsequently the platinum film 70 is deposited on the platinum film 66 and the silicon oxide film 68 (FIG. 9A), and the platinum films 70, 66 and the Ti film 64 are processed in the same pattern. Thus, the capacitor storage electrode 72 comprising the multi-layer film of the platinum films 66, 70, and the silicon oxide film 68 is sandwiched therebetween (FIG. 9B).

Next, the capacitor dielectric film 74 of $SrTiO_3$ film is formed on the capacitor storage electrode 72.

$SrTiO_3$ film is usually deposited in an oxidizing atmosphere. Oxygen in the atmosphere is diffused in the platinum films 66, 70 and reacts with the Ti film 64 to thereby make the Ti film 64 highly resistive. Because of the diffusion preventive silicon oxide film 68 formed in the capacitor storage electrode 72 on the plugs 62, the oxygen in the atmosphere does not reach any parts of the Ti film 64 in the regions where the plugs are formed. A low contact resistance is retained between the plugs 62 and the capacitor storage electrode 72.

Then, a capacitor opposed electrode 76 of platinum film is formed on the capacitor dielectric film 74, and capacitors connected to the memory cell transistors 54 are formed (FIG. 9C).

Thus a DRAM comprising one-capacitor and one-transistor memory cells is fabricated.

As described above, according to the present embodiment, electric connection between the capacitor storage electrode and the memory cell transistors can be secured without capacitance decrease, which enables the capacitors of a high dielectric oxide to be used as capacitors of a highly integrated DRAM.

In the present embodiment, after the inter-layer insulation film 58 is planarized, the plugs 62 are formed, and the capacitors connected to the plugs 62 were formed, but the capacitors may be connected directly to the memory cell transistors 54.

Figure 10A:
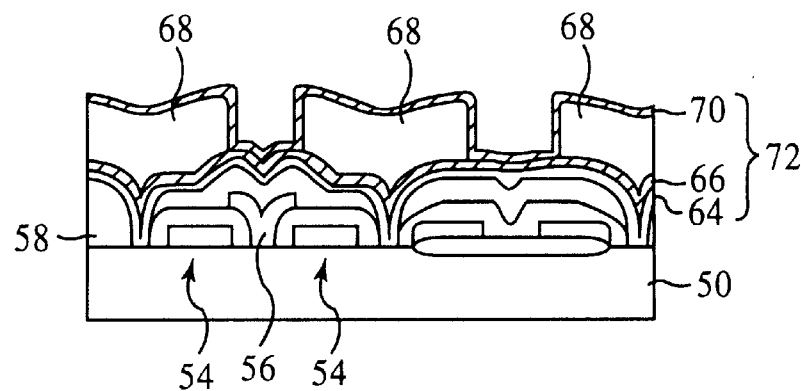
FIGS. 10A–10C are sectional views of one variation of the semiconductor device according to the fourth embodiment, which explain the variation and the method.
Figure 10B:
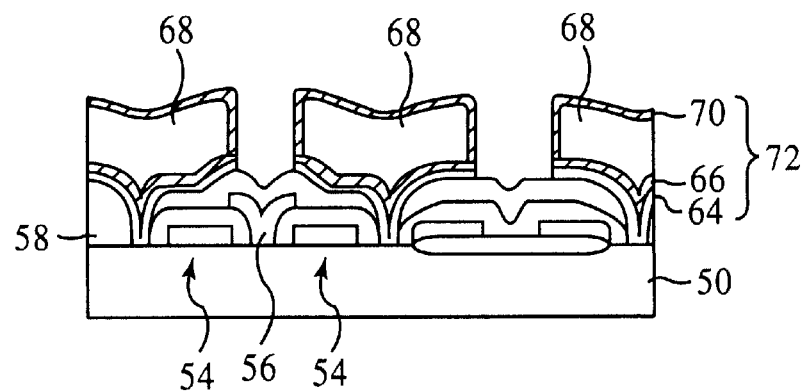
Figure 10C:
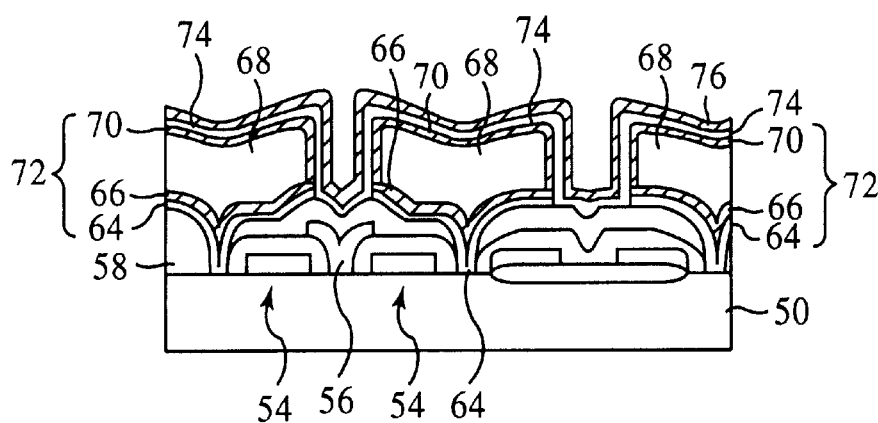

For example, it is possible that after the contact holes are opened on the diffused layer of the memory cell transistors, the capacitor storage electrode 72 directly connected to the memory cell transistors is formed (FIGS. 10A to 10B), and the capacitor dielectric film 74 and the capacitor opposed electrode 76 are formed thereon (FIG. 10C).

In this case as well, the Ti film 64 functions as a diffusion preventive film which prevents silicon atoms in the silicon substrate 50 from diffusing toward the platinum film 66, and capacitance decrease due to this can be prevented.

In the present embodiment the semiconductor device includes the capacitor device according to the third embodiment but may include the capacitor device according to the first or the second embodiment.

The structure of the capacitors included in the DRAM is not limited to the above-described structure. Capacitors of various structures, e.g., FIN structure, etc. may be included.

[A Fifth Embodiment]

The thin film forming method according to a fifth embodiment of the present invention will be explained with reference to FIGS. 11 to 12.

Figure 11:
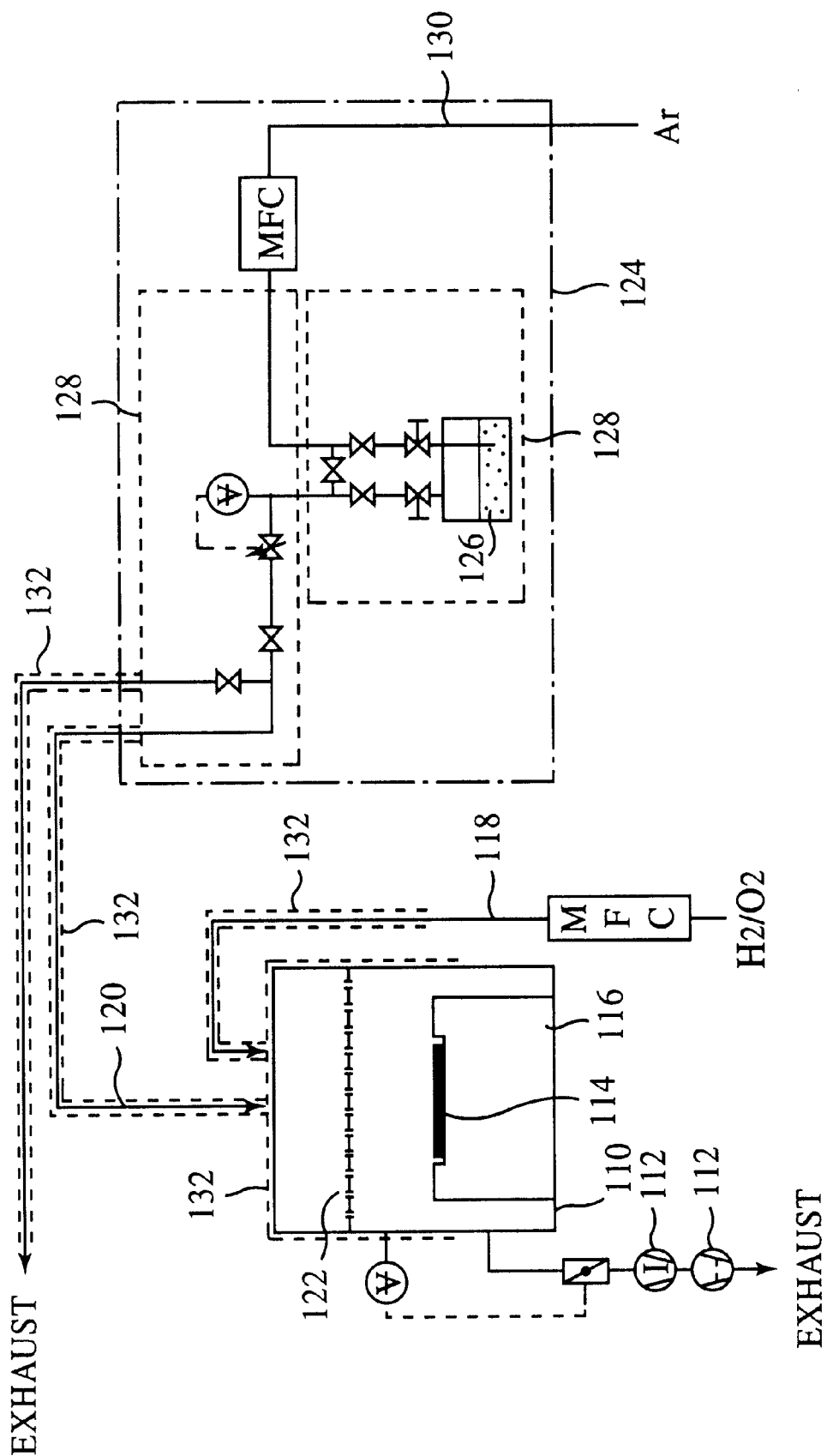
FIG. 11 is a schematic view of the CVD system used in the thin film forming method according to a fifth embodiment of the present invention.
Figure 12:
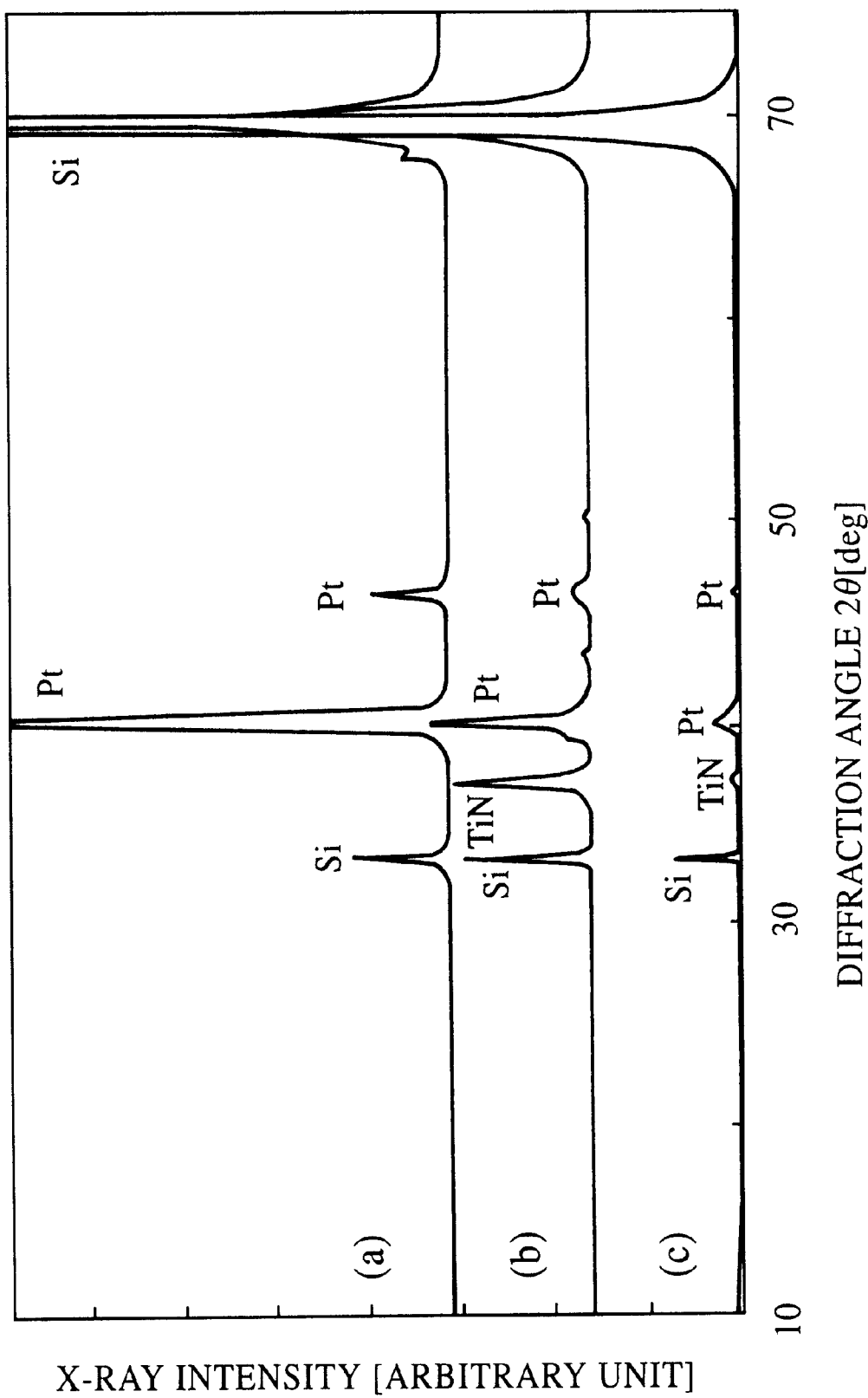
FIG. 12 shows X-ray diffraction spectrums of platinum film formed by the thin film forming method according to the fifth embodiment of the present invention.

FIG. 11 is a schematic view of the CVD system used in the thin film forming method according to the present embodiment. FIG. 12 shows X-ray spectrums of the platinum film formed by the thin film forming method according to the present embodiment.

The CVD system used in the thin film fabrication method according to the present embodiment will be explained with reference to FIG. 11.

A film forming chamber 110 for thin films to be grown in is connected to a vacuum pump 112 to reduce the pressure in the film forming chamber 110. A susceptor 116 for mounting a substrate 114 for thin films to be grown on is disposed in the film forming chamber 110. A heater (not shown) for heating the substrate 114 in growing thin films is provided in the susceptor 116.

The film forming chamber 110 is further connected to a gas feed pipe 118 for feeding $H_2$ gas, and a gas feed pipe 120 for feeding an organic metal source gas. A shower head 122 is provided in the film forming chamber 110 for uniformly distributing the gases fed into the film forming chamber.

The gas feed pipe 120 has its other end connected to gas control means 124 which heats and sublimates an organic metal compound to feed the organic metal compound together with a carrier gas into the film forming chamber 110.

The gas control means 124 includes a source material vessel 126 loaded with a source metal, hexafluoroacetylacetoneplatinum (hereinafter called $Pt(HFA)_2$). $Pt(HFA)_2$ is an orange powder and is sublimated for use, in forming thin films, To this end the source material vessel 126 is disposed in a thermostatic vessel 128 which heats the source material vessel 126 to 150–200° C.

The source material vessel 126 is connected to a gas feed pipe 130 for feeding Ar gas, a carrier gas. Ar gas is fed into the source material vessel 126 through the gas feed pipe 130 to feed sublimated $Pt(HFA)_2$ together with the Ar gas into the film forming chamber 110.

A heater 132 is provided on the film forming chamber 110, the gas feed pipes 118, 120, and the pipe interconnecting the film forming chamber 110 and the source material vessel 126, so that, in forming thin films, they are kept at 150–200° C. which is higher by, e.g., about 5° C. than the sublimation temperature of $Pt(HFA)_2$ for the purpose of reducing condensation of the gases.

Then the thin film forming method according to the present embodiment will be explained with reference to FIG. 11.

After a pressure in the interior of the film forming chamber 110 is reduced by the vacuum pump 112, a substrate 114 for platinum film to be formed on is heated by the heater in the susceptor 116.

Then, a prescribed amount of Ar gas, a carrier gas, is flowed to feed sublimated $Pt(HFA)_2$ gas together with the Ar gas into the film forming chamber. Concurrently therewith $H_2$ gas is fed through the gas feed pipe 118, and the $Pt(HFA)_2$ gas and the $H_2$ gas react with each other on the substrate 114 to form platinum film on the substrate 114.

FIG, 12 shows the results of X-ray diffraction of platinum films formed at a substrate temperature 500° C., a film forming chamber internal pressure of 10 Torr, a 300 sccm flow rate of the carrier gas, and a $H_2$ gas partial pressure of 0.5 Torr. In FIG. 12, (a) indicates the diffraction spectrum of the platinum film formed on a (100) silicon substrate, (b) indicates the diffraction spectrum of the platinum film which was formed on an about 100 nm-thickness titanium nitride film formed on an about 50 nm-thickness titanium film formed on a (100) silicon substrate, and (c) indicates the diffraction spectrum of the case (b) which omitted the feed of $H_2$ gas in forming the platinum film. Growth rates of the cases (a), (b) and (c) were 100 nm/min.

As shown, in all the cases, typical diffraction peaks are observed, which shows that platinum films were grown. The diffraction peak of the platinum film grown without the feed of $H_2$ gas ((c) in FIG. 12), however, is smaller than that of the platinum film grown with the feed of $H_2$ gas ((b) in FIG. 12). That is, it is found that platinum films having good orientation can be grown by feeding $H_2$ gas in their growth.

Thus, a reason why platinum film having good orientation can be formed by the feed of $H_2$ gas is that a carbon concentration in the film can be decreased.

In a case that $Pt(HFA)_2$ is used as a source material for forming platinum film, the source material contains a large amount of carbon, and the grown platinum film contains carbon. Such feed of carbon degrades the orientation of the film, but the added $H_2$ gas reacts with the carbon in the film to thereby react the hydrogen with the carbon in the gas phase or on the surface of the substrate. A carbon concentration in the film can be decreased.

As described above, according to the present embodiment, $Pt(HFA)_2$ is used as a source gas, whereby platinum film can be formed by CVD.

With hydrogen fed in the film forming chamber, platinum film is grown, whereby less carbon mixes in the film, and the platinum film can have good orientation.

It is preferred that a partial pressure of $H_2$ gas to be fed in the film growth is about 50% of the total gas pressure. That is, in a case that a pressure in the film forming chamber is set at 1–20 Torr in a film forming processing, a hydrogen partial pressure is set at 0.5–10 Torr, whereby platinum films of good quality can be formed.

In the present embodiment, a substrate temperature for forming platinum film is 500° C. but is preferably 300–600° C.

[A Sixth Embodiment]

The semiconductor device according to a sixth embodiment of the present invention and a method for fabricating the same will be explained with reference to FIGS. 13 and 14A–14D.

Figure 13:
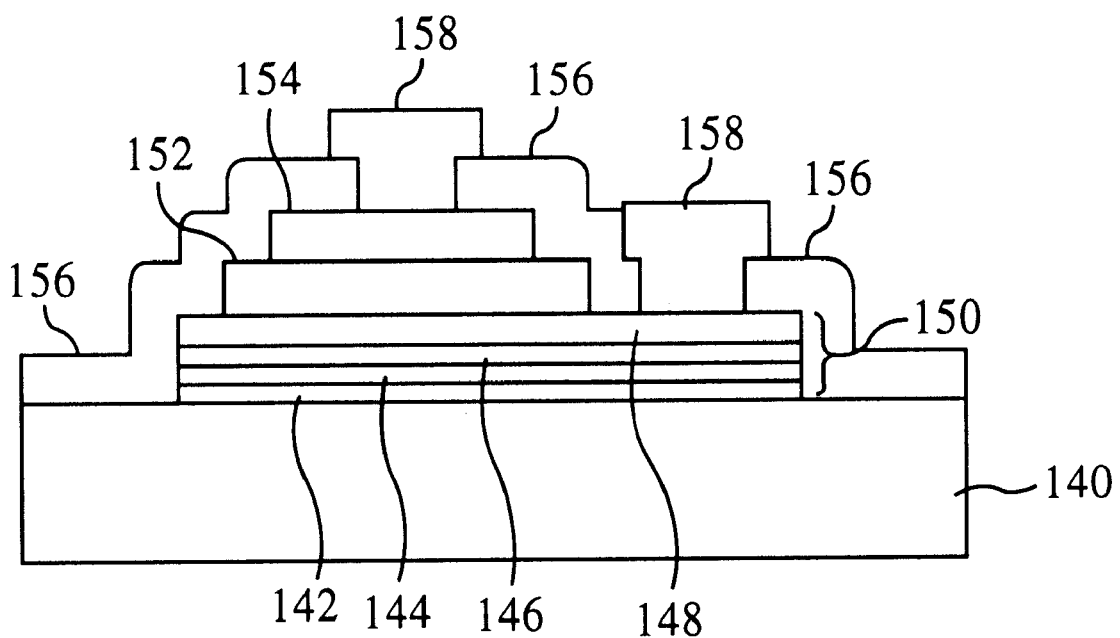
FIG. 13 is a view of the semiconductor device according to a sixth embodiment of the present invention, which explains a structure thereof.

FIG. 13 is a view of the semiconductor device according to the present embodiment, which shows a structure thereof. FIGS. 14A–14D show views of the semiconductor device at the steps of the method for fabricating the same, which shows the method.

In the present embodiment, as an example of applying the platinum film formed by the thin film forming method according to the fifth embodiment to a semiconductor device, a structure of a thin film capacitor including the platinum film as the upper electrode, and a method for fabricating the semiconductor device will be explained.

First, a structure of the semiconductor device according to the present embodiment will be explained with reference to FIG. 13.

On a silicon substrate 140 there is formed a lower electrode 150 comprising a titanium film 142, a titanium nitride film 144, ruthenium film 146 and ruthenium oxide film 148 formed one on another in the stated order. A capacitor dielectric film 152 of $SrTiO_3$ is formed on the lower electrode 150. An upper electrode 154 of platinum film is formed on the capacitor dielectric film 152. An insulation film 156 is formed on the thus-fabricated capacitor, and a wiring layer 158 connecting to the upper and the lower electrodes 154, 150 is formed in through-holes formed in the insulation layer 156.

Then, the method for fabricating the semiconductor device according to the present embodiment will be explained with reference to FIGS. 14A–14D.

First, the titanium film 142 is deposited in an about 20 nm thickness on a silicon substrate 140, e.g., at a substrate temperature of 350° C., a 40 sccm-Ar flow rate, a $5 \times 10^{-3}$ Torr pressure and a 500 W power.

Then, the titanium nitride film 144 is deposited in an about 300 nm thickness on the titanium film 142 by sputtering, e.g., at a substrate temperature of 350° C., a 40 sccm Ar flow rate, a 30 sccm $N_2$ flow rate, a $5 \times 10^{-3}$ Torr pressure and a 500 W power.

Subsequently the ruthenium film 146 is deposited on the titanium nitride film 144 in an about 50 nm-thickness by sputtering, e.g., at a substrate temperature of 500° C., a 40 sccm Ar flow rate, a $5 \times 10^{-3}$ Torr pressure and a 500 W power.

Then, the ruthenium oxide film 148 is deposited in an about 100 nm thickness on the ruthenium film 146 by sputtering, e.g., at a substrate temperature of 500° C., a 40 sccm Ar flow rate, a 30 sccm $O_2$ flow rate, a $5 \times 10^{-3}$ Torr pressure and a 500 W power.

Figure 14A:
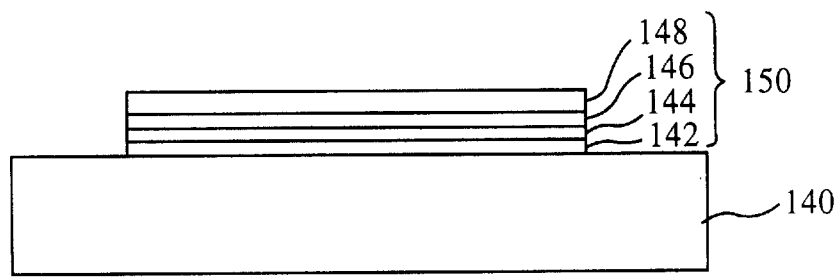
FIGS. 14A–14D are sectional views of the semiconductor device according to the sixth embodiment of the present invention, which explain the method.

The multi-layer film of the ruthenium oxide film 148, the ruthenium film 146, the titanium nitride film 144, and the titanium film 142 is patterned by the usual lithography and ion milling to form the lower electrode 150 (FIG. 14A).

Then, the $SrTiO_3$ film is deposited on the lower electrode 150 by CVD to form the capacitor dielectric film 152, e.g., at a substrate temperature of 450° C., a 1 slm $O_2$ flow rate, and a 5 Torr pressure.

Figure 14B:
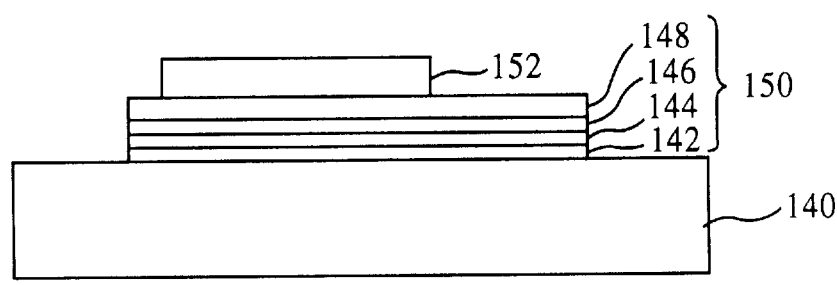

Next, the capacitor dielectric film 152 is patterned by ion milling (FIG. 14B).

Next, the platinum film is deposited on the capacitor dielectric film 152 by CVD. The platinum film is deposited by, e.g., the thin film forming method according to the fifth embodiment, e.g., by the use of $Pt(HFA)_2$ as the platinum source, and at a substrate temperature of 500° C., a 10 Torr film forming chamber internal pressure, a 300 sccm carrier gas flow rate, and a 0.5 Torr $H_2$ gas partial pressure.

Figure 14C:
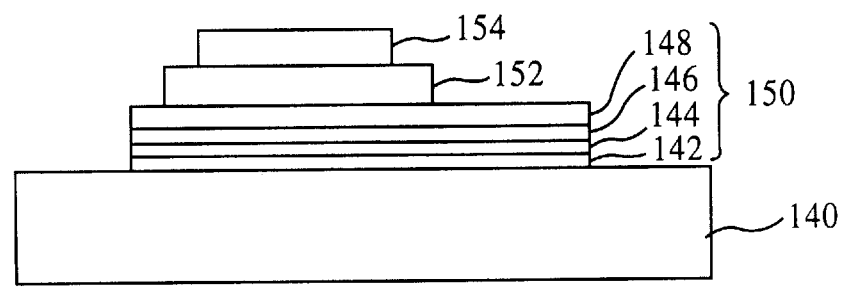

Subsequently the platinum film is etched by ion milling to form the upper electrode 154 (FIG. 14C).

Then, the insulation film 156 is deposited by CVD on the thus-fabricated capacitor.

Figure 14D:
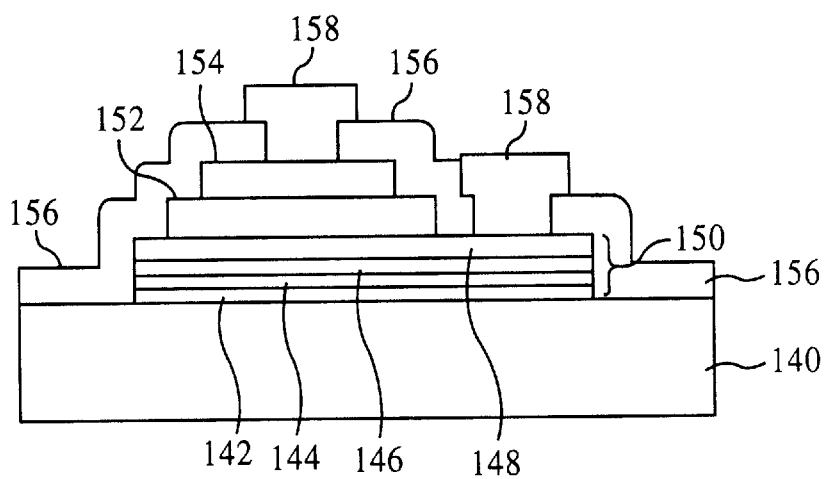

Then, the though-holes are opener in the insulating film 154 to lead wiring from the lower electrode 150 and the upper electrode 154. Al to be the wiring layer is deposited by sputtering and patterned to form the wiring layer 158 (FIG. 14D).

Leak characteristics of the thus-fabricated capacitor were evaluated, When a 5 V bias was applied between the upper and the lower electrodes 154, 150 of the capacitor, a leak current density was $1 \times 10^{-8}$ A·cm$^{-2}$. A specific dielectric constant of the capacitor dielectric film 150 was 200. The capacitor had a high dielectric constant and good leak characteristics.

As described above, in the present embodiment, the capacitor electrodes are formed of platinum film formed by CVD by the use of $Pt(HFA)_2$ as a source material, whereby a capacitor including the dielectric film of a high dielectric material, such as $SrTiO_3$ or others can be formed.

In the present embodiment, the multi-layer film of ruthenium oxide film/ruthenium film/titanium nitride film/ titanium film is used as the lower electrode 150, platinum film is used as the upper electrode 154, and $SrTiO_3$ film is used as the capacitor dielectric film 152, but this is not essential.

For example, the lower electrode 150 may comprise platinum film deposited on one of titanium film, titanium nitride film, ruthenium film, ruthenium oxide film iridium film and iridium oxide film, or a multi-layer film of two or more of them. Specifically the multi-layer film of titanium nitride film/titanium film, ruthenium oxide film/ruthenium film, iridium oxide film/iridium film, ruthenium oxide film/ ruthenium film/titanium nitride film/titanium film, etc. is preferred.

The dielectric film 150 may comprise $(Ba,Sr)TiO_3$ film, $Pb(Zr,Ti)O_3$ film, or others in place of $SrTiO_3$ film.

The upper electrode 154 may have the same structure as the lower electrode 150. In this case, when the upper electrode 154 comprises a multi-layer film, the deposition sequence of the layers of the multi-layer film is reversed, for example, to that of the lower electrode 150.

[A Seventh Embodiment]

The thin film forming method according to a seventh embodiment of the present invention will be explained with reference to FIGS. 15 to 17.

Figure 15:
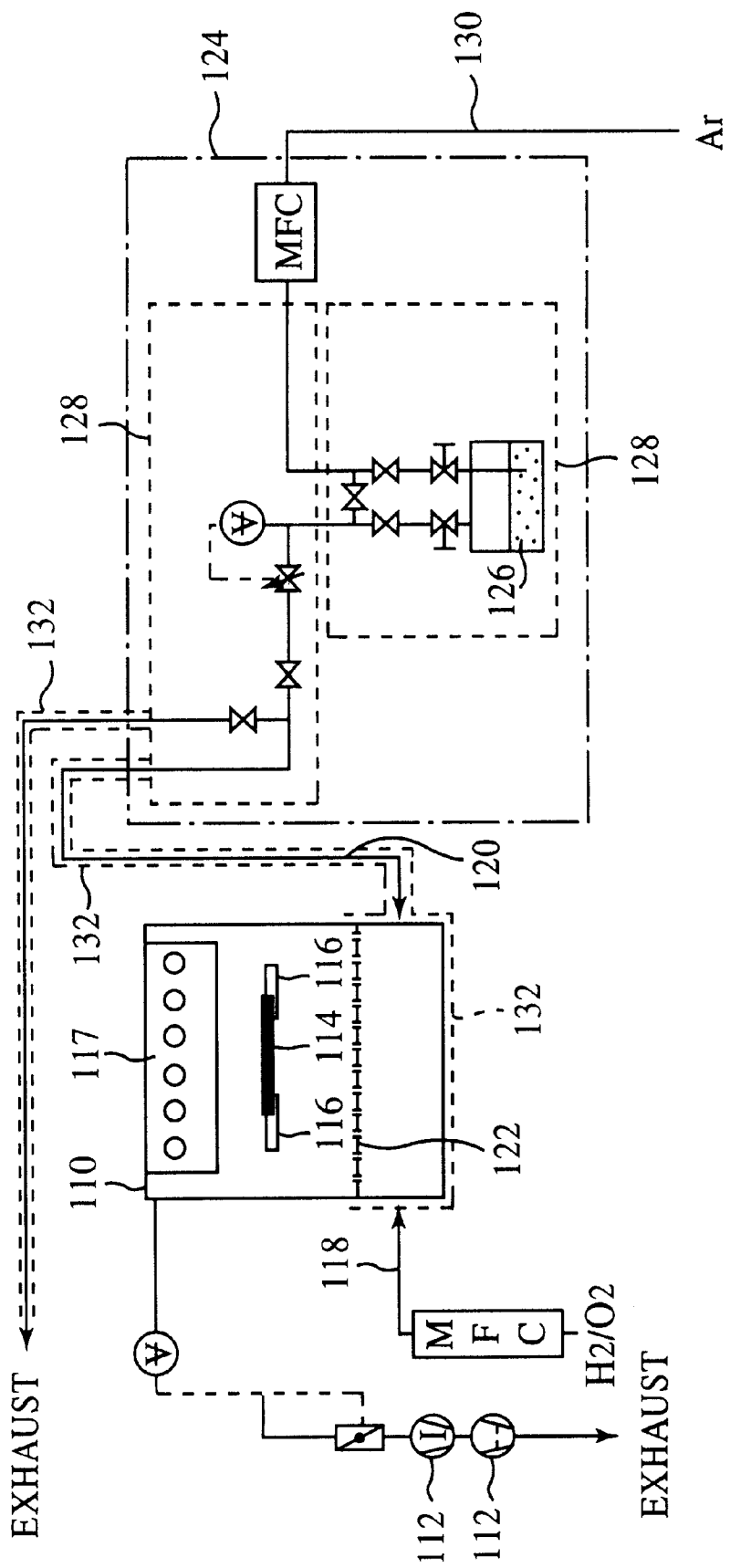
FIGS. 15 is a schematic view of the CVD system used in the thin film forming method according to a seventh embodiment of the present invention.

FIG. 15 shows a schematic view of the CVD system used in the thin film forming method according to the present embodiment. FIG. 16 is a graph of transient changes of a thickness of ruthenium film formed by the thin film forming method according to the present embodiment. FIG. 17 shows X-ray diffraction spectrums of the ruthenium film and ruthenium oxide film formed by the thin film forming method according to the present embodiment.

The thin film forming method according to the present embodiment is characterized in that $Ru(DMHPD)_3$ is used as ruthenium source material, and liquidized $Ru(DMHFD)_3$ is bubbled by an inert gas to be fed into the film forming chamber.

First, the CVD system used in the thin film forming method according to the present embodiment will be explained with reference to FIG. 15.

A film forming chamber 110 for thin films to be grown in is connected to a vacuum pump 112 to reduce the pressure in the film forming chamber 110. A susceptor 116 for mounting a substrate 114 for thin films to be grown on is disposed in the film forming chamber 110. A lamp heater 117 for heating the substrate 114 in growing thin films is provided in the susceptor 116.

The film forming chamber 110 is further connected to a gas feed pipe 118 for feeding $H_2$ (hydrogen) gas and $O_2$ (oxygen) gas, and a gas feed pipe 120 for feeding an organic metal source gas. A shower head 122 is provided in the film forming chamber 110 for distributing the gases fed into the film forming chamber 110 uniformly in the film forming chamber 110.

The gas feed pipe 120 has its other end connected to gas control means 124 which feeds an organic metal compound to feed the organic metal compound with a carrier gas into the film forming chamber 110.

The gas control means 124 includes a source material vessel 126 for low vapor pressure use which is loaded with 2,6-dimethyl 3,5-heptanedione Ruthenium (hereinafter abbreviated as $Ru(DMHPD)_3$). $Ru(DMHPD)_3$ is a solid powder at room temperature and must be sublimated for the use in forming thin films. To this end the source material vessel 126 is disposed in a thermostatic vessel 128 which heats the source material vessel 126 up to a temperature above its melting point.

The source material vessel 126 is connected to a gas feed pipe 130 for feeding Ar gas, a carrier gas. Ar gas is fed into the source material vessel 126 through the gas feed pipe 130 to feed sublimated $Ru(DMHPD)_3$ together the Ar gas into the film forming chamber 110. The source material sublimated in the source material vessel 126 has a low vapor pressure such as to be fed into the film forming chamber 110 by bubbling of the Ar gas.

A heater 132 is provided on the film forming chamber 110, the gas feed pipes 118, 120, and the pipe interconnecting the film forming chamber 110 and the source material vessel 126, so that, in forming thin films, they are kept at a temperature higher by, e.g., about 10° C. than the melting point of $Ru(DMHPD)_3$ for the purpose of reducing condensation of the gases.

Then the thin film forming method according to the present embodiment will be explained with reference to FIG. 15.

After the pressure in the interior of the film forming chamber 110 is reduced by the vacuum pump 112, a substrate 114 for platinum film to be formed on is heated by the lamp heater 117 in the susceptor 116.

Then, a prescribed amount of Ar gas, a carrier gas, is flowed to feed $Ru(DMHPD)_3$ together with the Ar gas into the film forming chamber 10.

$Ru(DMHPD)_3$ is liquidized by heating the source material vessel 126 and then sublimated. The sublimated $Ru(DMHPD)_3$ has a too low vapor pressure to be fed as it is into the film forming chamber 110. Then, a carrier gas, e.g., Ar gas, is fed into the source material vessel 126 and bubbled to be fed into the film forming chamber 110 together with Ar gas.

Concurrently with the feed of $Ru(DMHPD)_3$, $H_2$ gas a fed into the film forming chamber 110 through the gas feed pipe 118 to react the $Ru(DMHPD)_3$ with the $H_2$ gas on the substrate 114 to deposit ruthenium film on the substrate 114. Thus ruthenium film is deposited on the substrate 114.

In depositing ruthenium oxide film on the substrate 114, in place of $H_2$ gas, $O_2$ gas can be fed into the film forming chamber 110. $O_2$ gas is fed through the gas feed pipe 118 concurrently with the feed of $Ru(DMHPD)_3$, whereby decomposition of $Ru(DMHPD)_3$ and oxidation reaction by the $O_2$ gas take place at the same time, and the ruthenium oxide film is deposited on the substrate 114.

As described above, in the thin film forming method according to the present embodiment, $Ru(DMHPD)_3$ is used as a ruthenium source material. Liquidized $Ru(DMHPD)_3$ is bubbled by an inert gas to feed the ruthenium source material into the film forming chamber to deposit the ruthenium film or ruthenium oxide film.

In the present embodiment, $Ru(DMHPD)_3$ is liquidized. This is because liquidized $Ru(DMHPD)_3$ contacts Ar gas at a substantially constant contact area in the bubbling, and a flow rate of $Ru(DMHPD)_3$ can be maintained constant.

By using liquidized ruthenium source material, the ruthenium source material can be stably fed into the film forming chamber 110, but the conventionally used $Ru(DPM)_3$ cannot be liquidized.

This is because in liquidizing $Ru(DPM)_3$ at a temperature above the melting point of $Ru(DPM)_3$, 165–170, $Ru(DPM)_3$ is decomposed to be unusable as a ruthenium source material.

Figure 16:
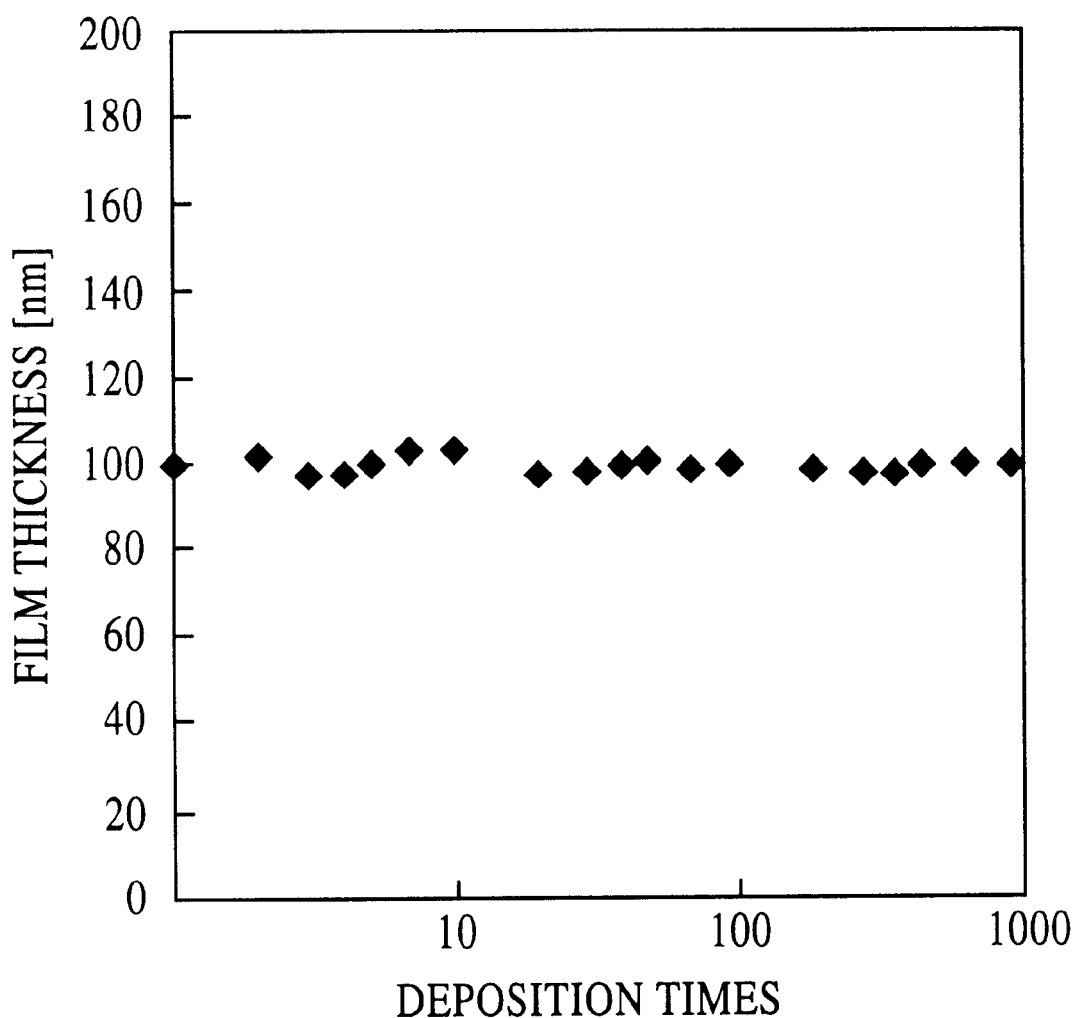
FIG. 16 is a graph of transient changes of a film thickness of ruthenium oxide film deposited by the thin film forming method according to the seventh embodiment of the present invention.

FIG. 16 shows transient changes of the thickness of ruthenium oxide film deposited by the thin film forming method according to the present embodiment.

The deposition was conducted at a substrate temperature of 500° C., a 5 Torr internal pressure of the film forming chamber 110, a 300 sccm carrier gas flow rate and a 100 sccm $O_2$ gas flow rate, and for 30 minutes of one deposition. A 15 g total amount of $Ru(DMHPD)_3$ was loaded in the source material vessel 126, and in this state the deposition was continuously conducted.

As shown in FIG. 16, it is found that the ruthenium oxide film was deposited by 1000 times without replacing the loaded $Ru(DMHPD)_3$ in the source material vessel 126, but stably the film thickness was substantially 100 nm.

The same measurement was made in a case that $Ru(DPM)_3$ was used as a ruthenium source material. The film thickness decreased to about a half after 100 times of the deposition.

As described above, the deposition by the use of $Ru(DMHPD)_3$ can reduce changes of a thickness of a deposited film more than by the use of $Ru(DPM)_3$.

Figure 17:
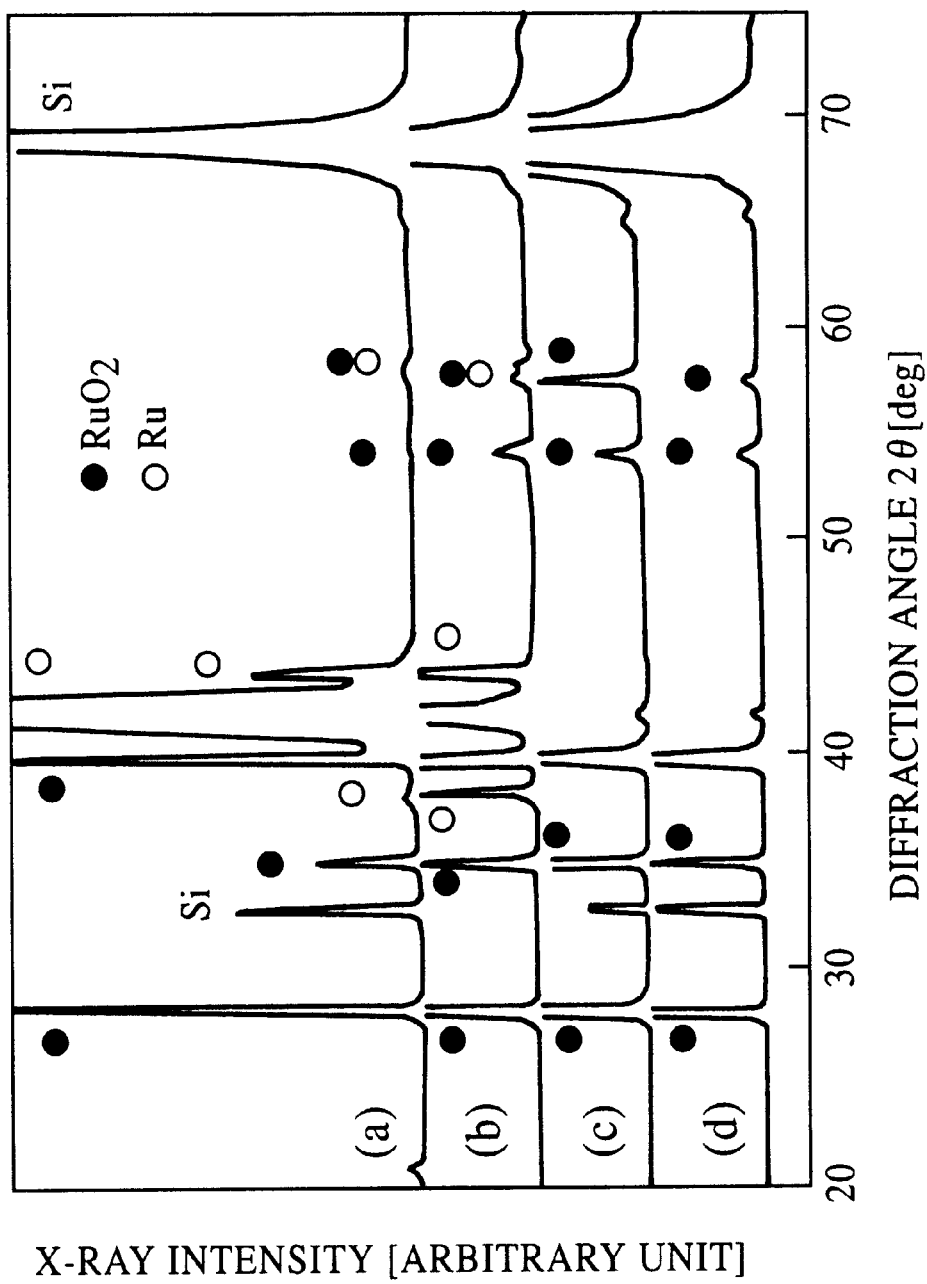
FIG. 17 shows X-ray diffraction spectrums of ruthenium film and ruthenium oxide film formed by the thin film forming method according to the seventh embodiment of the present invention.

FIG. 17 is a graph of the results of X-ray diffraction of ruthenium film and ruthenium oxide film formed by the thin film forming method according to the present embodiment.

In FIG. 17, (b) indicates the diffraction spectrum of ruthenium oxide film deposited on ruthenium film deposited on a silicon substrate, and (d) indicates the diffraction spectrum of ruthenium oxide film deposited on a silicon substrate.

In FIG. 17, for comparison, diffraction spectrums of ruthenium film and ruthenium oxide film by the conventional thin film forming method using $Ru(DPM)_3$ are shown. (a) indicates the diffraction spectrum of ruthenium oxide film deposited on ruthenium film deposited on a silicon substrate, and (c) indicates the diffraction spectrum of ruthenium oxide film deposited on a silicon substrate.

As shown, it is found that by the use of $Ru(DMHPD)_3$ as a ruthenium source material, ruthenium film and ruthenium oxide film having good orientation and good quality can be formed.

The diffraction spectrums of the case using $Ru(DMHPD)_3$ as a ruthenium source material substantially agree with those of the case using $Ru(DPM)_3$ as a ruthenium source material. It is found that by the use of $Ru(DMHPD)_3$, ruthenium film and ruthenium oxide film having quality equal to that of those deposited by the use of $Ru(DPM)_3$ are formed.

Thus, according to the present embodiment, $Ru(DMHPD)_3$ is used as a ruthenium source material, and liquidized $Ru(DMHPD)_3$ is sublimated to be fed together with a carrier gas into the film forming chamber, whereby ruthenium source material can be stably fed.

Furthermore, owing to this, disuniformity in film thickness and sheet resistance of ruthenium and ruthenium oxide films can be much decreased among the wafers with the ruthenium films and ruthenium oxide films deposited thereon and among batches.

In the thin film forming method according to the present embodiment, it is preferable that the temperature for liquidizing $Ru(DMHPD)_3$ is set at 90–120° C., which is near the melting point of $Ru(DMHPD)_3$. Such a range of the melting point is because the melting point depends on concentrations of impurities contained in $Ru(DMHPD)_3$ as a source material. It is preferable to suitably set, in the deposition, a heating temperature in accordance with a purity of the source material, etc.

The hydrogen fed into the film forming chamber 110 is effective to make an atmosphere in the film forming chamber a reducing atmosphere and, at the same time, to remove carbon in a film being deposited.

Because $Ru(DMHPD)_3$ as a ruthenium source material contains a lot of carbon, the carbon mixes in the ruthenium films being deposited, but by feeding $H_2$ gas into the film forming chamber 110, the fed hydrogen reacts with the carbon in the ruthenium film being deposited to generate hydrocarbon, and sublimates. Concentrations of carbon mixed into the ruthenium films being deposited can be much decreased.

Because carbon mixed in ruthenium films degrades orientation of the ruthenium films, the feed of $H_2$ gas is effective to form ruthenium films of good quality.

In the present embodiment, a substrate temperature for depositing ruthenium film or ruthenium oxide film was 500° C., but it is preferable to set a substrate temperature at 300–600° C.

It is preferable to set an internal pressure of the film forming chamber at 1–10 Torr for the deposition of ruthenium film or ruthenium oxide film.

[An Eighth Embodiment]

The semiconductor device according to an eighth embodiment of the present invention, and the method for fabricating the same will be explained with reference to FIGS. 18 and 19A–19D.

Figure 18:
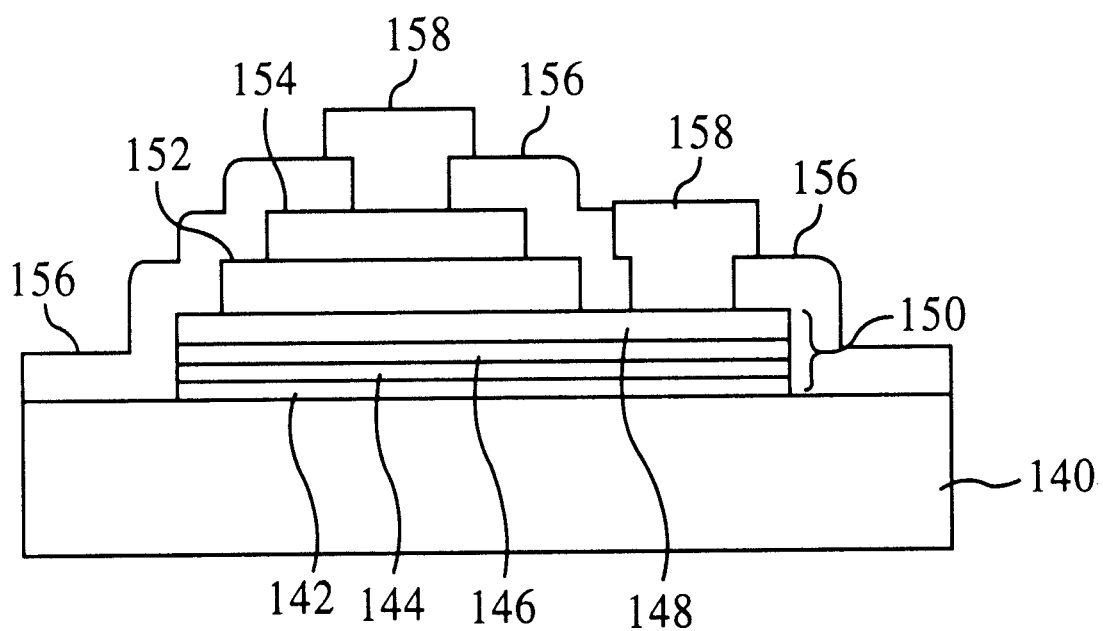
FIG. 18 is a view of the semiconductor device according to an eighth embodiment of the present invention, which explains a structure thereof.

FIG. 18 is a schematic sectional view of the semiconductor device according to the present embodiment, which shows a structure thereof. FIGS. 19A–19D show sectional views of the semiconductor device according to the present embodiment at the steps of the method for fabricating the same, which show the method.

The present embodiment explains a structure of a thin film capacitor including, as the lower electrode, the ruthenium film and ruthenium oxide film formed by the thin film forming method according to the seventh embodiment, and the method for fabricating the thin film capacitor as an example of applications of the ruthenium film and ruthenium oxide film.

First, a structure of the semiconductor device according to the present embodiment will be explained with reference to FIG. 18.

On a silicon substrate there is formed a lower electrode 150 comprising a titanium film 142, a titanium nitride film 144, a ruthenium film 146 and a ruthenium oxide film 148 which are formed one on another. A capacitor dielectric film 152 of $SrTiO_3$ is formed on the lower electrode 150. An upper electrode 154 of platinum film is formed on the capacitor dielectric film 152. An insulating film is formed on the thus-fabricated capacitor, and a wiring layer 158 is formed in through-holes formed in the insulating film 156 and connected to the upper electrode 154 and the lower electrode 150.

Then, the method for fabricating the semiconductor device according to the present embodiment will be explained with reference to FIGS. 19A–19D.

First, the titanium film 142 is deposited on a silicon substrate 140 in an about 200 nm-thickness by sputtering, e.g., at a 350° C. substrate temperature, a 40 sccm Ar flow rate, a $5\times10^{-3}$ Torr pressure and a 500 W power.

Then, the titanium nitride film 144 is deposited in an about 300 nm thickness on the titanium film 142 by sputtering, e.g., at a substrate temperature of 350° C., a 40 sccm Ar flow rate, a 30 sccm $N_2$ flow rate, a $5\times10^{-3}$ Torr pressure and a 500 W power.

Then, the ruthenium film 146 is deposited on the titanium nitride film 144 in an about 50 nm thickness by CVD. The ruthenium film is deposited by, e.g., the thin film forming method according to the seventh embodiment. The deposition is conducted by the use of $Ru(DMHPD)_3$ as a ruthenium source material, and, e.g., at a 500° C. substrate temperature, a 10 Torr internal pressure of the film forming chamber 110, a 300 sccm carrier gas flow rate and a 100 sccm $H_2$ gas flow rate, and at a thermostatic vessel 128 temperature and a heater 132 temperature of respectively 90° C. and 100° C. (FIG. 15).

Then, the ruthenium oxide film 148 of an about 100 nm thickness is deposited on the ruthenium film 146 by CVD. The ruthenium oxide film is deposited by the thin film forming method according to, e.g., the seventh embodiment. The deposition is conducted by the use of $Ru(DMHPD)_3$ as a source material, and e.g., at a 500° C. substrate temperature, a 10 Torr internal pressure of the film forming chamber 110, a carrier gas flow rate of 300 sccm and an $O_2$ gas flow rate of 300 sccm, and at a thermostatic vessel 128 temperature and a heater 132 temperature of respectively 90° C. and 100° C. (FIG. 15).

Figure 19A:
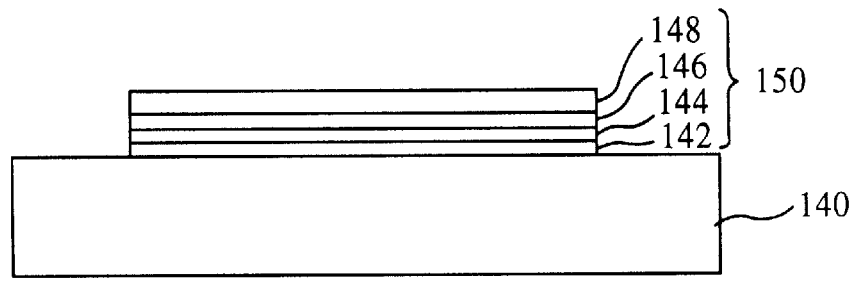
FIGS. 19A–19D are sectional views of the semiconductor device according to the eighth embodiment of the present invention, which explain the method.

Next, the multi-layer film of the ruthenium oxide film 148, the ruthenium film 146, the titanium nitride film 144, the titanium film 142 is patterned by the usual lithography and ion milling to form the lower electrode 150 (FIG. 19A).

Subsequently $SrTiO_3$ film is deposited on the lower electrode 150 by CVD to form the capacitor dielectric film 152, e.g., at a 450° C. substrate temperature, a 1 slm $O_2$ flow rate and a 5 Torr pressure.

Figure 19B:
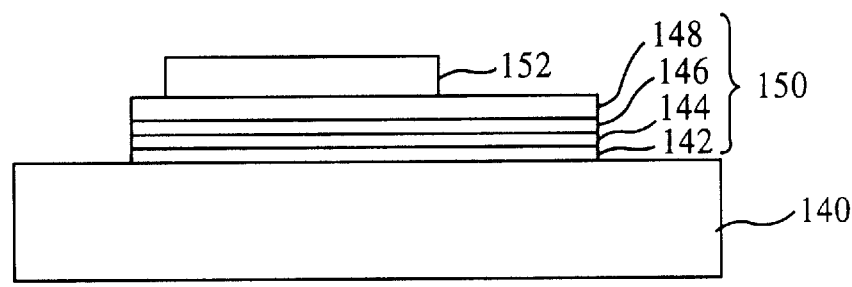

Then, the capacitor dielectric film 152 is patterned by etching of ion milling (FIG. 19B).

Next, a platinum film is deposited on the capacitor dielectric film 152 by CVD. The platinum film is formed by the use of $Pt(HFA)_2$ as a platinum source, and, e.g., at a 500° C. substrate temperature, a 10 Torr internal pressure of the film forming chamber, a 300 sccm carrier gas flow rate and a 0.5 Torr partial pressure of $H_2$ gas.

Figure 19C:
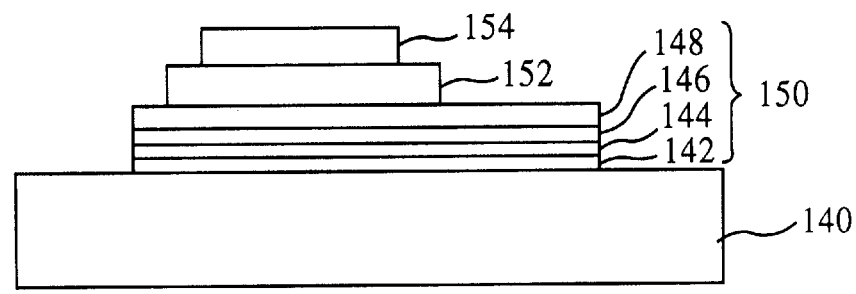
Figure 19D:
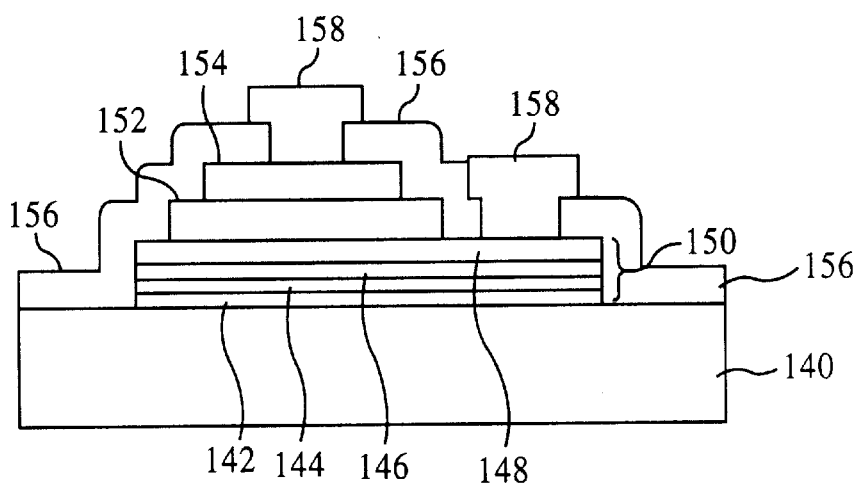

Subsequently the platinum film is etched by ion milling to form the upper electrode 154 (FIG. 19C).

Then the insulating film 156 is deposited by CVD on the thus-fabricated capacitor.

Next, the through-holes are formed in the insulating film 154 for leading wiring from the lower electrode 150 and the upper electrode 154, Al is sputtered to form an aluminum layer which is to be the wiring layer, and the aluminum layer is patterned to form the wiring layer 158. (FIG, 19D).

By forming the ruthenium film and the ruthenium oxide film by the use of $Ru(DMHPD)_3$ as a source material, the lower electrode can be formed with high reproducibility in terms of film thickness and film quality, The thin film capacitor including the ruthenium film and ruthenium oxide film can have high reliability.

As described above, according to the present embodiment, the lower electrode, and the ruthenium film and the ruthenium oxide film are deposited by CVD using $Ru(DMHPD)_3$ as a source material, whereby electrodes of the capacitor using a high dielectric material, such as $SrTiO_3$ or others can be formed with good control.

In the present embodiment, the lower electrode 150 has the multi-layer structure of ruthenium oxide film/ruthenium film/titanium nitride film/titanium film, the upper electrode 154 comprises a platinum film, and the capacitor dielectric film 152 comprises $SrTiO_3$ film, but this is not essential.

For example, the lower electrode may have the multi-layer structure of platinum film/ruthenium oxide film/ruthenium film/titanium nitride film/titanium film, or the multi-layer structure of platinum film/ruthenium film/titanium nitride film/titanium film.

The capacitor dielectric film 152 may be $(Ba,Sr)TiO_3$, $Pb(Zr,Ti)O_3$ film, or others in place of $SrTiO_3$ film.

The upper electrode 154 may have the same structure as the lower electrode 150. In a case that the upper electrode 154 comprises a multi-layer film, the multi-layers are laid one on another in a sequence reverse to that of the multilayers of the lower electrode 150.

In the present embodiment, ruthenium film and ruthenium oxide film are applied to a thin film capacitor, but the capacitor structure according to the eighth embodiment may be applied to DRAMs and FeRAMs (Ferro-electrostatic Random Access Memory), etc.

[A Ninth Embodiment]

The thin film forming method according to a ninth embodiment of the present invention will be explained with reference to FIGS. 20 to 23.

Figure 21:
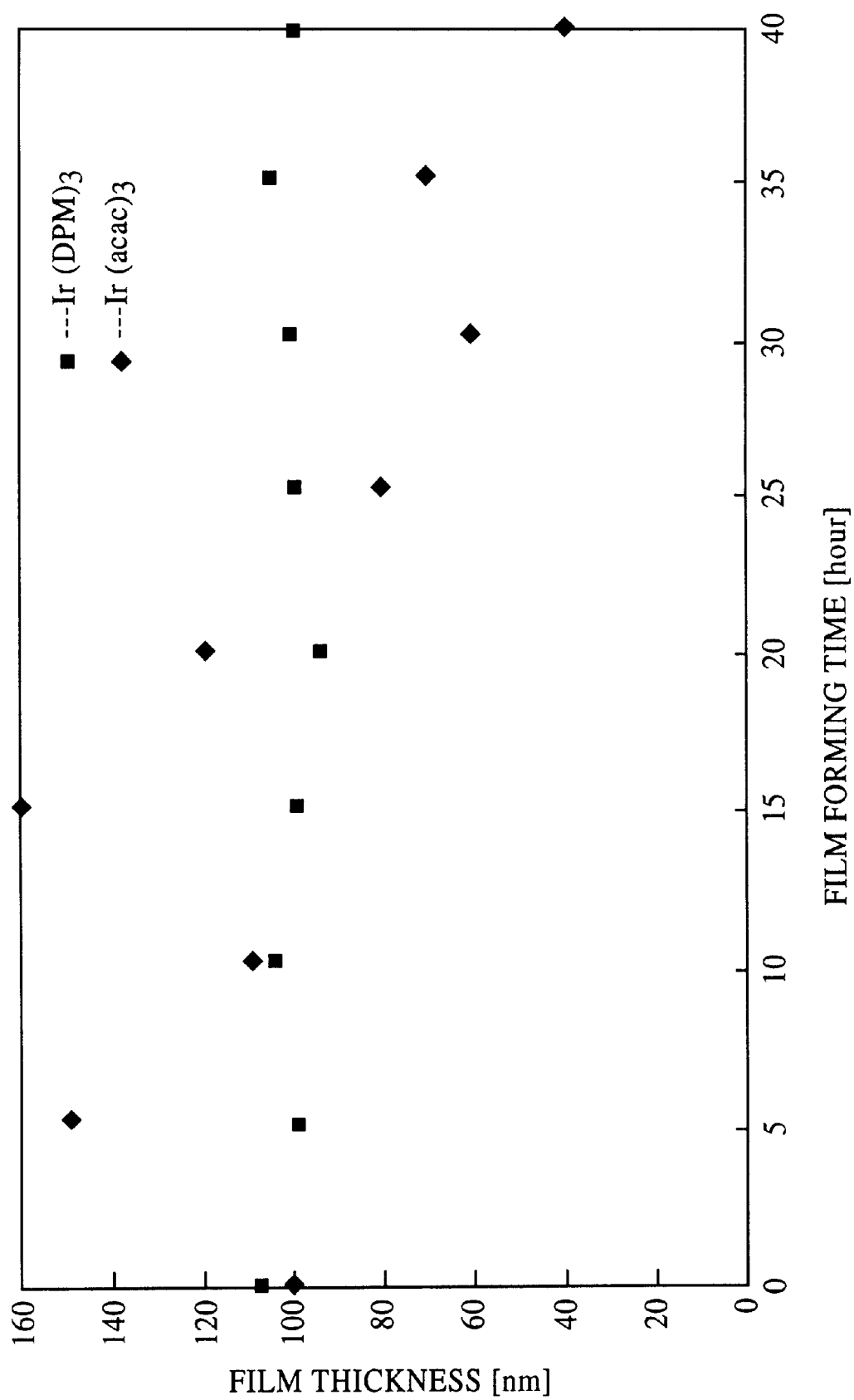
FIG. 21 is a graph of film thickness changes of iridium film with respect to film forming time.
Figure 22:
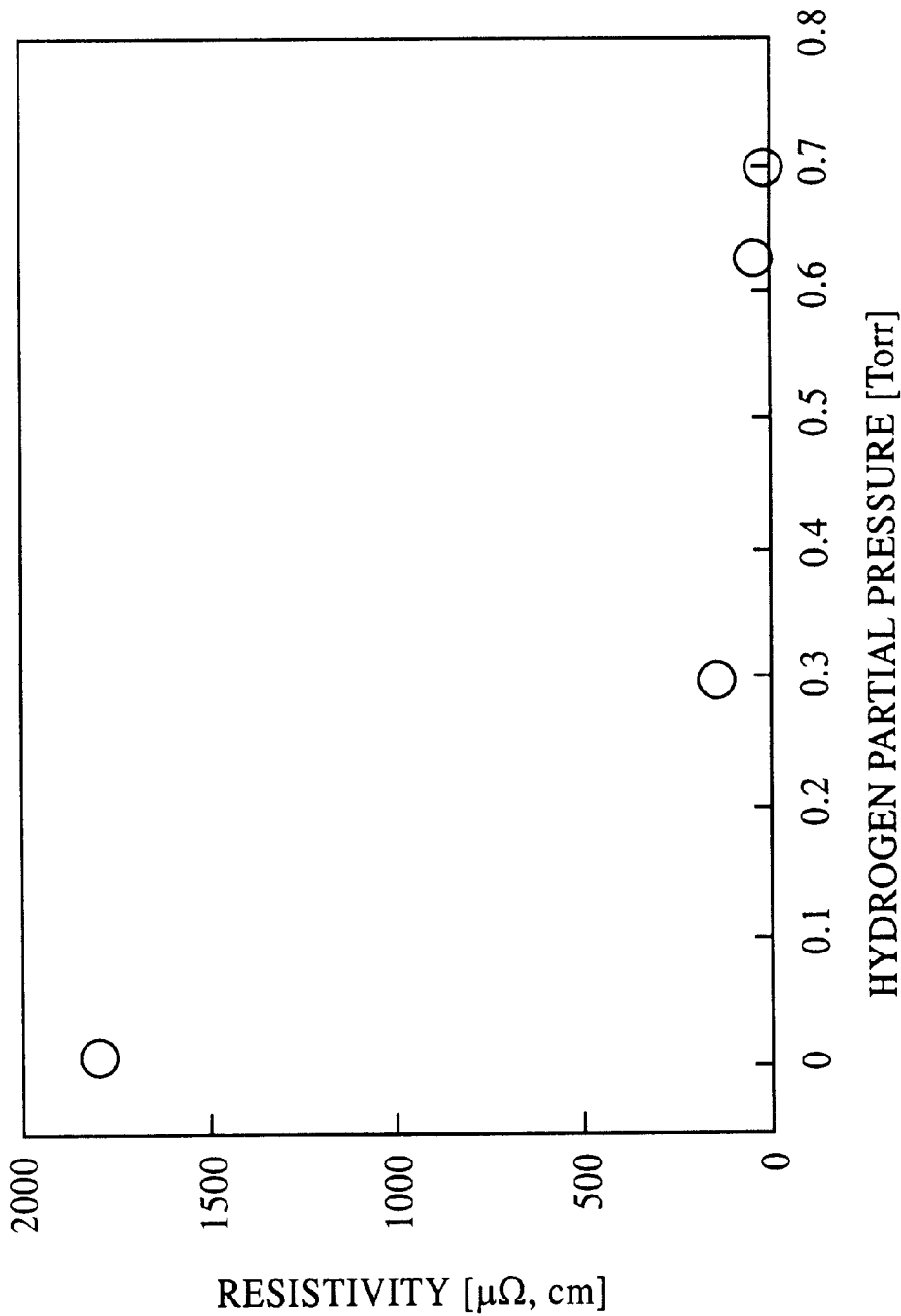
FIG. 22 is a graph of relationships between hydrogen partial pressures and resistivities of iridium film.
Figure 23:
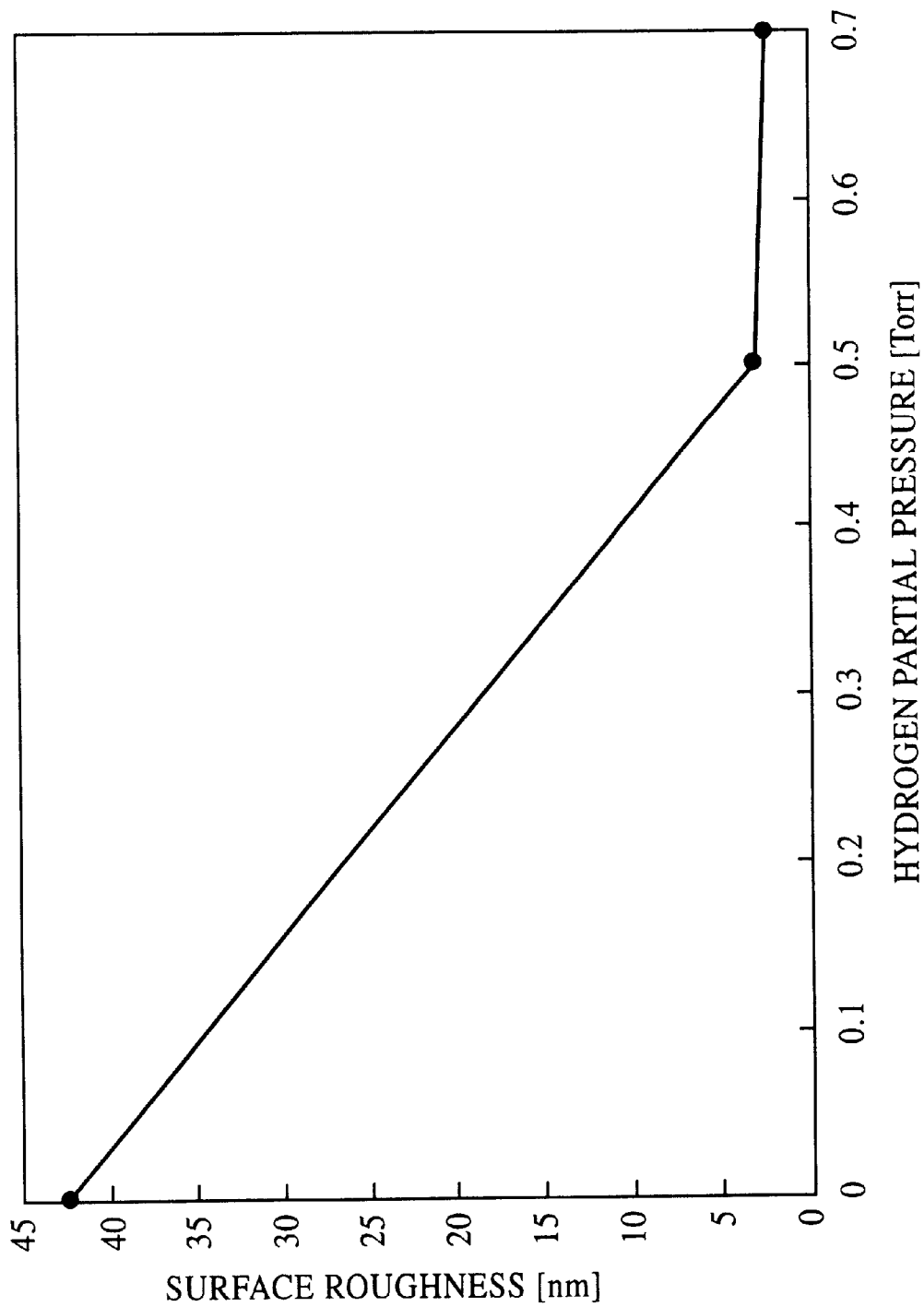
FIG. 23 is a graph of relationships between hydrogen partial pressures and surface roughness of iridium film.

FIG. 20 shows X-ray diffraction spectrums of iridium film and iridium oxide film formed by the thin film forming method according to the present embodiment. FIG. 21 is a graph of thickness changes of the iridium film with respect to a film forming time. FIG. 22 is a graph of relationships between hydrogen partial pressures and resistivities of the iridium film. FIG. 23 is a graph of relationships of hydrogen partial pressures and surface roughness of the iridium film.

The thin film forming method according to the present embodiment will be explained with reference to the CVD system (FIG. 11) used in the thin film forming method according to the fifth embodiment.

A film forming chamber 110 for thin films to be grown in is connected to a vacuum pump 112 to reduce the pressure in the film forming chamber 110. A susceptor 116 for mounting a substrate 114 for thin films to be grown on is disposed in the film forming chamber 110. A heater (not shown) for heating the substrate 114 in growing thin films is provided in the susceptor 116.

The film forming chamber 110 is further connected to a gas feed pipe 118 for feeding H₂ gas or O₂ (oxygen) gas, and a gas feed pipe 120 for feeding an organic metal source gas. A shower head 122 is provided in the film forming chamber 110 for uniformly distributing the gases fed into the film forming chamber 110.

The gas feed pipe 120 has its other end connected to gas control means 124 which heats and sublimates an organic metal compound to feed the organic metal compound together with a carrier gas into the film forming chamber 110.

The gas control means 124 includes a source material vessel 126 loaded with a source metal, iridium dipivaloylmethane (hereinafter abbreviated as Ir(DPM)₃ ) expressed by the following general formula

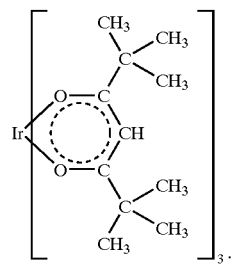

Ir(DPM)₃ is an orange powder and is sublimated for the use in forming thin films. To this end the source material vessel 126 is disposed in a thermostatic vessel 128 which heats the source material vessel 126 to 150–200° C.

The source material vessel 126 is connected to a gas feed pipe 130 for feeding Ar gas, a carrier gas. Ar gas is fed into the source material vessel 126 through the gas feed pipe 130 to feed sublimated Ir(DPM)₃ together with the Ar gas into the film forming chamber 110.

A heater 132 is provided on the film forming chamber 110, the gas feed pipes 118, 120, and the pipe interconnecting the film forming chamber 110 and the source material vessel 126, so that, in forming thin films, they are kept at 150–210° C. which is higher by, e.g., about 5° C. than the sublimation temperature of Ir(DPM)₃ for the purpose of reducing condensation of the gases.

Then the thin film forming method according to the present embodiment will be explained with reference to FIG. 11.

After a pressure in the interior of the film forming chamber 110 is reduced by the vacuum pump 112, a substrate 114 for iridium film to be formed on is heated by the heater in the susceptor 116.

Then, a prescribed amount of Ar gas, a carrier gas, is flowed to feed sublimated Ir(DPM)₃ gas together with the Ar gas into the film forming chamber. Concurrently therewith H₂ gas is fed through the gas feed pipe 118, and the Ir(DPM)₃ gas and the H₂ gas react with each other on the substrate 114 to form iridium film on the substrate 114.

In depositing iridium oxide film on the substrate 114, in place of H₂ gas, O₂ gas is fed into the film forming chamber 110 to react Ir(DPM)₃ with the O₂ gas on the substrate 114.

FIG. 20 shows the results of X-ray diffraction of iridium films and iridium oxide films formed at a film forming chamber internal pressure of 10 Torr, a 300 sccm flow rate of the carrier gas, and a H₂ gas or O₂ gas partial pressure of 0.5 Torr. In FIG. 20, (a) indicates the diffraction spectrum of the silicon substrate with the iridium oxide film formed on, and (b) indicates the diffraction spectrum of the silicon substrate having the iridium film formed thereon.

The iridium film was grown on a (100) silicon substrate, and the iridium oxide film was grown on a 20 nm-thickness iridium film deposited on a (100) silicon substrate. A film forming rate was 100 nm/min for growth of both films.

As shown, in all the cases, typical diffraction peaks are observed, which shows that iridium and iridium oxide films were grown.

The inventors of the present application found that the thus-grown iridium film is more stable in the fabrication process than iridium film formed by the conventional use of Ir(acac)₃. This will be detailed below.

FIG, 21 shows film thickness changes of iridium films in a case that the iridium films were formed repeatedly in the same thickness. The film forming conditions are shown in TABLE 2.

TABLE 2

| Metal source material | Ir(DPM)₃ | Ir(acac)₃ |
| --- | --- | --- |
| Sublimation temperature [° C.] | 150 | 200 |
| Carrier gas flow rate [sccm] | 300 | 300 |
| Chamber Pressure [Torr] | 10 | 10 |
| Substrate temperature [° C.] | 500 | 500 |
| Deposition rate [nm/min] | 100 | 80 |
| Substrate | (100)Si | (100)Si |

As shown, in the case where Ir(DPM)₃ was used as a metal source material, the film thickness of the deposited iridium films does not substantially change. In contrast to this, in the case where Ir(acac)₃ was used, the variations of the film thickness are very large, and after 20 hours of the deposition, decreases of the film thickness are observed.

Such large variations of a film thickness occurring in the case that Ir(acac)₃ is used, shows it does not have stable sublimation properties. Without stable sublimation properties, a feed amount of a source gas fed into the film forming chamber 110 varies, which changes a film forming rate which is dependent on feed amounts of the source gas. As a result, a film thickness adversely varies.

In the case where Ir(acac)$_3$ was used, a film thickness decreases after 20 hours of the deposition. This is due to degradation of the Ir(acac)$_3$. Ir(DPM)$_3$ and Ir(acac)$_3$, which are organic metal source materials, are transiently degraded, and rates of the degradation depend mainly on temperatures. Ir(acac)$_3$, the sublimation temperature of which is high, is faster in the degradation than Ir(DPM)$_3$, which causes film thickness decrease.

Based on this, Ir(DPM)$_3$ is more suitable than Ir(acac)$_3$ as a source material for forming iridium film.

Next, the effect of feeding H$_2$ gas in forming iridium film will be explained.

FIG. 22 is a graph of resistivity changes of iridium film with respect to hydrogen partial pressures. FIG. 23 is a graph of surface roughness changes of iridium film with respect to hydrogen partial pressures.

As shown, when no H$_2$ gas is fed in forming iridium film, a resistivity of the iridium film is 1792 [Ω·cm]. When H$_2$ gas is fed in forming the iridium film, the value is abruptly decreased. For example, at an about 0.3 [Torr] hydrogen partial pressure, the value decreases to 48 [Ω·cm]. When the hydrogen partial pressure is further decreased, the resistivity is 42.8 [Ω·cm] at about 0.625 [Torr], and 33.8 [Ω·cm] at about 0.7 [Torr]. The resistivity can be decreased as the hydrogen partial pressure increases. Such dependence of the resistivity on the hydrogen partial pressure is due to concentration of carbon contained in the iridium film.

In the case where Ir(DPM)$_3$ is used as a source material for forming iridium film, the source material contains a large amount of carbon, and the grown iridium film contains carbon. Such mining of carbon causes resistivity increase, but the added H$_2$ gas reacts with the carbon in the film to thereby react the hydrogen with the carbon in the gas phase or on the surface of a substrate. A carbon concentration in the iridium film can be decreased.

As shown in FIG. 23, the feed of H$_2$ gas in forming the iridium film has the effect of reducing surface roughness of the formed iridium film.

As described above, according to the present embodiment, iridium film and iridium oxide film are grown by CVD using Ir(DPM)$_3$, whereby the films can be formed with good covering on a substrate having a stepped pattern drawn thereon.

Iridium film is grown with H$_2$ gas fed into the film forming chamber, whereby the iridium film having low resistivity and little carbon mixed in can be formed.

According to the inventors of the present application, to form iridium film of good quality, it is preferable that a substrate is heated to 500–600° C., an internal pressure of the film forming chamber for forming the film is set at 1–20 Torr, and a hydrogen partial pressure is set at 0.1–14 Torr.

To form iridium oxide film of good quality it is preferable that the substrate is heated to 500–600° C., an internal pressure of the film forming chamber for forming the film is set at 1–20 Torr, and the oxygen partial pressure is set at 0.5–16 Torr.

[Tenth Embodiment]

The semiconductor device according to a tenth embodiment of the present invention, and a method for fabricating the same will be explained with reference to FIGS. 24, 25A–25D, 26, 27, and 28A–28C.

Figure 24:
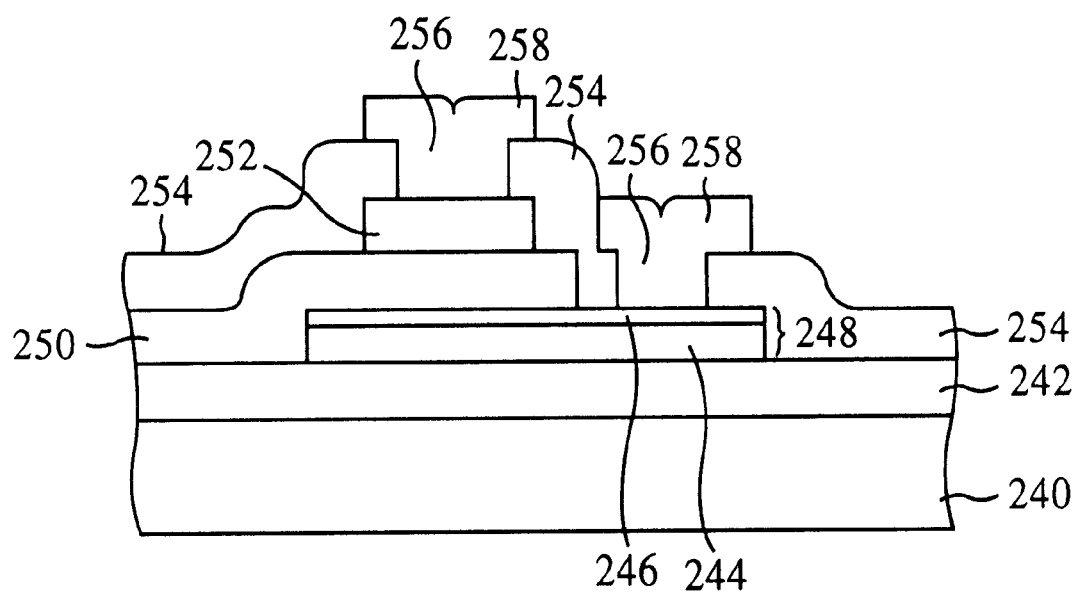
FIG. 24 is a view of the semiconductor device according to a tenth embodiment of the present invention, which explain a structure thereof.

FIG. 24 is a schematic sectional view of the semiconductor device according to the present embodiment, which shows a structure thereof. FIGS. 25A–25D shows sectional views of the semiconductor device according to the present embodiment at the steps of the method for fabricating the same. FIGS. 26, 27, and 28A–28C are views of a variation of the semiconductor device according to the present embodiment, which show a structure of the variation.

The present embodiment shows a structure of a thin film capacitor including iridium film formed by the thin film forming method according to a ninth embodiment as the lower electrode and the method for fabricating the same as an example of applying the iridium film to a semiconductor device.

First, the semiconductor device according to the present embodiment will be explained with reference to FIG. 24.

On an insulating film 242 formed on a silicon substrate 240 there is formed a lower electrode 249 comprising an iridium film 244 and an iridium oxide film 246 which are laid one on another. A capacitor dielectric film 250 of SrTiO$_3$ is formed on the lower electrode 248. An upper electrode 252 of TiN is formed on the capacitor dielectric film 250. An insulating film 254 is formed on the thus-fabricated capacitor. A wiring layer 258 which connects the upper electrode 252 and the lower electrode 248 is formed in through-holes formed in the insulating film 254.

Then, the method for fabricating a semiconductor device according to the present embodiment will be explained with reference to FIGS. 25A–25D.

First, the iridium film 244, which is to be the lower electrode 248 is deposited by CVD using Ir(DPM)$_3$ as a source material on the silicon substrate 240 having the insulating film 242 formed thereon. Film forming conditions for the iridium film 244 are, e.g., a 150° C. sublimation temperature, a 300 sccm flow rate of Ar gas as a carrier gas, a 100–300 sccm H$_2$ gas flow rate, a 500–600° C. substrate temperature, a 1–10 Torr film forming pressure, a 10 nm/min film forming rate and a 100 nm film thickness.

Then, the surface of the thus-formed iridium film is oxidized by, e.g., RTA (Rapid Thermal Annealing) to form the iridium oxide film 46 of an about 30–50 nm thickness. The conditions for the RTA are, e.g., a 600° C. processing temperature and a 10–20 second processing time.

The multi-layer film of the iridium film 244 and the iridium oxide film 246 are patterned by the usual lithography and ion milling to form the lower electrode 248.

Then, the SrTiO$_3$ film, which is to be the capacitor dielectric film 250, is deposited by sputtering. The sputtering conditions are, e.g., SrTiO$_3$ as a target, 10% O$_2$ gas content Ar gas, a 10 mTorr growth vacuum degree, a 450° C. substrate temperature and a 100 nm film thickness.

The TiN film, which is to be the upper electrode 252, is deposited by sputtering, e.g., by the use of Ti as a target and 20% N$_2$ content sputtering gas, and at a 10 mTorr growth vacuum degree, a 200° C. substrate temperature and a 100 nm film thickness.

Figure 25A:
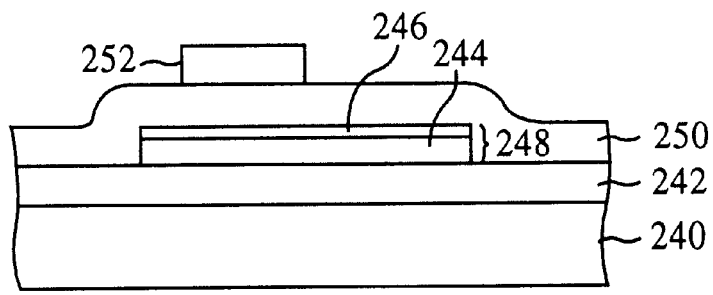
FIGS. 25A–25D are sectional views of the semiconductor device in the steps of the method for fabricating the semiconductor device according to the tenth embodiment of the present invention, which explain the method.

Then, the TiN film is processed by reactive ion etching to pattern the upper electrode 252 (FIG. 25A). The etching conditions are, e.g., Cl$_2$ as an etching gas, a 20 mTorr pressure, a 60° C. substrate temperature and an input power 200 W.

Figure 25B:
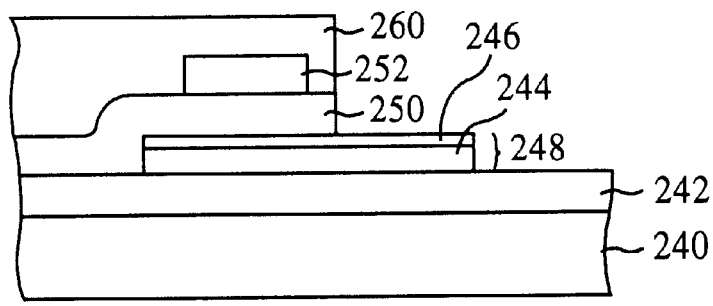
Figure 25C:
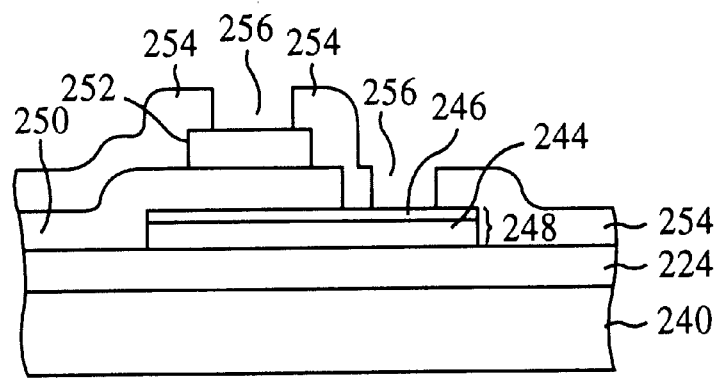

Next, a resist 260 is patterned by the usual lithography, and then the SrTiO$_3$ film is patterned by wet etching to be the capacitor dielectric film 250 (FIG. 25B).

Then, the insulating film 254 is deposited by CVD on the thus-fabricated capacitor. The film forming conditions are, e.g., a mixed gas of SiH$_4$, N$_2$O, and N$_2$ as a reaction gas, a 1 Torr pressure, a 130 nm/rain film forming rate, a 320° C. substrate temperature, a 20 W charged electric power and a 250 nm film thickness.

Subsequently, the through-holes 256 which lead the wiring from the lower electrode 246 and upper electrode 252 are opened in the insulation film 254 (FIG. 26C). The through-holes are formed by reactive ion etching. The etching conditions are, e.g., a mixed gas of $CF_4$ and $CHF_3$ as a reaction gas, a 200 mTorr pressure, a 70 nm/min etching rate, a 40° C. substrate temperature and a 200 W charged electric power.

Figure 25D:
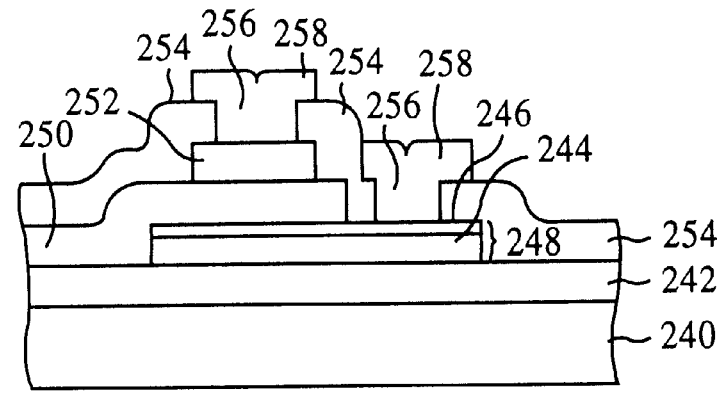

Then, Al is sputtered and patterned into the wiring layer 258 (FIG. 25D). The sputtering conditions are, e.g., Ar as a sputtering gas, a 1 mTorr pressure, a 600 nm/min film forming rate, room temperature as a substrate temperature, a 7 kW charged electric power and a 600 nm film thickness. The etching conditions are, e.g., $Cl_2$ as an etching gas, a 200 mTorr pressure, a 500 nm/min etching rate, a 40° C. substrate temperature and a 200 W charged electric power.

Leak characteristics of the thus-fabricated thin film capacitor were evaluated. A leak current obtained when a 10 V bias was applied between the upper electrode 252 of the capacitor of a 100×100 $\mu m^2$ area was $1 \times 10^{-6}$ $A \cdot cm^{-2}$. A specific dielectric of the capacitor dielectric film 250 was 200. Thus a capacitor having high specific dielectric and good leak current characteristics could be fabricated.

As described above, according to the present embodiment, the capacitor electrode is formed of iridium film formed by CVD using $Ir(DPM)_3$ as a source material, which allows a capacitor to use a high dielectric material, such as $SrTiO_3$, or others, as the dielectric film.

In the present embodiment, the thin film capacitor is a single body but may be applied to another device.

Figure 26:
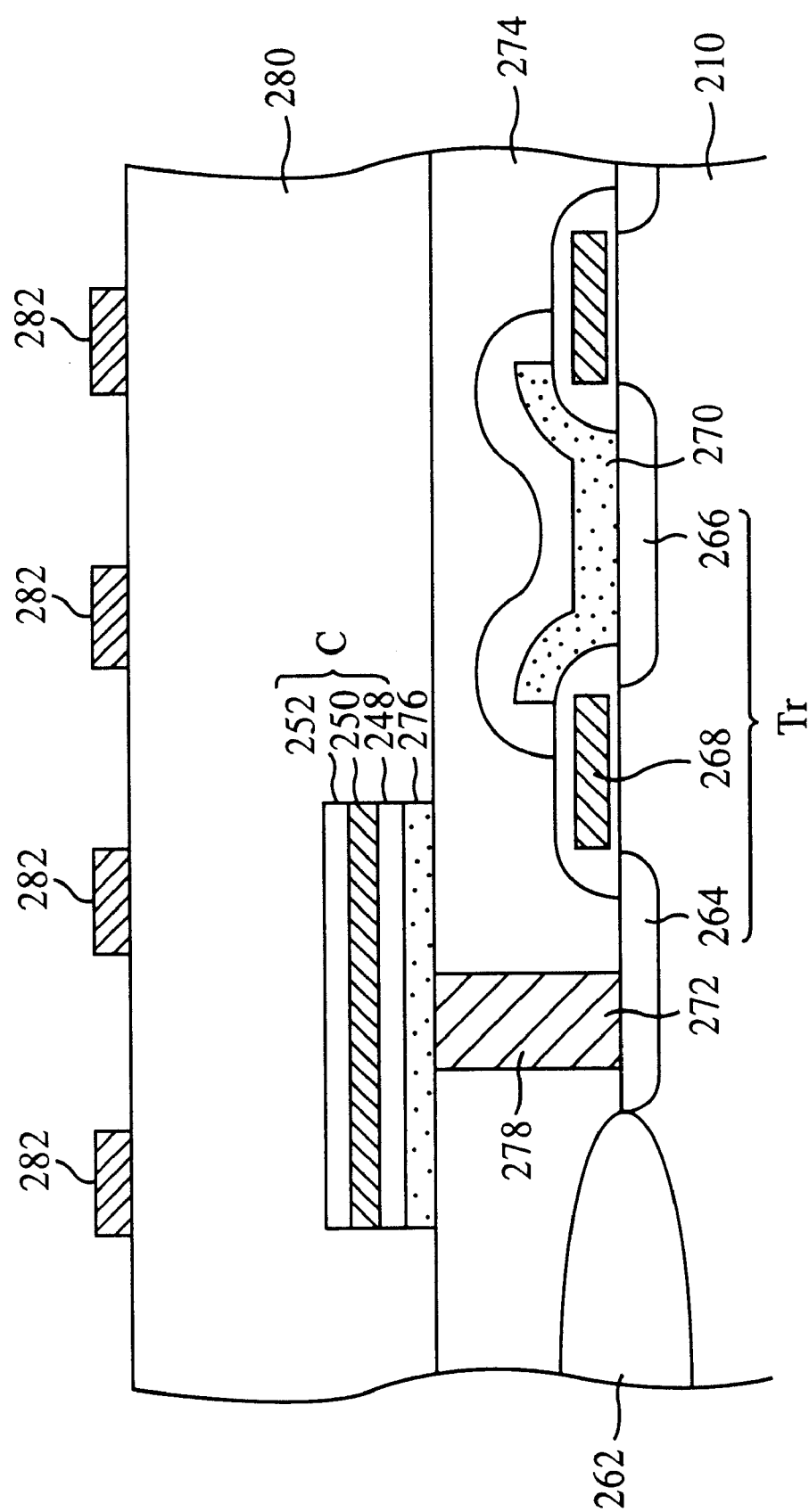
FIG. 26 is a view of one variation of the semiconductor device according to the tenth embodiment of the present invention, which explains a structure thereof (Part 1).
Figure 27:
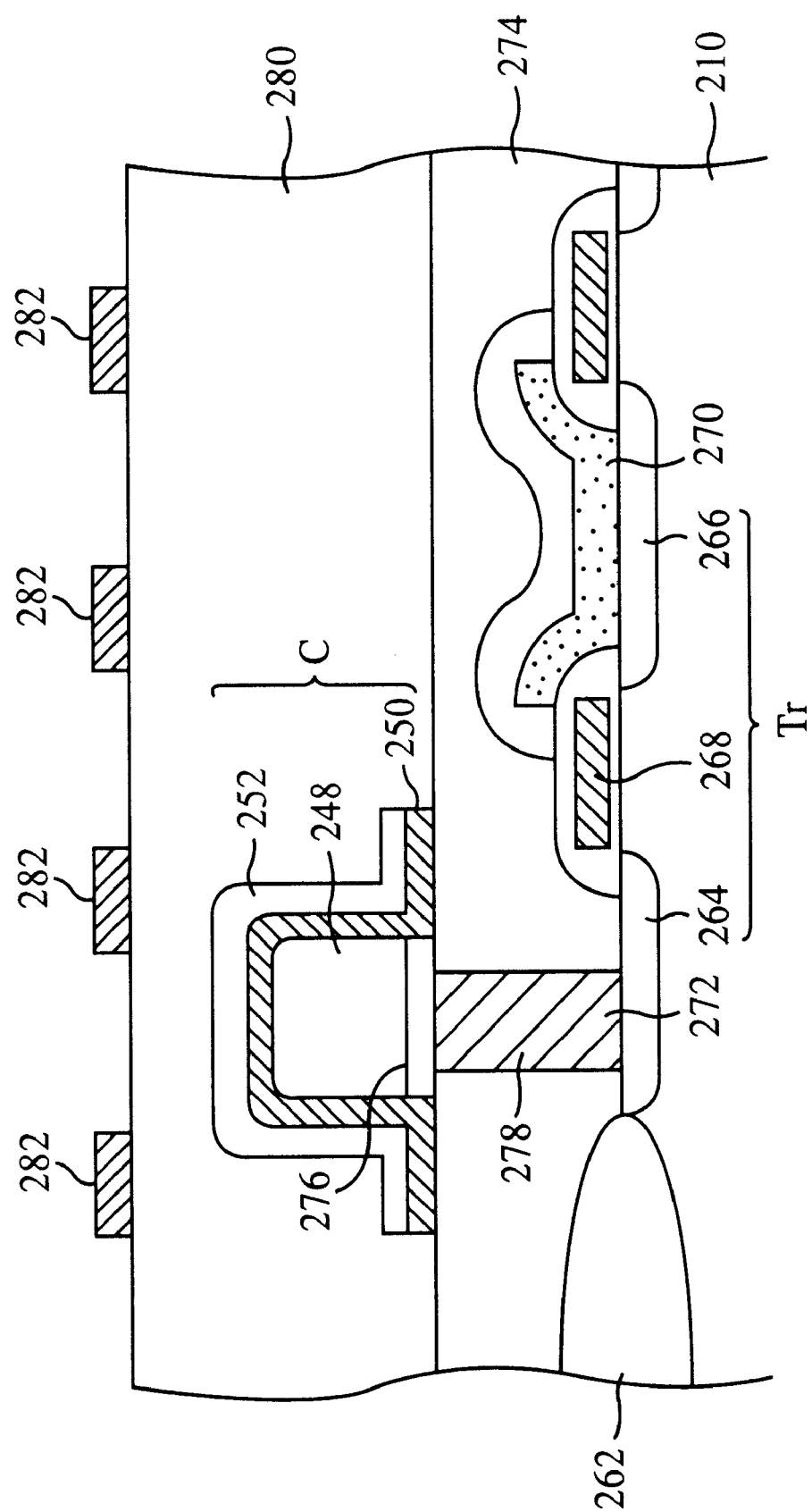
FIG. 27 is a view of one variation of the semiconductor device according to the tenth embodiment of the present invention, which explains a structure thereof (Part 2).

For example, as shown in FIG. 26, the capacitor may be applied to a DRAM.

That is, in a device region of a silicon substrate 240 defining a device isolation film 262 there is fabricated a transfer transistor Tr comprising a source diffused layer 264, a drain diffused layer 266 and a gate electrode 268. A wiring layer 270 which is a bit line is formed on the drain diffused layer 266. On a silicon substrate 240 having the transfer transistor Tr formed thereon, there is formed on the source diffused layer 264 an inter-layer insulation film 254 having a through-hole 272 formed therein.

A capacitor C is formed on the inter-layer insulation film 274 through a barrier layer 276. The capacitor C comprises a lower electrode 248 of iridium, a capacitor dielectric film 250 of $SrTiO_3$, and an upper electrode 252 of TiN. The lower electrode 248 is connected to the source diffused layer 264 via the barrier layer 276 and a conducting plug 278 buried in the through-hole 272. An inter-layer insulation film 280 is formed on the capacitor C, and a wiring layer 282 is formed on the inter-layer insulation film 280.

Thus, a DRAM including 1-transistor and 1-capacitor cells can be fabricated.

The iridium film is deposited by CVD, and has good covering on steps. Accordingly, the iridium film is applicable to capacitors which are not of the planar type shown in FIG. 26 and is, for example, applicable to the capacitor of the simple stacked structure as exemplified in FIG. 27.

In the present embodiment, the lower electrode 248 comprises the multi-layer film of the iridium film 244 and the iridium oxide film 246, the capacitor dielectric film 250 comprises $SrTiO_3$ film, and the upper electrode 252 comprises TiN film, but this is not essential.

For example, the capacitor dielectric film 250 may comprise, in place of $SrTiO_3$, $(Ba,Sr)TiO_3$, $Pb(Zr,Ti)O_3$ or others.

Figure 28A:
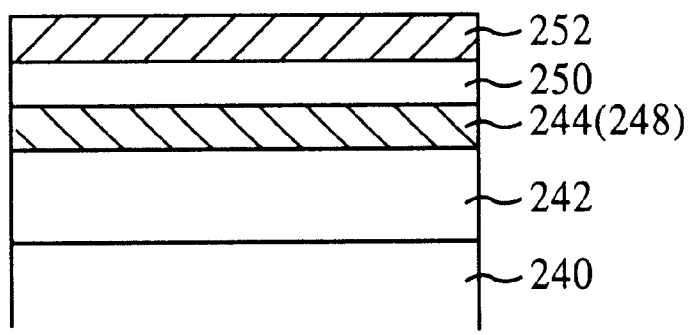
FIGS. 28A–28C are views of variations of the semiconductor device according to the tenth embodiment of the present invention, which explains a structure thereof (Part 3).

The lower electrode 248 may be formed of the iridium film 244 alone as shown in FIG. 28A.

Figure 28B:
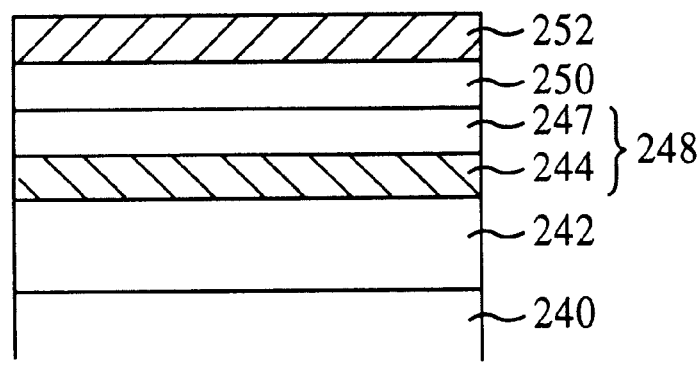
Figure 28C:
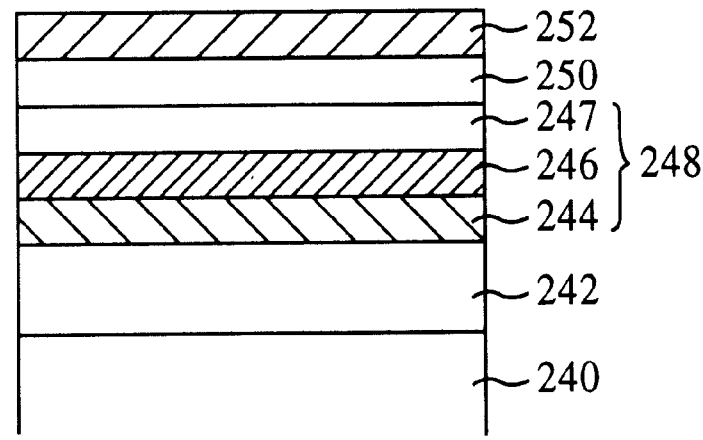

In the case where the capacitor dielectric film 250 comprises a material, such as $Pb(Zr,Ti)O_3$, or others, which is reactive with the iridium oxide film 246, the lower electrode 248 may comprise, as shown in FIG. 28B, the multi-layer film of the iridium film 244 and a platinum film 247 or, as shown in FIG. 28C, the multi-layer film of the iridium film 244, the iridium oxide film 246 and the platinum film 247.

The upper electrode 252 and the lower electrode 248 may have the same structure, In the case where the upper electrode 252 comprises a multi-layer film, a sequence of laying multi-layers of the multi-layer film is reverse to that of laying the multi-layers of the multi-layer film of the lower electrode 248.

In the present embodiment the iridium oxide film 246 is formed by oxidizing the surface of the iridium film 244, but as indicated in the ninth embodiment, it may be formed by CVD using $Ir(DPM)_3$.

[An Eleventh Embodiment]

The thin film forming method according to an eleventh embodiment of the present invention will be explained with reference to FIGS. 29A–29B, 30A–30B, and 31A–31B.

Figure 29A:
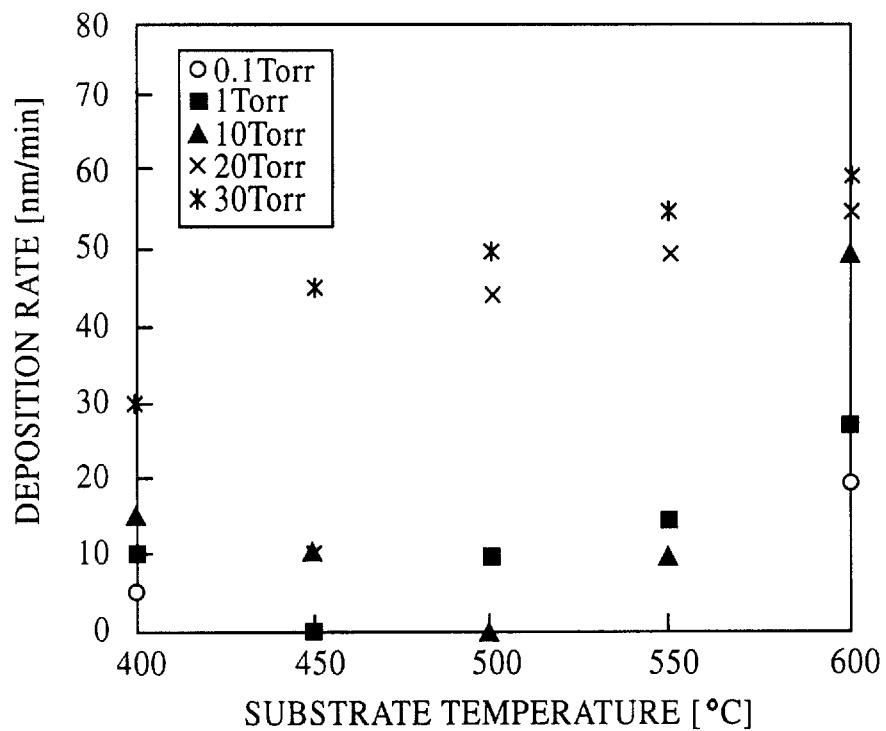
FIGS. 29A and 29B are graphs of the deposition rate of iridium film formed on silicon oxide film under film forming conditions.
Figure 29B:
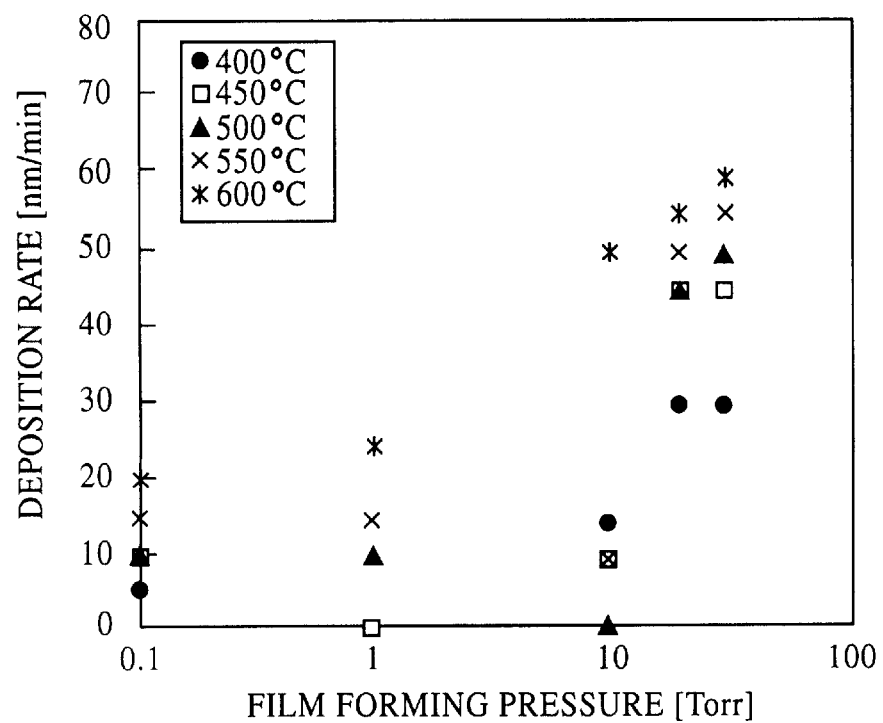
Figure 30A:
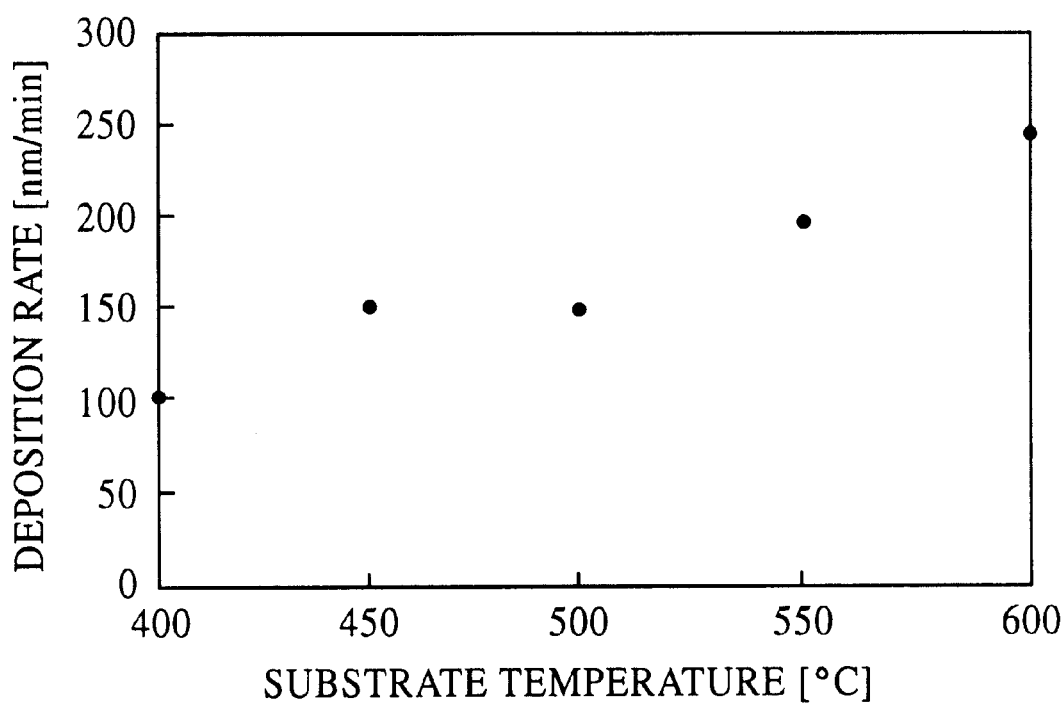
FIGS. 30A and 30B are graphs of the deposition rate of iridium film formed on TiN film under film forming conditions.
Figure 30B:
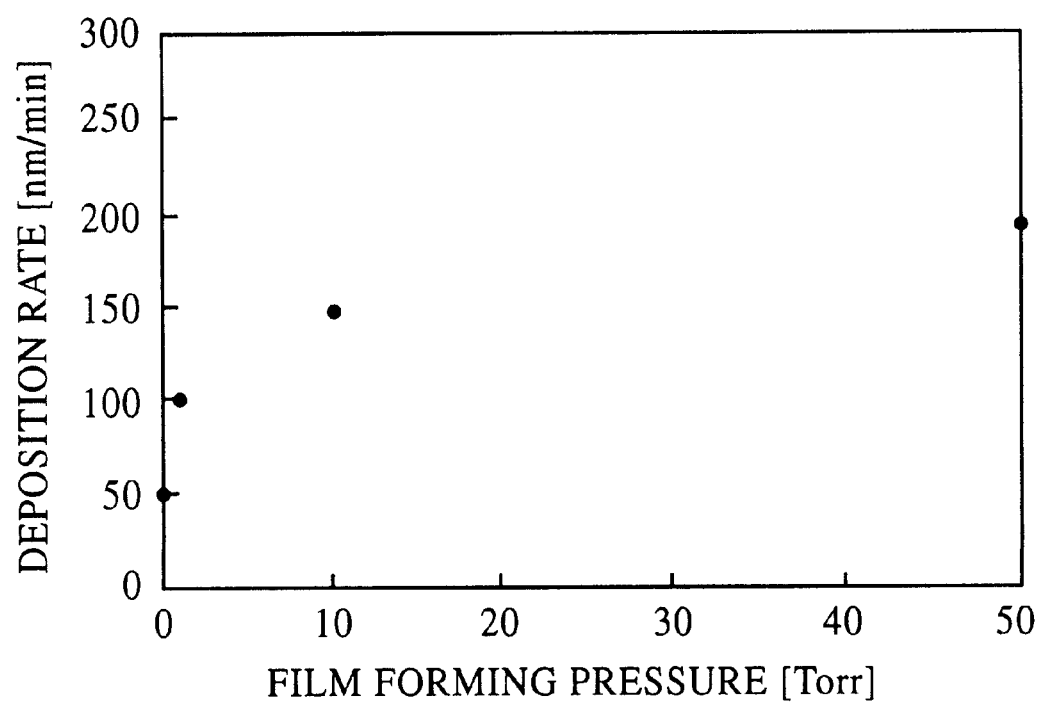
Figure 31A:
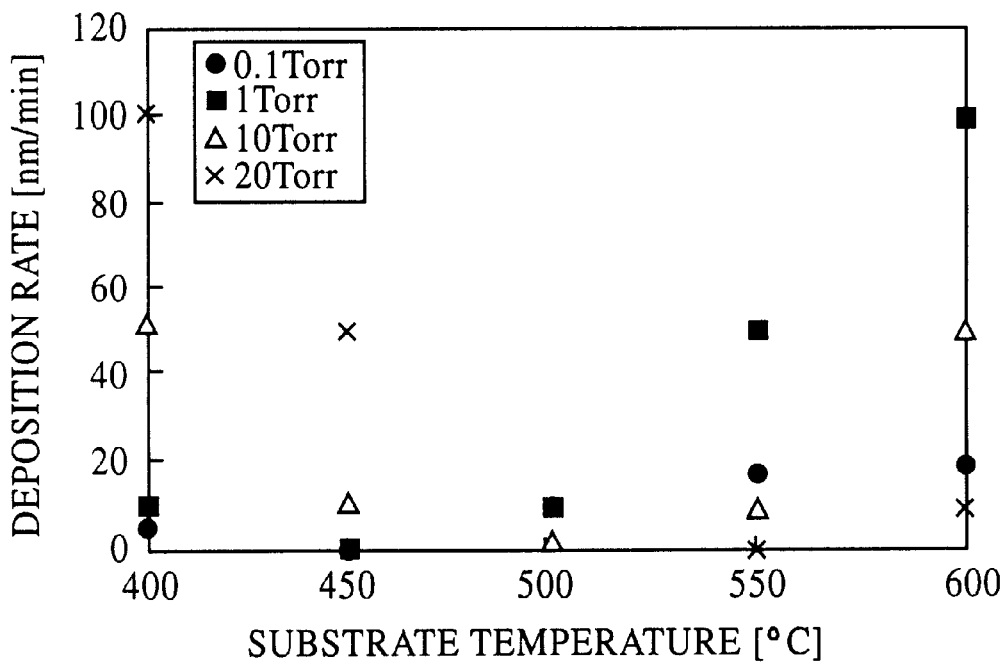
FIGS. 31A and 31B are graphs of the deposition rate of iridium oxide film formed on silicon oxide film under film forming conditions.
Figure 31B:
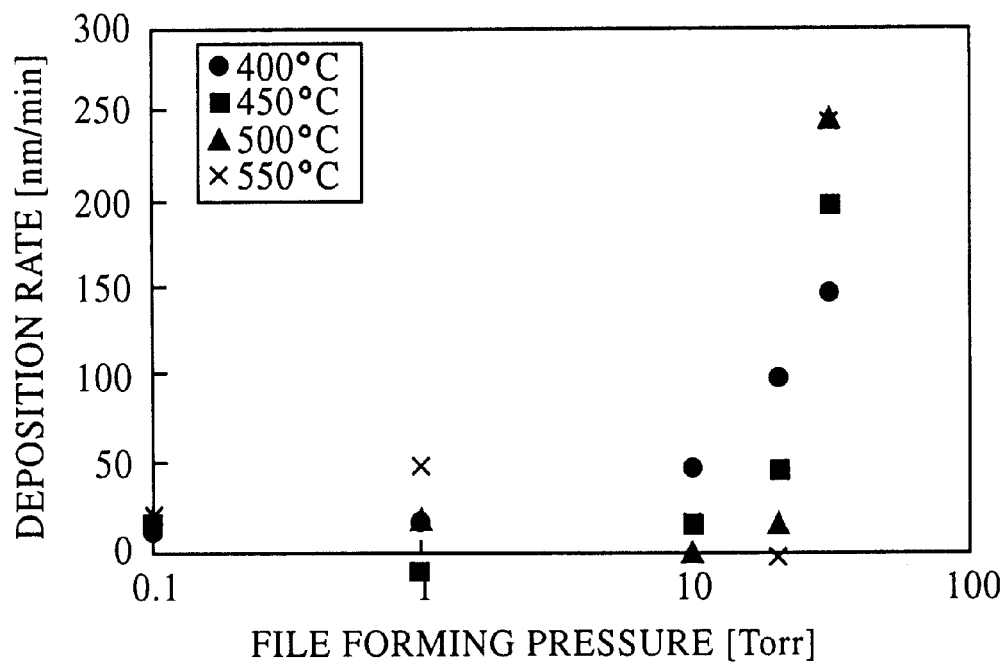

FIGS. 29A–29B are graphs of deposition rate dependence of iridium film formed on silicon oxide film on film forming conditions. FIGS. 30A–30B are graphs of deposition rate dependence of iridium film formed on TiN film on film forming conditions. FIGS. 31A–31B are graphs of deposition rate dependence of iridium oxide film formed on silicon oxide film on film forming conditions.

In the thin film forming method according to the ninth embodiment, iridium film or iridium oxide film is deposited by CVD. The inventors further studied the film forming conditions and found that iridium film or iridium oxide film can be selectively grown by CVD under set conditions. The present embodiment is based on their finding.

Selective deposition of iridium film and iridium oxide film by the thin film forming method according to the ninth embodiment of the present invention will be detailed.

FIGS. 29A and 29B show deposition rate dependence of iridium film deposited on a substrate having an 200 nm-thickness silicon oxide film formed thereon, on substrate temperatures (FIG. 29A), and deposition dependence of the same on film forming chamber pressure (FIG. 29B).

As shown, the deposition rate of iridium film depends on substrate temperatures and film forming chamber pressures. What should be especially noted in FIG. 29 is that there are conditions which make the deposition rate substantially zero by specifically setting the substrate temperature and the film forming chamber pressure.

That is, the deposition rate is substantially zero with the substrate temperature set at 450° C. and the film forming chamber pressure at 1 Torr, and with the substrate temperature set at 500° C. and the film forming chamber pressure at 10 Torr. Accordingly, under these film forming conditions, the iridium film is not deposited on the silicon oxide film.

TABLE 3 summarizes the results shown in FIG. 29.

TABLE 3

|  | 0.1 Torr | 1.0 Torr | 10 Torr | 20 Torr |
| --- | --- | --- | --- | --- |
| 400° C. | x | x | x | x |
| 450° C. | x | o | x | x |
| 500° C. | x | x | o | x |
| 550° C. | x | x | x | x |
| 600° C. | x | x | x | x |

In TABLE 3, o indicates conditions under which iridium film was not deposited, and x indicates conditions under which iridium film was deposited.

As seen in TABLE 3, the conditions under which iridium film is not formed are established by relationships between substrate temperatures and film forming chamber pressures, and it is necessary that higher film forming chamber pressures are required for higher substrate temperatures in a range of the conditions.

Conditions under which an iridium film is not formed are found at substrate temperatures below 400° C. and above 550° C.

Similarly, conditions under which an iridium film is not formed are not found at film forming chamber pressures below 0.1 and above 20 Torr.

FIG. 30 shows the results of the same measurement conducted on iridium film formed on a base of TiN (titanium nitride) film, FIG. 30A shows the results of the measurement on substrate temperature dependence of the film with the film forming chamber pressure set constant at 10 Torr. FIG. 30B shows the results of the measurement on film forming chamber pressure dependence of the film with the substrate temperature set constant at 500° C.

As shown, the deposition rate of iridium film depends on the substrate temperature and the film forming chamber pressure, but in the case where the base is a silicon oxide film, iridium film is formed even under the conditions where iridium film is not formed, i.e., at a 500° C. substrate temperature and a 10 Torr film forming chamber pressure.

Accordingly, in depositing iridium film under set conditions on a substrate having a region with silicon oxide film exposed and a region with TiN exposed, iridium film can be selectively deposited only on the TiN film.

Next, FIG. 31 shows the results of the same measurement conducted on iridium oxide film.

FIGS. 31A and 31B show deposition rate dependence of iridium oxide film formed on a silicon substrate having a 200 nm-thickness silicon oxide film formed thereon on substrate temperatures (FIG. 31A), and deposition rate dependence of the same on film forming chamber pressures FIG. 31B).

As shown, it is found that for iridium oxide film as well as iridium film, conditions under which a deposition rate is substantially zero at specifically set substrate temperatures and specifically set film forming chamber pressures exist. That is, a deposition rate is substantially zero at a 450° C. substrate temperature and a 1 Torr film forming chamber pressure, at a 500° C. substrate temperature, at a 10 Torr film forming chamber pressure, and at a 550° C. substrate temperature and a 20 Torr film forming chamber pressure. Accordingly, under these film forming conditions, iridium oxide film is not deposited on silicon oxide film.

TABLE 4 summarizes the results shown in FIGS. 31A and 31B.

TABLE 4

|  | 0.1 Torr | 1.0 Torr | 10 Torr | 20 Torr |
| --- | --- | --- | --- | --- |
| 400° C. | x | x | x | x |
| 450° C. | x | o | x | x |
| 500° C. | x | x | o | x |
| 550° C. | x | x | x | o |
| 600° C. | x | x | x | x |

In TABLE 4, o indicates conditions under which iridium oxide film was not deposited, and x indicates conditions under which iridium oxide film was deposited.

As seen in TABLE 4, the conditions under which an iridium oxide film is not formed are established by relationships between substrate temperatures and film forming chamber pressures, and it is necessary that higher film forming chamber pressures are required for higher substrate temperatures in a range of the conditions.

Conditions under which an iridium oxide film is not formed are found at substrate temperatures below 400° C. and above 600° C.

Similarly, conditions under which an iridium oxide film is not formed are not found at film forming chamber pressures below 0.1 and above 30 Torr.

In depositing iridium oxide film on TiN film, similarly with the deposition of iridium film, conditions under which an iridium oxide film is not deposited could not be found.

Accordingly, in depositing iridium oxide film under set conditions on a substrate having a region with silicon oxide film exposed and a region with TiN exposed, an iridium film can be selectively deposited only on the TiN film.

The mechanism for thus selectively growing iridium film or iridium oxide film is not clear, but it is considered that under the conditions where iridium film and iridium oxide film are not deposited on silicon oxide film, $Ir(DPM)_3$, which is a source material for iridium, is adsorbed on the surface of the silicon oxide film but vaporized without being decomposed, whereby iridium film and iridium oxide film are not deposited.

Contrary to this, under the conditions where iridium film and iridium oxide film are deposited on silicon oxide film, adsorbed $Ir(DPM)_3$ is decomposed on the substrate at substrate temperatures sufficient to be decomposed or is not vaporized at low substrate temperatures, whereby iridium film and iridium oxide film are deposited on the substrate.

The range of the conditions for the selective growth of iridium oxide film are wider then that of the conditions for the selective growth of iridium film, which is considered to be due to that $O_2$ gas fed upon forming the film accelerates vaporization of $Ir(DPM)_3$.

As described above, according to the present embodiment, in depositing iridium film or iridium oxide film by CVD using $Ir(DPM)_3$ as a source material, the relationship between a temperature of a substrate for the film to be deposited on and a pressure in the film forming chamber is set at prescribed conditions, whereby the iridium film or the iridium oxide film can be selectively deposited.

In the present embodiment, the substrate on which iridium film or iridium oxide film can be formed on is exemplified by TiN film as a condition for the selective growth of iridium film or iridium oxide film, but iridium film or iridium oxide film need not be deposited only on silicon oxide film, The selective growth is possible on substrates of other materials. For example, a substrate may be TiN film, or iridium film or iridium oxide film.

By feeding $H_2$ gas while iridium film is being formed, the iridium film can have good orientation. This is because, as described in the thin film forming method according to the ninth embodiment, the concentration of carbon contained in the iridium film can be reduced by feeding $H_2$ gas. To achieve such an effect, a concentration of $H_2$ gas to be fed into the film forming chamber is preferably below 30% of a total gas concentration.

In forming iridium oxide film, the concentration of $O_2$ gas to be fed into the film forming chamber is preferably 50% of a total gas concentration.

[A Twelfth Embodiment]

The semiconductor device according to a twelfth embodiment of the present invention, and the method for fabricating the same will be explained with reference to FIGS. 32, 33A–33C, 34A–34B, 35–37.

Figure 32:
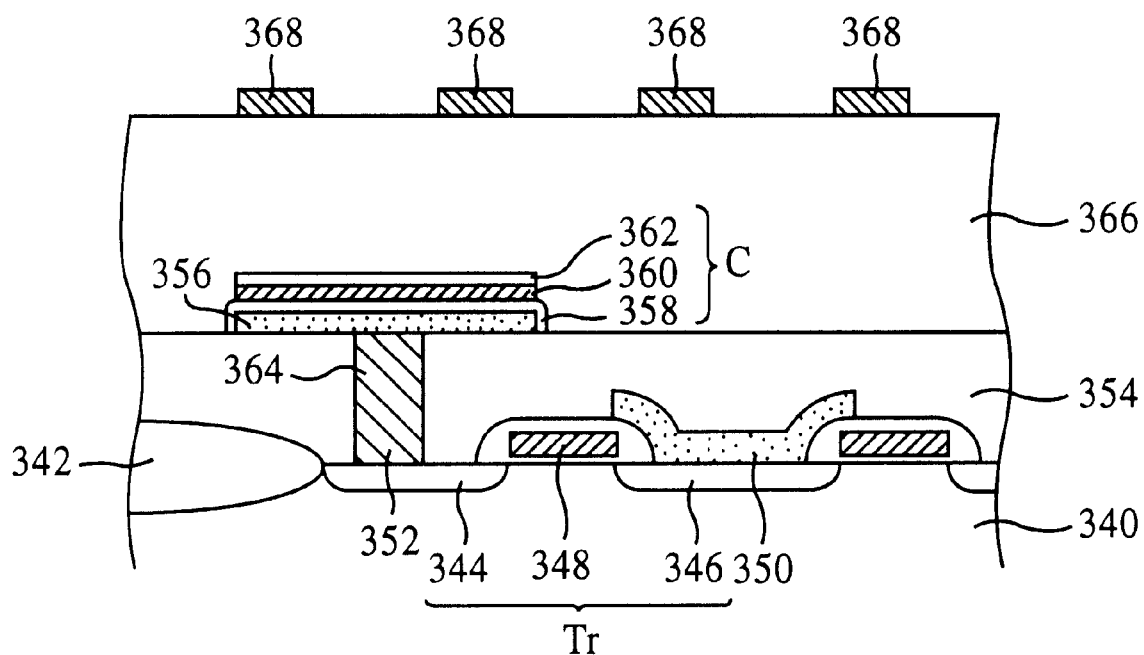
FIG. 32 is a schematic sectional view of the semiconductor device according to a twelfth embodiment of the present invention, which explains a structure thereof.
Figure 34A:
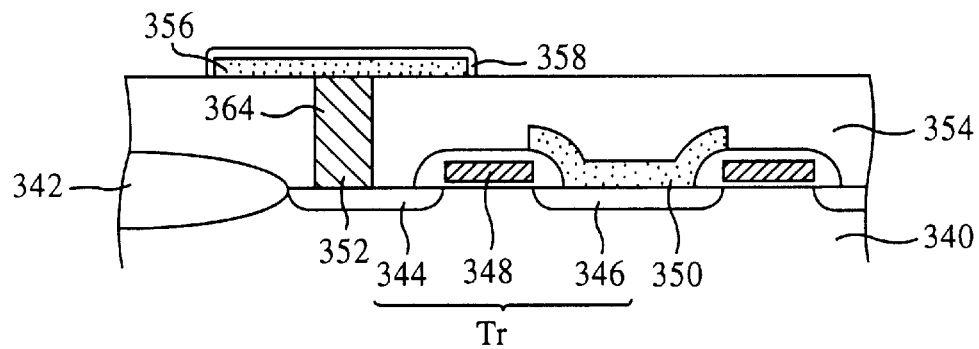
FIGS. 34A and 34B are sectional views of the semiconductor device according to a twelfth embodiment in the steps of the method for fabricating the same, which explain the method (Part 2).
Figure 35:
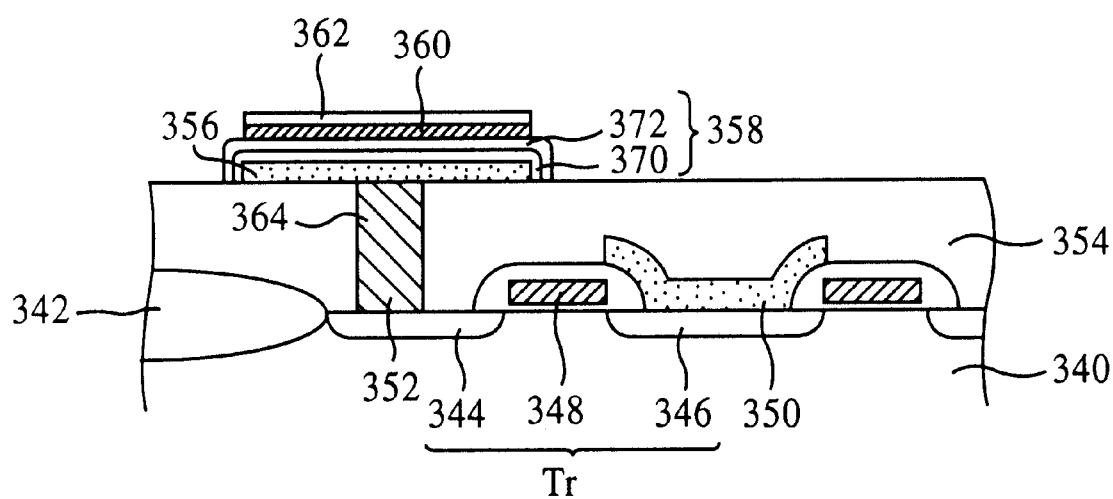
FIG. 35 is a schematic sectional view of one variation of the semiconductor device according to the twelfth embodiment of the present invention (Part 1).
Figure 36:
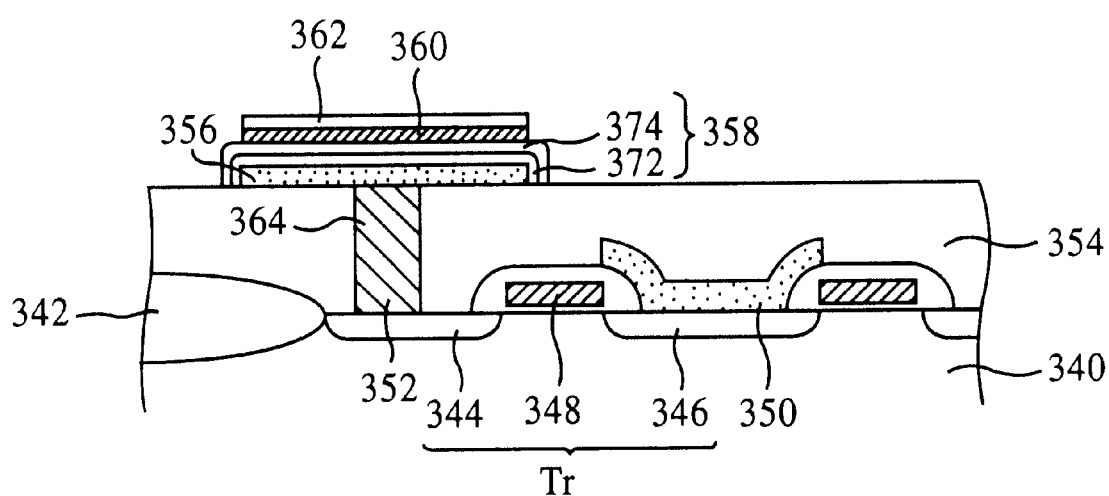
FIG. 36 is a schematic sectional view of one variation of the semiconductor device according to the twelfth embodiment of the present invention (Part 2).
Figure 37:
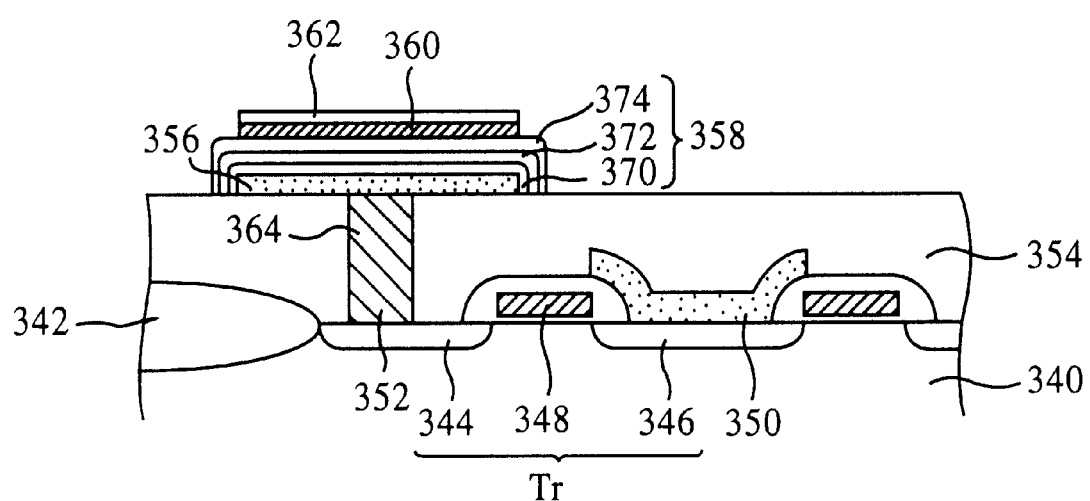
FIG. 37 is a schematic sectional view of one variation of the semiconductor device according to the twelfth embodiment of the present invention (Part 3).

FIG. 32 is a view of the semiconductor device according to the present embodiment, which shows a structure thereof. FIGS. 33A–33C and 34A–34B are sectional views of the semiconductor device at the steps of the method for fabricating the same according to the present invention. FIGS. 35 to 37 are views of variations of the semiconductor device according to the present embodiment, which show structures thereof.

The present embodiment shows a structure of a DRAM including the lower electrode of a capacitor, which is formed of iridium film as an application of iridium oxide film selectively formed by the thin film forming method according to the eleventh embodiment.

First, a structure of the semiconductor device according to the present invention will be explained with reference to FIG. 32.

A transfer transistor Tr comprises a source diffused layer 344, a drain diffused layer 346 and a gate electrode 348 in a device region of a silicon substrate 340 defined by a device isolation film 342. A wiring layer 350 constituting a bit line is formed on the drain diffused layer 346. An inter-layer insulation film 354 is formed on the silicon substrate 340 having the transfer transistor Tr formed thereon, and a through-hole 352 is formed on a source diffused layer 344.

A capacitor C comprising a lower electrode 358 of an iridium film, and a capacitor dielectric film 360 of $SrTiO_3$, and an upper electrode 362 of platinum are formed on the inter-layer insulation film 354 through a barrier layer 356 comprising a multi-layer of TiN film, the Ti film being formed on the inter-layer insulation film 354 through the barrier layer 356. The lower electrode 358 is connected to the source diffused layer 344 through a conducting plug 364 buried in the through-hole 352. An inter-layer insulation film 366 is formed on the capacitor, and a wiring layer 368 is formed on the inter-layer insulation film 366.

Thus a DRAM comprising 1-transistor and 1-capacitor cells is fabricated.

Then, the method for fabricating the semiconductor device according to the present embodiment will be explained with reference to FIGS. 33A–33C and 34A–34B.

Figure 33A:
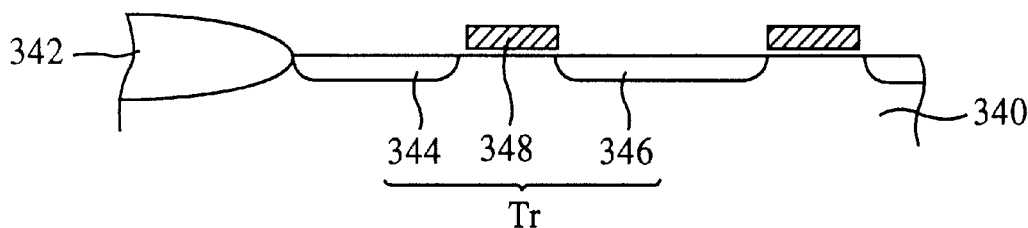
FIGS. 33A–33C are sectional views of the semiconductor device according to a twelfth embodiment in the steps of the method for fabricating the same, which explain the method (Part 1).

First, the transfer transistor Tr comprising the source diffused layer 344, the drain diffused layer 346 and the gate electrode 348 is formed on a silicon substrate 340 having the device region defined by the device isolation film 342 by the usual MOS transistor fabrication process (FIG. 33A).

Then, the insulation film 349 which covers the gate electrode 348 is formed, and then the wiring layer 350 connected to the drain diffused layer 346 is formed. The wiring layer 350 is extended normal to the gate electrode 348 to constitute the bit line (not shown).

Figure 33B:
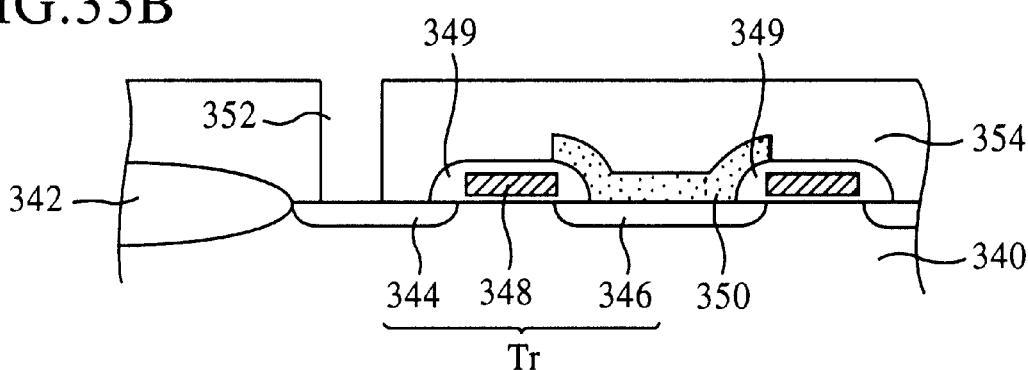

Subsequently a silicon oxide film to be the inter-layer insulation film 354 is formed by thermal CVD, and the through-hole 352 which is opened on the source diffused layer 344 is formed (FIG. 33B).

Then, a polycrystalline silicon film is deposited on the entire surface and etched back to form the plug 364 buried in the through-hole 352.

Figure 33C:
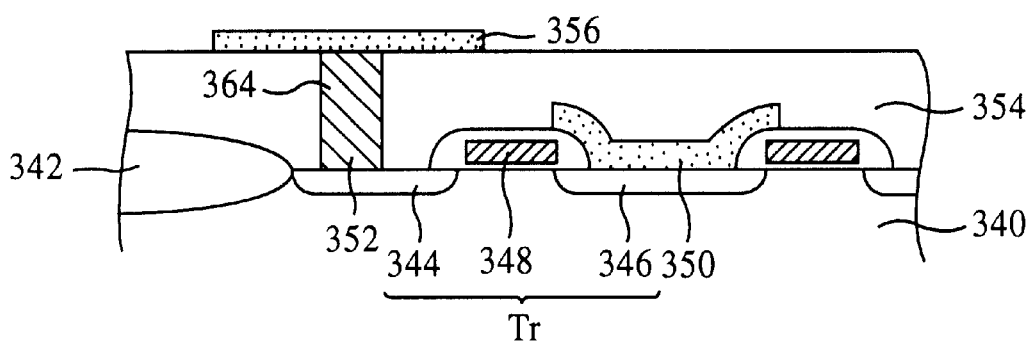

Then, a Ti film and a TiN film to be the barrier layer 356 are continuously formed by sputtering and patterned by the usual lithography and etching, Thus the barrier layer 356 is formed (FIG. 33C).

Subsequently iridium film is selectively grown by the thin film forming method according to the eleventh embodiment. At this times the inter-layer insulation film 354 of silicon oxide film and the barrier layer 356 of TiN film are exposed on the surface of the silicon substrate 340. Accordingly, the iridium film is not deposited on the inter-layer insulation film 354 but is deposited only on the barrier layer 356. Thus the lower electrode 358 of the iridium film is formed (FIG. 34A).

The lower electrode 358, which is formed of the thus selectively grown iridium film, does not need patterning by ion milling, and can be micronized.

Then, the $SrTiO_3$ film is deposited by sputtering and patterned by ion milling to form the capacitor dielectric film 360 of the $SrTiO_3$ film.

Next, the Pt film is deposited by sputtering and is patterned by ion milling to form the upper electrode 362 of the Pt film.

Thus, the capacitor C comprising the lower electrode 358, the capacitor dielectric film 360 and the upper electrode 362 is fabricated.

Subsequently, a silicon oxide film is deposited by thermal CVD to form the inter-layer insulation film 366.

Then, the wiring layer 368 connected to the upper electrode 362 is formed through the inter-layer insulation film 364.

Figure 34B:
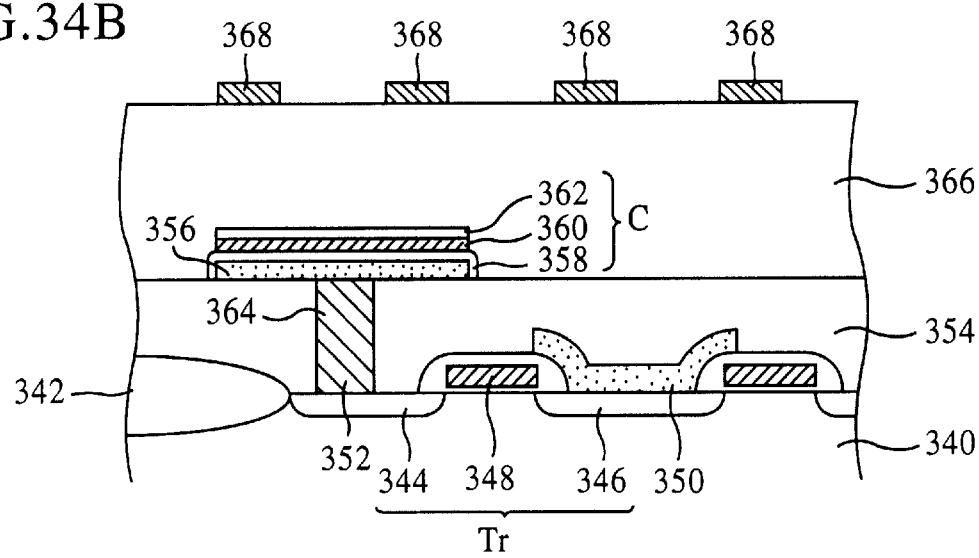

Thus, a DRAM comprising 1-transistor and 1-capacitor cells is fabricated (FIG. 34B).

As described above, in the method for fabricating the semiconductor according to the present embodiment, an iridium film which is to be the lower electrode 358 is selectively grown without the necessity of processing by ion milling. As a result, the lower electrode 358 having a micronized pattern can be formed without sacrificing a device size.

The lower electrode 358 is formed by selective growth by CVD so as to cover the barrier layer 356. As a result, in depositing the capacitor dielectric film 360, the barrier layer 356 can be kept from oxidation. The barrier layer 356 can be kept from becoming highly resistive.

In the present embodiment, the lower electrode is formed of iridium film but may be formed of iridium oxide film.

As shown in FIG. 35, the lower electrode 358 may be formed by continuous selective growth of the iridium film 370 and the iridium oxide film 372.

As shown in FIG. 36, the lower electrode 358 may be formed by continuous selective growth of the iridium oxide film 372 and the iridium film 374.

As shown in FIG, 37, the lower electrode 358 may be formed by continuous selective growth of the iridium film 370, the iridium oxide film 372 and the iridium film 374.

[A Thirteenth Embodiment]

The semiconductor device according to a thirteenth embodiment of the present invention, and the method for fabricating the same will be explained with reference to FIGS. 38, 39A–39C, 40A–40B, 41–44.

Figure 38:
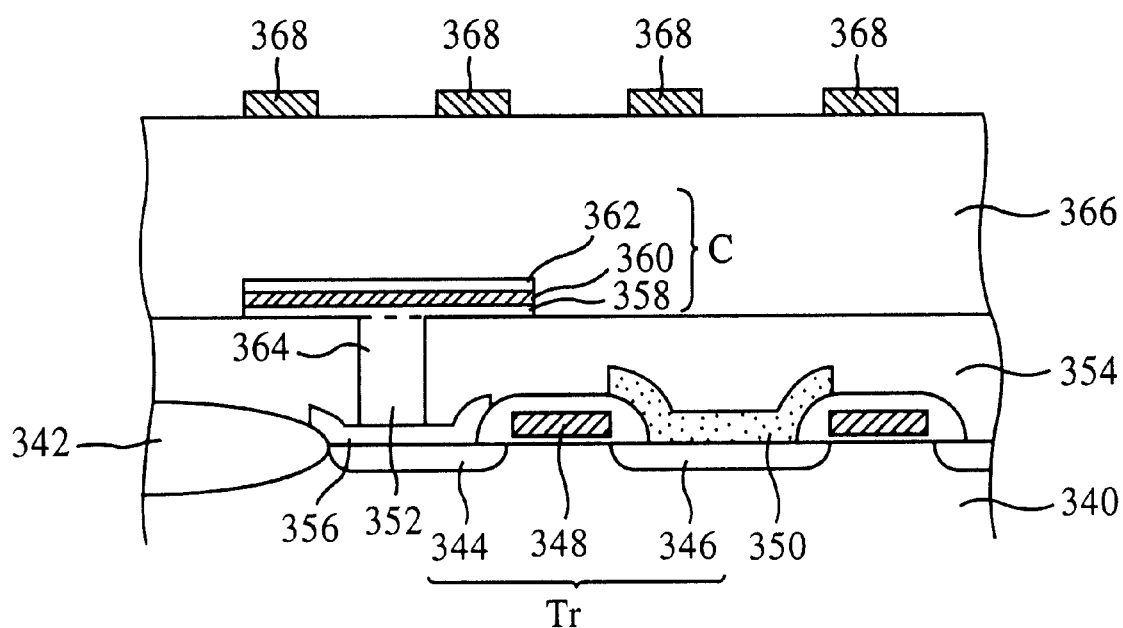
FIG. 38 is a schematic sectional view of the semiconductor device according to a thirteenth embodiment of the present invention, which explains a structure thereof.

FIG. 38 is a view of the semiconductor device according to the thirteenth embodiment, which shows a structure thereof. FIGS. 39A–39C and 40A–40B are sectional views of the semiconductor device according to the present embodiment of the present invention, which show the method. FIGS. 41 to 44 are schematic sectional views of the semiconductor device according to variations of the present embodiment, which show structures thereof.

The present embodiment is characterized in that the semiconductor device includes iridium film or iridium oxide film formed by a combination of the selective growth according to the eleventh embodiment and a non-selective growth technique.

That is, according to the present embodiment, the semiconductor device according to the twelfth embodiment, which is shown in FIG. 32 includes the plug 364 of iridium film selectively grown in the through-hole, and the lower electrode 358 of iridium film non-selectively grown (FIG. 38).

Then, the method for fabricating the semiconductor device according to the present embodiment will be explained with reference to FIGS. 39A–39C, 40A–40B, 41–44.

First, a transfer transistor Tr is formed by the name method for fabricating the semiconductor device according to the twelfth embodiment, which is shown in FIGS. 33A and 33B, and then a wiring layer 350 is formed.

Then, a Ti film and a TiN film are continuously formed by sputtering and patterned by the usual lithography and etching, and a barrier layer 356 is formed on a source diffused layer 344.

Figure 39A:
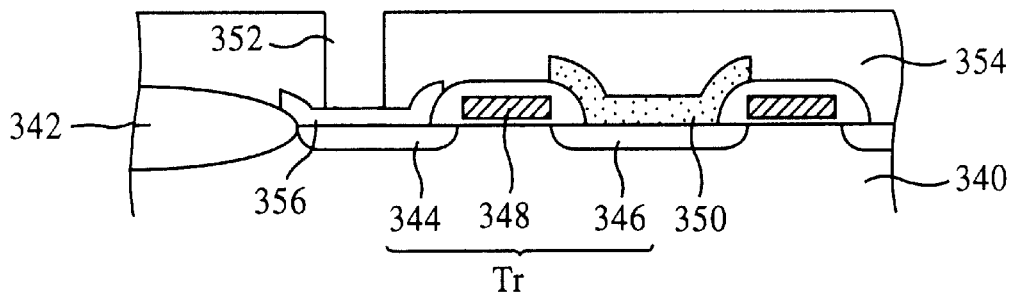
FIGS. 39A–39C are sectional views of the semiconductor device according to the thirteenth embodiment of the present invention, which explain the method (Part 1)

Subsequently a silicon oxide film to be an inter-layer insulation film 354 is formed by thermal CVD to form a through-hole 352 opened on the source diffused layer 344. The barrier layer 356 is exposed on the bottom of the through-hole 352 (FIG. 39A).

Figure 41:
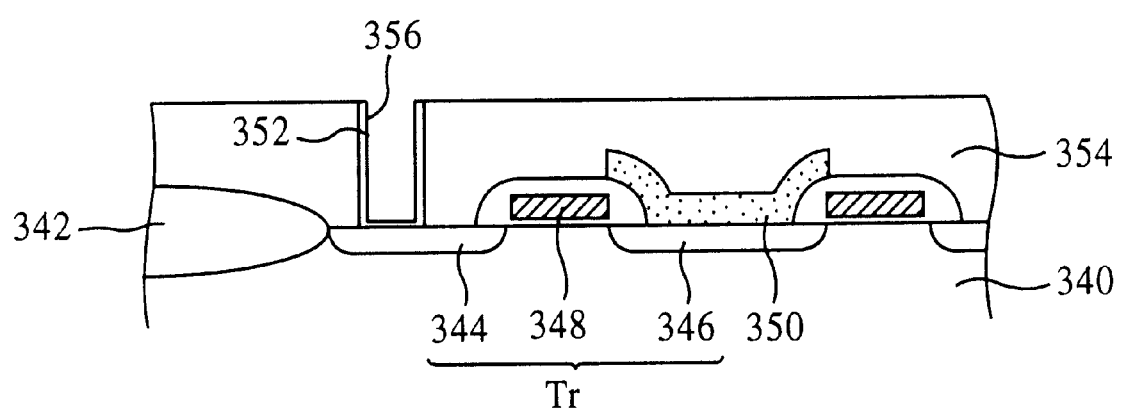
FIG. 41 is a schematic sectional view of one variation of the semiconductor device according to the thirteenth embodiment, which explains a structure thereof (Part 1).

The barrier layer 352 may be formed after the formation of the inter-layer insulation film 352. For example, the Ti film and the TiN film are deposited on the entire surface by sputtering after the through-holes 352 are opened, and only parts of the Ti film and the TiN film on the inter-layer insulation film 354 are removed to leave the barrier layer 356 on the inside wall and the bottom of the through-hole 352 (FIG. 41). The parts of the Ti film and the TiN film on the inter-layer insulation film 354 can be easily removed by, e.g., CMP (Chemical Mechanical Polishing).

Figure 39B:
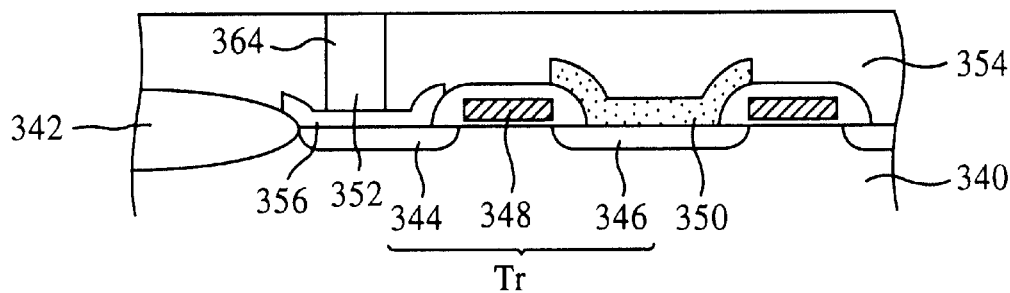

Then, iridium film is selectively grown by the thin film forming method according to the eleventh embodiment. At this time, the TiN film, on which the iridium film can be grown, is exposed only on the bottom of the through-hole 352, and the iridium film can grow only inside the through-hole 52. Thus a plug 364 buried in the through-hole can be formed (FIG. 39B).

Figure 39C:
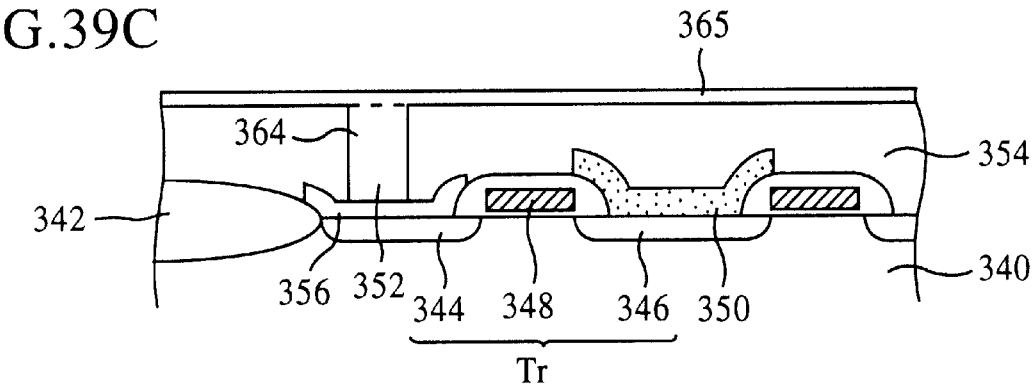

Next, the iridium film is set growing under different conditions under which the selective growth does not take place. Thus an iridium film 365 is formed (FIG. 39C).

Figure 42:
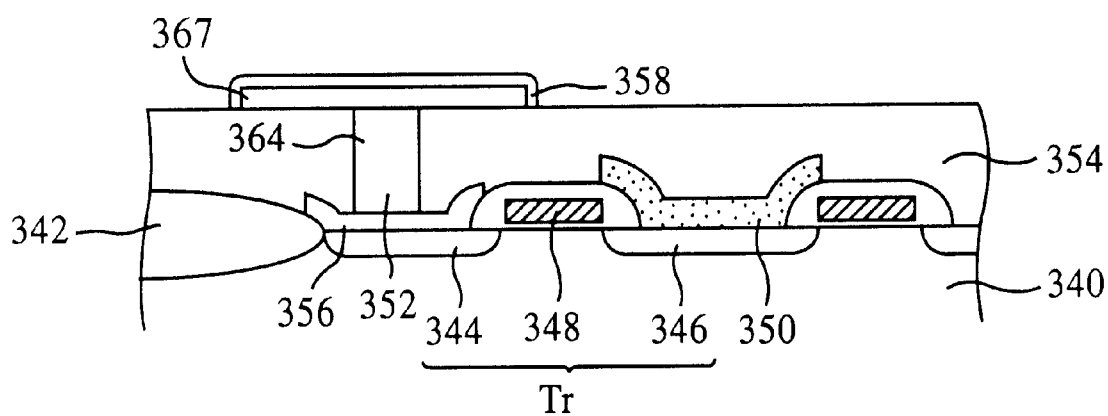
FIG. 42 is a schematic sectional view of one variation of the semiconductor device according to the thirteenth embodiment, which explains a structure thereof (Part 2).
Figure 43:
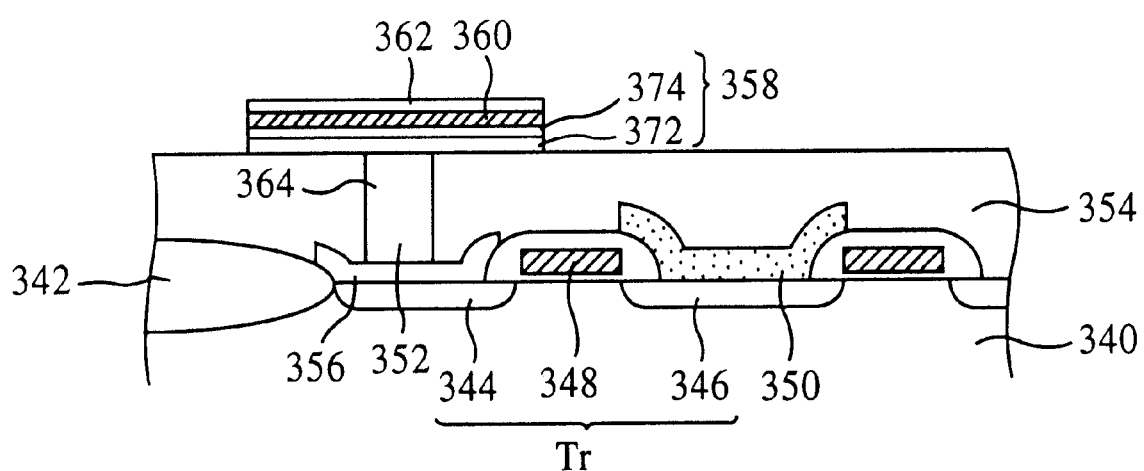
FIG. 43 is a schematic sectional view of one variation of the semiconductor device according to the thirteenth embodiment, which explains a structure thereof (Part 3).
Figure 44:
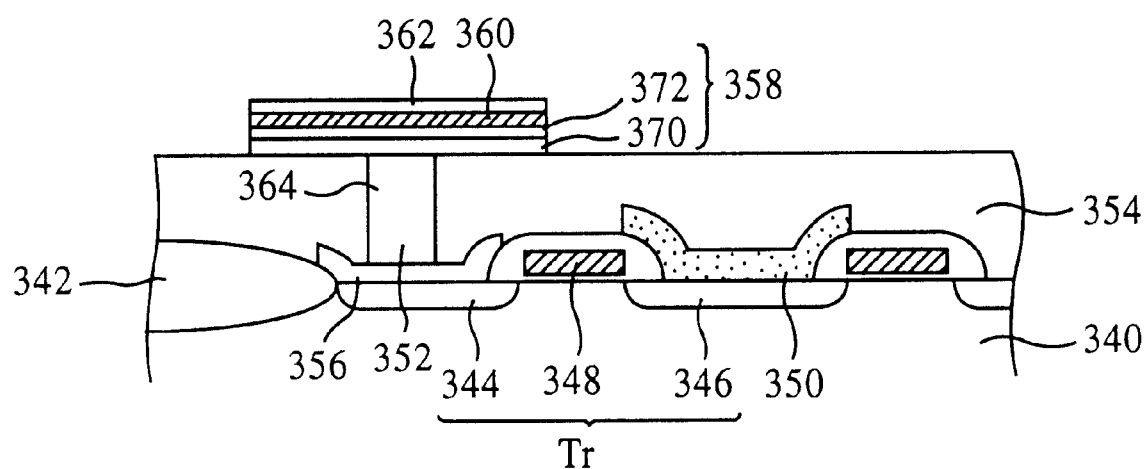
FIG. 44 is a schematic sectional view-of one variation of the semiconductor device according to the thirteenth embodiment, which explains a structure thereof (Part 4).
Figure 45:
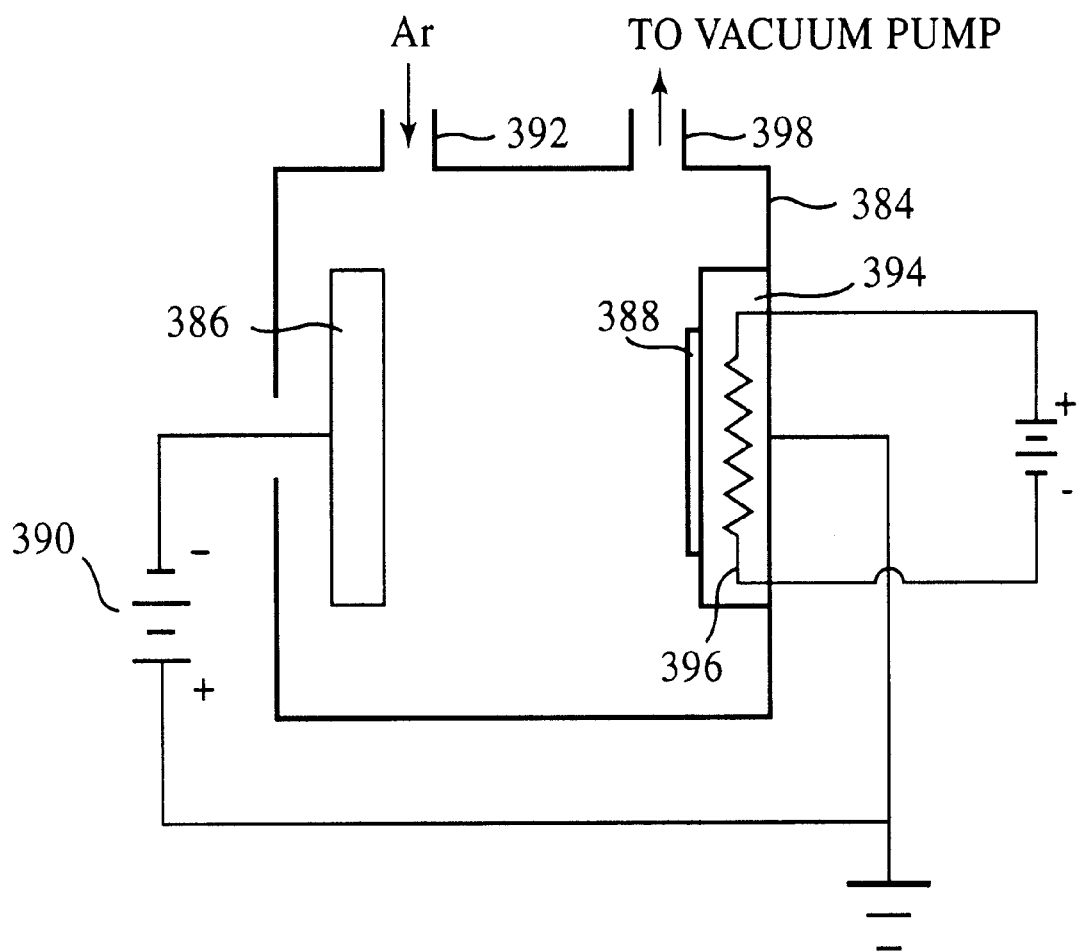
FIG. 45 is an explanatory view of a conventional thin film forming method.

In the case where a pattern of the lower electrode 358 is too small to be patterned by ion milling, the deposition of the iridium film is paused when the plug 364 is formed, to deposit the TiN film 367 processed in a shape of the lower electrode 358 on the inter-layer insulation film 354. This permits the iridium film to be selectively grown on the TiN film 367, and the lower electrode 358 having a micronized pattern can be formed (FIG. 42).

Subsequently the iridium film 365 is processed into the required shape by ion milling.

Figure 40A:
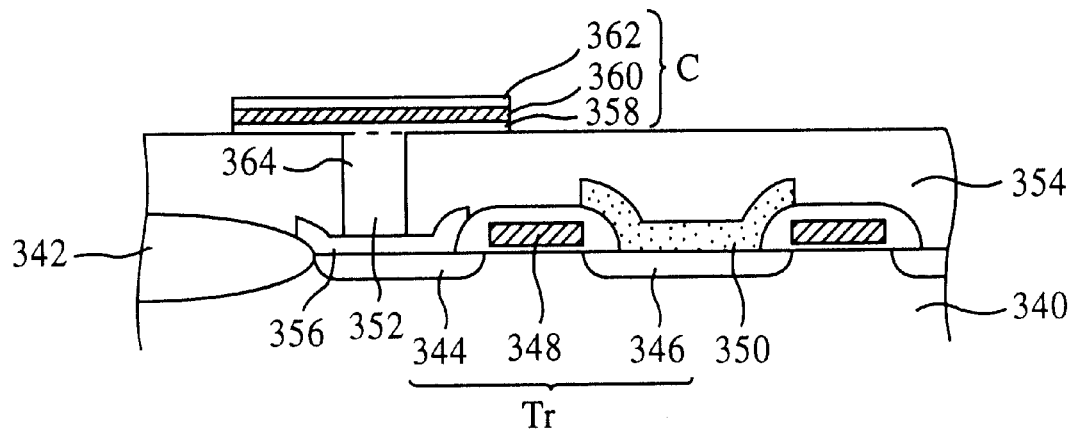
FIGS. 40A and 40B are sectional views of the semiconductor device according to the thirteenth embodiment of the present invention, which explain the method (Part 2).

Then, the capacitor storage electrode 360 and the upper electrode 362 are formed on the lower electrode 358, and a capacitor C is formed (FIG. 40A).

Figure 40B:
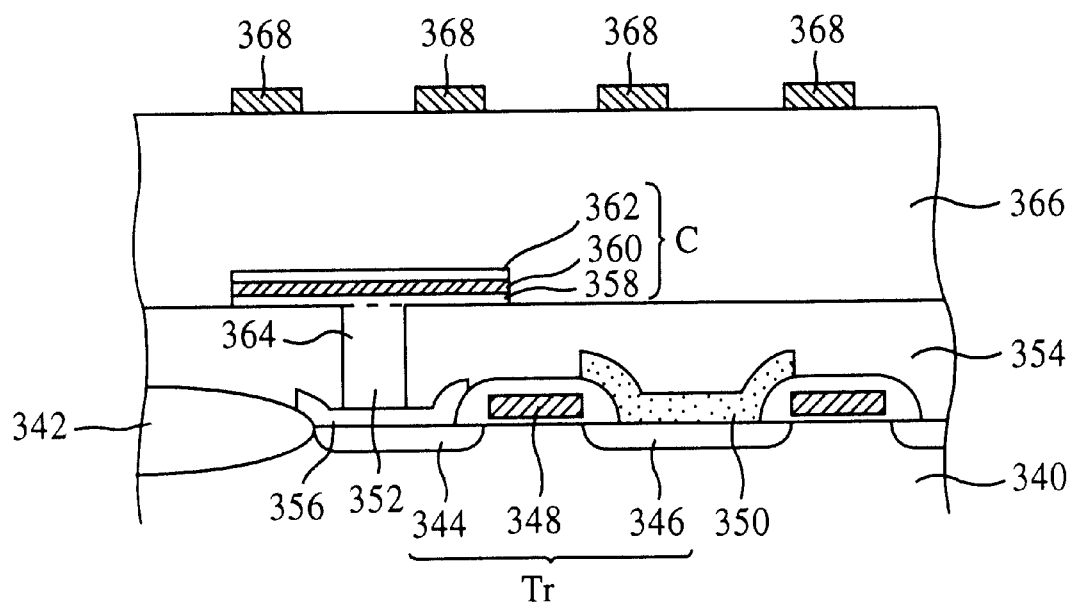

Next, by the method according to the twelfth embodiment, a DRAM comprising 1-transistor and 1-capacitor cells is fabricated (FIG. 40B).

As described above, according to the present embodiment, the through-hole 352 is buried with selectively grown iridium film, and the iridium film 358 to be the lower electrode is selectively grown. The plug 364 to be buried into the through-hole 352 and the lower electrode 358 can be continuously grown simply by changing film forming conditions.

In the present embodiment, the plug 364 and the lower electrode 358 are formed of iridium film, but one of them is formed of iridium oxide film. In forming the iridium oxide film as well, the selective growth and the non-selective growth can be easily controlled as in the eleventh embodiment.

The lower electrode 358 may be formed of a multi-layer film. As exemplified in FIG. 43, it is possible that the plug 364 is formed of the selectively grown iridium film, and the lower electrode 358 is formed of the multi-layer film of the selectively grown iridium oxide film 372 and the iridium film 374, AS shown in FIG, 44, it is possible that the plug 364 is formed of the selectively grown iridium oxide film, and the lower electrode 358 is formed of the multi-layer film of the non-selectively grown iridium film 370 and the iridium oxide film 372.

The present embodiment has shown as one example of semiconductor fabrication methods combining the selective growth and non-selective growth, and the method for continuously forming the plug 364 and the lower electrode 358 of a DRAM, but the present embodiment is not limited to the above-described application.

What is claimed is:

1. A capacitor device comprising a pair of electrodes, and a dielectric film formed between the pair of electrodes,
at least one of the pair of electrodes being formed of a material containing titanium nitride of (200) orientation.

2. A semiconductor device comprising:
a memory cell including a capacitor device according to claim 1; and
a transistor electrically connected to one of the electrodes of the capacitor device.

3. A capacitor device comprising:
an insulating film formed on a substrate, the insulation film having a contact hole reaching the substrate formed in a tirst region:
a first diffusion preventive film formed in the contact hole and on the insulation film in a second region adjacent to the first region, the first diffusion preventive film being for preventing a constituent material of the substrate from diffusing;
a first electrode formed on the first diffusion preventive film;
a second diffusion preventive film formed on the first electrode only in the first region, the second diffusion preventive film being for preventing oxygen from diffusing;
a dielectric film formed on the first electrode in the second region without interposing the second diffusion preventive film therebetween and on the second diffusion preventive film in the first region; and
a second electrode formed on the dielectric film.

4. A capacitor device according to claim 3, further comprising an oxidation-resistant conducting film provided between the second diffusion preventive film and the dielectric film in the first region and between the first electrode and the dielectric film in the second region.

5. A semiconductor device comprising:
a memory cell including a capacitor device according to claim 3, and a transistor electrically connected to one of the electrodes of the capacitor device.

6. A capacitor device according to claim 3, wherein the first electrode is formed of a member selected from the group consisting of platinum, palladium, ruthenium oxide, and iridium oxide.

7. A capacitor device according to claim 3, wherein the first diffusion preventive film is formed of a member selected from the group consisting of tantalum, tungsten, titanium, nitrides thereof, silicides thereof, and a stacked film of a titanium film and a titanium nitride film on the titanium film.

8. A capacitor device according to claim 3, wherein the second diffusion preventive film is formed of a member selected from the group consisting of titanium, tantalum, tungsten, aluminum, oxides thereof, nitrides thereof, alloys thereof, (200)-oriented titanium nitride, silicon oxide and silicon nitride.

9. A semiconductor device comprising:
an MIS transistor formed on a semiconductor substrate, the MIS transistor including a gate electrode formed on the semiconductor substrate intervening a gate insulation film and a pair of diffusion layers formed in the semiconductor substrate on both sides of the gate electrode;

a bit line connected to one of the diffusion layers;

an insulation film formed on the semiconductor substrate having the MIS transistor;

a contact hole reaching another one of the diffusion layers formed in the insulation film, the contact hole being formed in a first region;

a buried conductor buried in the contact hole;

a first diffusion preventive film formed on the buried conductor in the first region and on the insulation film in a second region adjacent to the first region, the first diffusion preventive film being for preventing a constituent material of the buried conductor from diffusing;

a lower electrode formed on the first diffusion preventive film;

a second diffusion preventive film formed on the lower electrode only in the first region, the second diffusion preventive film being for preventing oxygen from diffusing;

a dielectric film formed on the lower electrode in the second region without interposing the second diffusion preventive film therebetween and on the second diffusion preventive film in the first region; and an upper electrode formed on the dielectric film.

* * * * *